(12) United States Patent
Zhang et al.

(10) Patent No.: US 12,278,243 B2
(45) Date of Patent: Apr. 15, 2025

(54) SEMICONDUCTOR APPARATUS HAVING EXPANSION WIRES FOR ELECTRICALLY CONNECTING CHIPS

(71) Applicant: BOE TECHNOLOGY GROUP CO., LTD., Beijing (CN)

(72) Inventors: Chenyang Zhang, Beijing (CN); Fuqiang Li, Beijing (CN); Xue Dong, Beijing (CN); Meili Wang, Beijing (CN); Xuan Liang, Beijing (CN); Fei Wang, Beijing (CN); Mingxing Wang, Beijing (CN); Zhanfeng Cao, Beijing (CN); Yanling Han, Beijing (CN); Xinxin Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 569 days.

(21) Appl. No.: 17/529,969

(22) Filed: Nov. 18, 2021

(65) Prior Publication Data

US 2022/0293635 A1 Sep. 15, 2022

(30) Foreign Application Priority Data

Mar. 12, 2021 (CN) .......................... 202110273812.3

(51) Int. Cl.
*H01L 27/12* (2006.01)
*H01L 25/075* (2006.01)
*H01L 33/62* (2010.01)

(52) U.S. Cl.
CPC ........ *H01L 27/124* (2013.01); *H01L 27/1292* (2013.01); *H01L 25/0753* (2013.01); *H01L 33/62* (2013.01); *H01L 2933/0066* (2013.01)

(58) Field of Classification Search
CPC ...... H01L 33/62; H01L 23/4824; H01L 24/85
See application file for complete search history.

(56) References Cited

U.S. PATENT DOCUMENTS

| 10,516,081 B1 | 12/2019 | Xin et al. |
| 2002/0185647 A1 | 12/2002 | Nakajo |

(Continued)

FOREIGN PATENT DOCUMENTS

| CN | 105191123 A | 12/2015 |
| CN | 106601634 A | 4/2017 |

(Continued)

OTHER PUBLICATIONS

Extended European Search Report dated Sep. 12, 2022, issued in counterpart EP application No. 22766381.2.

(Continued)

*Primary Examiner* — Jay C Chang
*Assistant Examiner* — Mikka Liu
(74) *Attorney, Agent, or Firm* — WHDA, LLP

(57) ABSTRACT

A semiconductor apparatus and a method for manufacturing the semiconductor apparatus are provided. The semiconductor apparatus includes: a base substrate; a plurality of chips arranged on the base substrate each including a chip main body and a plurality of terminals arranged thereon; a plurality of fixed connection portions arranged on the base substrate, and adjacent to the plurality of chips; a terminal expansion layer arranged on the base substrate; and a plurality of expansion wires in the terminal expansion layer and configured to electrically connect the chips, wherein an expansion wire configured to electrically connect two chips includes at least a first wire segment and a second wire segment, and the first wire segment is configured to electrically connect a terminal of a chip and a fixed connection portion adjacent to the chip, and the second wire segment is configured to connect two fixed connection portions between the two chips.

13 Claims, 52 Drawing Sheets

(56) References Cited

U.S. PATENT DOCUMENTS

| | | | |
|---|---|---|---|
| 2010/0203676 | A1 | 8/2010 | Theuss et al. |
| 2011/0254046 | A1 | 10/2011 | Hsu et al. |
| 2015/0137382 | A1 | 5/2015 | Yang et al. |
| 2017/0062321 | A1 | 3/2017 | Choi et al. |
| 2017/0125393 | A1* | 5/2017 | Kwon ................. H01L 23/3128 |
| 2018/0122774 | A1* | 5/2018 | Huang .................... H01L 24/02 |
| 2019/0115274 | A1 | 4/2019 | Hu et al. |
| 2019/0139901 | A1 | 5/2019 | Scanlan et al. |
| 2019/0326267 | A1 | 10/2019 | Han et al. |
| 2020/0118989 | A1 | 4/2020 | Wang et al. |
| 2020/0388602 | A1 | 12/2020 | Han et al. |

FOREIGN PATENT DOCUMENTS

| | | |
|---|---|---|
| CN | 108198835 A | 6/2018 |
| CN | 108336200 A | 7/2018 |
| CN | 110571234 A | 12/2019 |
| CN | 110957405 A | 4/2020 |
| CN | 111293135 A | 6/2020 |
| CN | 111684576 A | 9/2020 |
| CN | 112041990 A | 12/2020 |

OTHER PUBLICATIONS

Office Action dated May 20, 2024, issued in counterpart CN Application No. 202110273812.3, with English translation. (18 pages).

Office Action dated May 22, 2024, issued in counterpart CN Application No. 202110273788.3, with English translation. (19 pages).

Requirement for Restriction Election dated Jul. 3, 2024, issued in U.S. Appl. No. 17/536,268. (7 pages).

Office Action dated Jun. 25, 2024, issued in counterpart IN Application No. 202217066699 with English translation. (7 pages).

Office Action dated Jun. 26, 2024, issued in counterpart CN Application No. 202110273812.3, with English translation. (13 pages).

* cited by examiner

SEMICONDUCTOR APPARATUS HAVING EXPANSION WIRES FOR ELECTRICALLY CONNECTING CHIPS

CROSS-REFERENCE TO RELATED APPLICATION(S)

The present application claims priority to Chinese Patent Application No. 202110273812.3 filed with China National Intellectual Property Administration on Mar. 12, 2021, which is incorporated herein by reference in its entirety.

TECHNICAL FIELD

The present disclosure relates to a field of an integrated circuit technology, and in particular to a semiconductor apparatus and method for manufacturing the same.

BACKGROUND

In current semiconductor apparatus such as a display apparatus, a variety of different integrated circuits (abbreviated as IC) are generally needed, including but not limited to a driver IC, a touch IC, and an ROIC, etc. These chips are connected to the display backplane through different manners such as COF or COG. However, it is difficult to realize organic combinations between display pixel units and different chips through these conventional manners, and an extra space outside the display backplane is also occupied, which makes it difficult to realize the miniaturization and integration of the system. In addition, due to the low accuracy of PCB and FPC processes and the accuracy of a subsequent bonding process, a dimension of a pad of an encapsulated chip pin may be relatively large, thereby reducing the feasibility of chip miniaturization.

The above-mentioned information disclosed in this section is only used to understand the background of the invention concept of the present disclosure. Therefore, the above-mentioned information may contain information that does not constitute the related art.

SUMMARY

In an aspect, a semiconductor apparatus is provided. The semiconductor apparatus includes: a base substrate; a chip arranged on the base substrate, the chip including a chip main body and a plurality of terminals arranged on the chip main body; a terminal expansion layer arranged on the base substrate, the terminal expansion layer including a conductive material. An orthographic projection of at least one expansion wire on the base substrate completely covers an orthographic projection of a terminal electrically connected to the expansion wire on the base substrate. The terminal expansion layer and at least one terminal are located on a same side of the chip main body, the semiconductor apparatus further includes a plurality of expansion wires located in the terminal expansion layer, and the plurality of expansion wires are electrically connected to the plurality of terminals, respectively, so as to lead out the plurality of terminals.

According to some exemplary embodiments, the semiconductor apparatus further includes an adhesive layer arranged between the base substrate and the chip main body, and the adhesive layer is configured to fix the chip to the base substrate. The chip main body includes a first surface facing or in contact with the adhesive layer, and at least one terminal is arranged on a surface of the chip main body other than the first surface.

According to some exemplary embodiments, the base substrate includes a first base substrate surface, the chip is arranged on the first base substrate surface, and the first base substrate surface includes a first base substrate edge; and the orthographic projection of the at least one expansion wire on the base substrate is inclined with respect to the first base substrate edge.

According to some exemplary embodiments, the chip main body has a second surface away from the base substrate, an orthographic projection of the second surface on the base substrate has a regular shape, and the orthographic projection of the second surface on the base substrate includes a first edge; and the first edge is inclined with respect to the first base substrate edge.

According to some exemplary embodiments, a first angle is formed between an extension line of the orthographic projection of the at least one expansion wire on the base substrate and an extension line of the first base substrate edge, and the first angle is greater than 0° and less than 90°; and/or a second angle is formed between an extension line of the first edge and the extension line of the first base substrate edge, and the second angle is greater than 0° and less than 90°.

According to some exemplary embodiments, the base substrate includes a first base substrate surface, and the chip is arranged on the first base substrate surface. The chip main body of the chip includes a second surface, a first side surface and a second side surface, the second surface and the first surface are located on opposite sides of the chip main body, respectively, the first side surface and the second side surface are located on side surfaces of the chip main body, respectively, and each of the first side surface and the second side surface is in connect with the first surface and the second surface. At least one of the first side surface and the second side surface is inclined with respect to the first base substrate surface.

According to some exemplary embodiments, at least one expansion wire is in direct contact with at least one terminal, and a part of the at least one expansion wire is in direct contact with one of the first side surface and the second side surface.

According to some exemplary embodiments, the semiconductor apparatus further includes a first planarization layer which is arranged on a side of the chip and covers the terminal. The terminal expansion layer is located on a side of the first planarization layer away from the chip, and an end of the expansion wire is electrically connected to the terminal through a via hole or groove passing through the first planarization layer.

According to some exemplary embodiments, the semiconductor apparatus further includes a spacer located on a side of the chip main body close to the base substrate, and an orthographic projection of the spacer on the base substrate and an orthographic projection of the chip main body on the base substrate at least partially overlap.

According to some exemplary embodiments, the semiconductor apparatus further includes a first planarization layer which is arranged on a side of the chip and covers the terminal, and a second planarization layer arranged on a side of the first planarization layer away from the base substrate. The semiconductor apparatus further includes a first wire located in a redistribution layer. The redistribution layer is located on a side of the second planarization layer away from the chip, and an end of the first wire is electrically connected to the expansion wire through a via hole or groove passing through the first planarization layer and the second planarization layer.

According to some exemplary embodiments, the semiconductor apparatus further includes a functional device electrically connected to at least one terminal of the chip; and the functional device and the chip are located in different layers.

According to some exemplary embodiments, the semiconductor apparatus includes a plurality of repeating units arranged on the base substrate in an array in a first direction and a second direction; and wherein each of the plurality of repeating units includes a plurality of chips, and the plurality of chips in each of the plurality of repeating units are arranged on the base substrate in an array in the first direction and the second direction, or at least some of the plurality of chips in each of the plurality of repeating units are arranged on the base substrate in an array in the first direction and the second direction; and wherein a relative position of at least one chip in one of at least two of the plurality of repeating units is different from a relative position of a corresponding chip in another one of the at least two of the plurality of repeating units, and/or an orientation of at least one chip in one of at least two of the plurality of repeating units is different from an orientation of a corresponding chip in another one of the at least two of the plurality of repeating units.

According to some exemplary embodiments, a length of an expansion wire configured to lead out at least one terminal of at least one chip in one of at least two of the plurality of repeating units is different from a length of an expansion wire configured to lead out a corresponding terminal of a corresponding chip in another one of the at least two of the plurality of repeating units; and/or an extension direction of an expansion wire configured to lead out at least one terminal of at least one chip in one of at least two of the plurality of repeating units is different from an extension direction of an expansion wire configured to lead out a corresponding terminal of a corresponding chip in another one of the at least two of the plurality of repeating units.

According to some exemplary embodiments, for two chips in a same row in the first direction or the second direction, a chip main body of each of the two chips has a second surface away from the base substrate, and an orthographic projection of the second surface on the base substrate has a regular shape, and a third angle is formed between a connection line between geometric centers of orthographic projections of second surfaces of chip main bodies of the two chips on the base substrate and the first direction or the second direction, and the third angle is greater than 0° and less than 90°.

According to some exemplary embodiments, the plurality of terminals included in the chip are each located on the second surface of the chip main body of the chip; or the plurality of terminals included in the chip are located on the first side surface and the second side surface of the chip main body of the chip, respectively; or the plurality of terminals included in the chip are located on the first surface and the second surface of the chip main body of the chip, respectively.

According to some exemplary embodiments, the chip includes a first chip and a second chip, the first chip includes at least two first terminals, and the second chip includes at least two second terminals. The first chip and the second chip are configured to implement different functions, the first chip includes at least one of a light-emitting chip and a sensor chip, and the second chip includes at least one of a sensor chip and a control chip. One end of the at least one expansion wire is electrically connected to the first chip, and the other end of the at least one expansion wire is electrically connected to the second chip.

According to some exemplary embodiments, the first chip includes the light-emitting chip, and the first chip and the second chip are arranged in a same layer.

According to some exemplary embodiments, the first chip includes the light-emitting chip, and the first chip and the second chip are arranged in different layers. The semiconductor apparatus further includes a driving element electrically connected to the first chip through at least one expansion wire.

According to some exemplary embodiments, the driving element is a driver chip, and an orthographic projection of the driver chip on the base substrate and an orthographic projection of the first chip on the base substrate at least partially overlap. The first chip includes a main light-emitting surface located on a side of the first chip away from the driver chip.

According to some exemplary embodiments, the driving element is a driver chip, and an orthographic projection of the driver chip on the base substrate and an orthographic projection of the first chip on the base substrate do not overlap. The first chip includes a main light-emitting surface located on a side of the first chip close to the driver chip.

According to some exemplary embodiments, the semiconductor apparatus further includes a protective layer located on a side of the first chip away from the second chip. The protective layer covers the at least one terminal expansion layer and exposes a light-emitting surface of the first chip.

According to some exemplary embodiments, the driving element includes a driving circuit configured to drive the first chip, and the driving circuit includes at least a thin film transistor located in a layer different from a layer where the first chip is located and a layer where the second chip is located. The thin film transistor includes at least a source and a drain, and the source or the drain is electrically connected to at least one expansion wire through a via hole or groove.

According to some exemplary embodiments, the first chip and the second chip are arranged in different layers. The thin film transistor is located on a side of the first chip away from the base substrate, and the second chip is located on a side of the thin film transistor away from the base substrate.

According to some exemplary embodiments, the chip further includes a third chip, and the first chip, the second chip, and the third chip are configured to implement different functions from each other. The semiconductor apparatus includes at least one chip set, and each of the at least one chip set includes at least one second chip and at least one third chip. A plurality of chip sets are electrically connected to a plurality of first chips in a one-to-one correspondence; or one chip set is electrically connected to the plurality of first chips.

According to some exemplary embodiments, the first chip includes a sensor chip or a plurality of sensor chips connected in series; and the second chip includes the control chip.

According to some exemplary embodiments, the sensor chip includes at least one of a transducer chip and a piezoelectric sensor chip.

According to some exemplary embodiments, each of the plurality of sensor chips includes a first electrode, a second electrode, and a functional film sandwiched between the first electrode and the second electrode. First electrodes of the plurality of sensor chips are located in a same layer, and second electrodes of the plurality of sensor chips are located in a same layer. In two adjacent sensor chips, a first electrode of one sensor chip is electrically connected to a second electrode of the other sensor chip through a via hole or groove.

According to some exemplary embodiments, each of the plurality of sensor chips includes a first electrode, a second electrode, and a functional film sandwiched between the first electrode and the second electrode; and wherein the semiconductor apparatus includes a plurality of sensor chip sets and a plurality of conductive portions, and each of the plurality of sensor chip sets includes at least two sensor chips, the plurality of sensor chip sets are arranged on the plurality of conductive portions, respectively, and the plurality of conductive portions are arranged at intervals, and for any two adjacent sensor chips in one of the plurality of sensor chip sets, a first electrode of one of the two adjacent sensor chips and a second electrode of another one of the two adjacent sensor chips are in contact with a same conductive portion.

According to some exemplary embodiments, the semiconductor apparatus further includes a second planarization layers that covers the plurality of sensor chips, and a second terminal expansion layer arranged on a side of the second planarization layer away from the base substrate. The second terminal expansion layer includes a plurality of second expansion wires. In two adjacent sensor chip sets, first electrodes of sensor chips of one sensor chip set and second electrodes of sensor chips of the other sensor chip set are electrically connected through at least one second expansion wire and a via hole or groove passing through the second planarization layer.

According to some exemplary embodiments, each of the plurality of sensor chips includes a first electrode, a second electrode, and a functional film sandwiched between the first electrode and the second electrode; and wherein the semiconductor apparatus includes a plurality of sensor chip sets and at least one conductive portion, and each of the plurality of sensor chip sets includes at least two sensor chips, at least two of the plurality of sensor chip sets are arranged on a same conductive portion, and in one of the plurality of sensor chip sets, at least two sensor chips are stacked on a conductive portion, a first electrode or a second electrode of a sensor chip, closest to the conductive portion, in the at least two sensor chips is in contact with the conductive portion, and in any two adjacent sensor chips, a first electrode of one of the any two adjacent sensor chips is in contact with a second electrode of the other one of the any two adjacent sensor chips.

According to some exemplary embodiments, the at least one chip further includes a control chip. The control chip and the plurality of sensor chips are located in a same layer. The semiconductor apparatus further includes a second planarization layer that covers the plurality of sensor chips and the control chip, and a second terminal expansion layer arranged on a side of the second planarization layer away from the base substrate. The second terminal expansion layer includes a plurality of second expansion wires. A first electrode or a second electrode of a sensor chip closest to the control chip is electrically connected to a terminal of the control chip through at least one second expansion wire and a via hole or groove passing through the second planarization layer.

According to some exemplary embodiments, the semiconductor apparatus further includes: a plurality of pixels arranged on the base substrate, wherein the plurality of pixels are arranged in an array in a row direction and a column direction; a gate chip including at least two ports; a plurality of row signal connection lines, wherein one row signal connection line is electrically connected to a plurality of pixels located in a same row; a plurality of column signal connection lines, wherein one column signal connection line is electrically connected to a plurality of pixels located in a same column; and a gate transistor, wherein the first chip is electrically connected to a column signal connection line through the gate transistor. The plurality of row signal connection lines are electrically connected to the plurality of ports of the gate chip through first expansion wires, and a plurality of first chips are electrically connected to a second chip through a second expansion wire, and the first expansion wire and the second expansion wire are located in the at least one terminal expansion layer.

According to some exemplary embodiments, a display apparatus is provided, the display apparatus includes: a base substrate; a plurality of chips arranged on the base substrate, wherein each first chip includes at least two terminals, and the chip includes at least one selected from a group consisting of a light-emitting diode chip, a sub-millimeter light-emitting diode chip and a miniature light-emitting diode chip; a driving circuit for driving the plurality of chips, the driving circuit including at least one thin film transistor; and at least one terminal expansion layer arranged on the base substrate, the terminal expansion layer including a conductive material. The terminal expansion layer and at least one terminal are located on a same side of the chip main body. The semiconductor apparatus further includes a plurality of expansion wires located in the at least one terminal expansion layer, wherein the plurality of expansion wires are respectively electrically connected to the plurality of terminals and configured to lead out the plurality of terminals. An orthographic projection of at least one expansion wire on the base substrate covers an orthographic projection of a terminal electrically connected thereto on the base substrate. An end of the at least one expansion wire is electrically connected to the thin film transistor of the driving circuit.

In another aspect, a method for manufacturing a semiconductor apparatus is provided. The method includes: placing a chip on a base substrate, wherein the chip includes a chip main body and a plurality of terminals arranged on the chip main body; and forming a terminal expansion layer on a side of the chip away from the base substrate through a post-alignment process, wherein the terminal expansion layer includes a conductive material, wherein the forming a terminal expansion layer on a side of the chip away from the base substrate through a post-alignment process includes: photographing the base substrate provided with the chip; determining coordinates of the plurality of terminals using an image recognition technology, so as to generate a graphic file of the plurality of terminals; forming a conductive material layer on the side of the chip away from the base substrate; and etching the conductive material layer through a lithography process according to the graphic file, to form a plurality of expansion wires in the terminal expansion layer, wherein the plurality of expansion wires are electrically connected to the plurality of terminals, respectively, so as to lead out the plurality of terminals, and an orthographic projection of at least one expansion wire on the base substrate completely covers an orthographic projection of a terminal electrically connected to the expansion wire on the base substrate.

According to some exemplary embodiments, the photographing the base substrate provided with the chip includes: photographing a first photographing area of the base substrate provided with the chip; and translating a photographing device at a fixed step distance to photograph a second photographing area of the base substrate provided with the chip, wherein a position calibration mark arranged on the base substrate is taken as an origin, and in a case that the base substrate is provided with a plurality of chips, the number of photographs taken is related to a distribution density of the plurality of chips, and at least one chip is arranged in each photographing area According to some exemplary embodiments, the placing a chip on the base substrate includes: forming an adhesive layer on the base substrate; and transferring the chip to the adhesive layer through a transfer process, such that the chip is fixed to the base substrate through the adhesive layer.

According to some exemplary embodiments, the method further includes: after forming at least one terminal expansion layer on the side of the plurality of chips away from the base substrate through a post-alignment process, forming a driving element is on a side of the terminal expansion layer away from the base substrate, wherein the driving element includes a driver chip or a driving circuit having a thin film transistor.

According to some exemplary embodiments, the method further includes: before the plurality of chips are placed on the base substrate, forming a driving element on the base substrate, wherein the driving element includes a driver chip or a driving circuit having a thin film transistor.

According to some exemplary embodiments, the forming at least one terminal expansion layer on the side of the plurality of chips away from the base substrate through a post-alignment process includes: forming a first terminal expansion layer directly on the chip, and forming a first expansion wire located in the first terminal expansion layer through a lithography process, such that an end of the first expansion wire is in contact with a first terminal, and a part of the first expansion wire is in contact with a sidewall of the chip.

According to some exemplary embodiments, the method further includes: forming a first planarization layer on the side of the chip away from the base substrate, wherein the first planarization layer covers the terminals of the chip; and forming a plurality of via holes or grooves in the first planarization layer through a lithography process, wherein each of the plurality of via holes or grooves exposes at least a part of one of the plurality of terminals of the chip, wherein the forming a terminal expansion layer on a side of the chip away from the base substrate through a post-alignment process includes: forming the terminal expansion layer on a side of the first planarization layer away from the base substrate, and forming an expansion wire in the terminal expansion layer through a post-alignment process, such that an end of the expansion wire is in contact with the terminal through a via hole or groove.

According to some exemplary embodiments, the forming a terminal expansion layer on a side of the chip away from the base substrate through a post-alignment process includes: forming the terminal expansion layer through the post-alignment process; forming a first planarization layer on a side of the terminal expansion layer away from the base substrate; forming a plurality of via holes or grooves in the first planarization layer through a lithography process, wherein the plurality of via holes or grooves expose at least a part of the terminal expansion layer; and forming a redistribution layer on a side of the first planarization layer away from the base substrate, wherein the method further includes: electrochemically plating a metal layer with the terminal expansion layer as a seed layer, so as to grow a conductive connection portion having a thickness equal to a thickness of the first planarization layer, in the plurality of via holes or grooves, wherein the conductive connection portion is configured to electrically connect the terminal expansion layer and the redistribution layer.

According to some exemplary embodiments, the method further includes: determining coordinate information of a defective point using an image recognition technology in the post-alignment process; and etching the conductive material layer through the lithography process based on the coordinate information, such that at least one expansion wire configured to repair the defective point is formed in the terminal expansion layer.

In yet another aspect, a semiconductor apparatus is provided. The semiconductor apparatus include: a base substrate; a plurality of chips arranged on the base substrate, wherein each of the plurality of chips includes a chip main body and a plurality of terminals arranged on the chip main body; a plurality of fixed connection portions arranged on the base substrate, wherein the plurality of fixed connection portions are arranged adjacent to the plurality of chips, respectively; a terminal expansion layer arranged on the base substrate, wherein the terminal expansion layer includes a conductive material; and a plurality of expansion wires in the terminal expansion layer, wherein the plurality of expansion wires are configured to electrically connect the plurality of chips, wherein an expansion wire configured to electrically connect two chips includes at least a first wire segment and a second wire segment, and the first wire segment is configured to electrically connect a terminal of a chip and a fixed connection portion adjacent to the chip, and the second wire segment is configured to connect two fixed connection portions between the two chips.

According to some exemplary embodiments, at least one second wire segment extends in a first direction; and in two chips electrically connected through an expansion wire including a second wire segment that extends in the first direction, a relative position of one chip in the first direction is different from a relative position of the other chip in the first direction.

According to some exemplary embodiments, in two chips electrically connected through an expansion wire including at least one second wire segment, at least one chip is inclined with respect to an extension line of the second wire segment.

According to some exemplary embodiments, in two chips electrically connected through the expansion wire including the at least one second wire segment, an orientation of one chip with respect to an extension line of the second wire segment is different from an orientation of the other chip with respect to an extension line of the second wire segment.

According to some exemplary embodiments, in two chips electrically connected through an expansion wire including at least one second wire segment, each chip includes a plurality of terminals including at least a first terminal and a second terminal. An expansion wire configured to electrically connect first terminals of the two chips includes a second wire segment parallel to a second wire segment included in an expansion wire configured to electrically connect second terminals of the two chips, and/or, the expansion wire configured to electrically connect the first terminals of the two chips includes a second wire segment having a length substantially equal to a length of a second wire segment included in the expansion wire configured to electrically connect the second terminals of the two chips.

According to some exemplary embodiments, at least one first wire segment and a second wire segment adjacent to and electrically connected to the at least one first wire segment have an angle greater than 0° and less than 180°.

According to some exemplary embodiments, in two first wire segments adjacent to and electrically connected to a same second wire segment, an angle between one of the two first wire segments and the second wire segment adjacent thereto and electrically connected thereto is different from an angle between the other one of the two first wire segments and the second wire segment adjacent thereto and electrically connected thereto.

According to some exemplary embodiments, in two first wire segments electrically connected to a first terminal and a second terminal of a same chip, an angle between one of the two first wire segments and a second wire segment adjacent thereto and electrically connected thereto is different from an angle between the other one of the two first wire segments and a second wire segment adjacent thereto and electrically connected thereto.

According to some exemplary embodiments, a plurality of first wire segments are located in a same layer, and the second wire segment and the first wire segments are located in a same layer or in different layers.

According to some exemplary embodiments, a display apparatus is provided. The display apparatus includes: a base substrate; a plurality of pixels arranged on the base substrate, the plurality of pixels being arranged in an array in a first direction and a second direction; a plurality of chips arranged on the base substrate, each chip including a chip main body and a plurality of terminals arranged on the chip main body; a plurality of fixed connection portions arranged on the base substrate; at least one terminal expansion layer arranged on the base substrate, the terminal expansion layer including a conductive material. The plurality of fixed connection portions are arranged adjacent to the plurality of chips, respectively. The semiconductor apparatus further includes a plurality of expansion wires located in the at least one terminal expansion layer, and the expansion wires are configured to electrically connect the plurality of chips. An expansion wire configured to electrically connect two chips includes at least a first wire segment and a second wire segment, wherein the first wire segment is configured to electrically connect a terminal of a chip to a fixed connection portion adjacent to the chip, and the second wire segment is configured to connect two fixed connection portions between the two chips. At least one chip is inclined with respect to the first direction and the second direction.

According to some exemplary embodiments, the plurality of chips are arranged in an array in a first direction and a second direction; and at least one first wire segment is inclined with respect to the first direction and the second direction.

According to some exemplary embodiments, the second wire segment extends in the first direction or in the second direction.

In yet another aspect, a method for manufacturing a semiconductor apparatus is provided. The method includes: placing a plurality of chips on a base substrate, wherein each of the plurality of chips includes a chip main body and a plurality of terminals arranged on the chip main body; and forming a plurality of fixed connection portions on the base substrate; and forming a terminal expansion layer on a side of the plurality of chips away from the base substrate through a post-alignment process, wherein the terminal expansion layer includes a conductive material, wherein the forming a terminal expansion layer on a side of the plurality of chips away from the base substrate through a post-alignment process includes: photographing the base substrate provided with the plurality of chips and the plurality of fixed connection portions; determining coordinates of the plurality of terminals of each of the plurality of chips using an image recognition technology, and generating a graphic file of the plurality of terminals; forming a conductive material layer on the side of the plurality of chips away from the base substrate; and etching the conductive material layer through a lithography process according to the graphic file, to form a plurality of expansion wires in the terminal expansion layer, wherein the plurality of expansion wires are configured to electrically connect the plurality of chips, and an expansion wire configured to electrically connect two chips includes at least a first wire segment and a second wire segment, wherein the first wire segment is configured to electrically connect a terminal of a chip to a fixed connection portion adjacent to the chip, and the second wire segment is configured to connect two fixed connection portions between the two chips.

According to some exemplary embodiments, the generating the graphic file of the terminals includes: reading a preset coordinate of each fixed connection portion; and generating the graphic file of the plurality of terminals according to the determined coordinates of the plurality of terminals of each of the plurality of chips and the read preset coordinate of each fixed connection portion.

According to some exemplary embodiments, the photographing the base substrate provided with the chips and the fixed connection portions includes: photographing a first photographing area of the base substrate provided with the plurality of chips and the plurality of fixed connection portions; translating a photographing device at a fixed step distance to photograph a second photographing area of the base substrate provided with the plurality of chips and the plurality of fixed connection portions, wherein an overall absolute coordinate calibration mark arranged on the base substrate is taken as an origin, wherein the number of photographs taken is related to a distribution density of the plurality of chips, and at least one chip is arranged in each photographing area.

According to some exemplary embodiments, an overlapping photographing area is provided between at least two photographing areas.

According to some exemplary embodiments, the method further includes: forming the overall absolute coordinate calibration mark and a plurality of position calibration marks on the base substrate, wherein the plurality of position calibration marks and a plurality of photographing areas are in a one-to-one correspondence.

In yet another aspect, a semiconductor apparatus is provided. The semiconductor apparatus includes: a first base substrate and a second base substrate oppositely arranged to each other; a chip arranged on the first base substrate, the chip including a chip main body and a plurality of first terminals arranged on the chip main body; a terminal expansion layer arranged on the first base substrate, the terminal expansion layer including a conductive material; and a plurality of second terminals arranged on the second base substrate. The terminal expansion layer and at least one first terminal are located on a same side of the chip main body. The semiconductor apparatus further includes a plurality of expansion wires located in the terminal expansion layer, wherein the plurality of expansion wires are respectively electrically connected to the plurality of first terminals, so as to lead out the plurality of first terminals. An orthographic projection of the plurality of expansion wires on the first base substrate completely covers an orthographic projection of first terminals electrically connected to the plurality of expansion wires on the first base substrate. The plurality of first terminals are respectively electrically connected to the plurality of second terminals through the plurality of expansion wires, and an orthographic projection of the plurality of second terminals on the first base substrate and the orthographic projection of the plurality of expansion wires on the first base substrate at least partially overlap.

According to some exemplary embodiments, the semiconductor apparatus further includes a plurality of driving elements arranged on the second base substrate, and the plurality of second terminals are located on a side of the plurality of driving elements away from the second base substrate. The plurality of second terminals are electrically connected to the plurality of driving elements, respectively.

According to some exemplary embodiments, the plurality of first terminals included in the chip are each located on a side of the chip main body of the chip away from the first base substrate. The semiconductor apparatus further includes an adhesive layer arranged between the first base substrate and the chip main body, so as to fix at least one chip to the first base substrate.

According to some exemplary embodiments, the plurality of first terminals included in the chip are respectively located on both sides of the chip main body of the chip in a direction parallel to a first base substrate surface of the first base substrate. The first base substrate surface of the first base substrate is a surface on which the chip is arranged on the first base substrate. The semiconductor apparatus further includes an adhesive layer provided between the first base substrate and the chip main body, so as to fix the chip to the first base substrate.

According to some exemplary embodiments, the plurality of first terminals included in the chip are respectively located on both sides of the chip main body of the chip in a direction perpendicular to the first base substrate surface of the first base substrate, wherein the first base substrate surface of the first base substrate is the surface on which the chip is arranged on the first base substrate. The semiconductor apparatus further includes an adhesive layer and a first conductive layer, wherein the adhesive layer is arranged between the first base substrate and the chip main body, and the first conductive layer is arranged between the adhesive layer and the chip. The first conductive layer is electrically connected to at least one first terminal of the chip close to the first base substrate.

According to some exemplary embodiments, the first base substrate includes a first base substrate surface, the chip is arranged on the first base substrate surface, and the first base substrate surface includes a first base substrate edge. An orthographic projection of at least one expansion wire on the first base substrate is inclined with respect to the first base substrate edge.

According to some exemplary embodiments, the chip main body has a second surface away from the first base substrate. An orthographic projection of the second surface on the first base substrate has a regular shape. The orthographic projection of the second surface on the first base substrate includes a first edge, and the first edge is inclined with respect to the first base substrate edge.

In yet another aspect, a method for manufacturing a semiconductor apparatus is provided. The method includes: placing a chip on a first base substrate, wherein the chip includes a chip main body and a plurality of first terminals arranged on the chip main body; forming a terminal expansion layer on a side of the chip away from the first base substrate through a post-alignment process, wherein the terminal expansion layer includes a conductive material; forming a plurality of second terminals on a second base substrate; assembling the first base substrate and the second base substrate into a cell, such that the plurality of first terminals are respectively electrically connected to the plurality of second terminals; wherein the forming a terminal expansion layer on a side of the chip away from the first base substrate through a post-alignment process includes: photographing the base substrate provided with the chip; determining coordinates of the plurality of first terminals of the chip using an image recognition technology, so as to generate a graphic file of the plurality of first terminals; forming a conductive material layer on the side of the chip away from the first base substrate; and etching the conductive material layer through a lithography process according to the graphic file, to form a plurality of expansion wires in the terminal expansion layer, wherein an orthographic projection of the plurality of expansion wires on the first base substrate completely covers an orthographic projection of first terminals electrically connected to the plurality of expansion wires on the first base substrate; and the plurality of first terminals are respectively electrically connected to the plurality of second terminals through the plurality of expansion wires, and an orthographic projection of the plurality of second terminals on the first base substrate and the orthographic projection of the plurality of expansion wires on the first base substrate at least partially overlap.

According to some exemplary embodiments, the placing a chip on a first base substrate includes: forming an adhesive layer on the first base substrate; and transferring the chip to the adhesive layer through a transfer process, such that the chip is fixed to the first base substrate through the adhesive layer.

BRIEF DESCRIPTION OF THE DRAWINGS

Through the following description of the present disclosure with reference to the accompanying drawings, other purposes and advantages of the present disclosure will be apparent, which may be conducive to a comprehensive understanding of the present disclosure.

Figure 1:
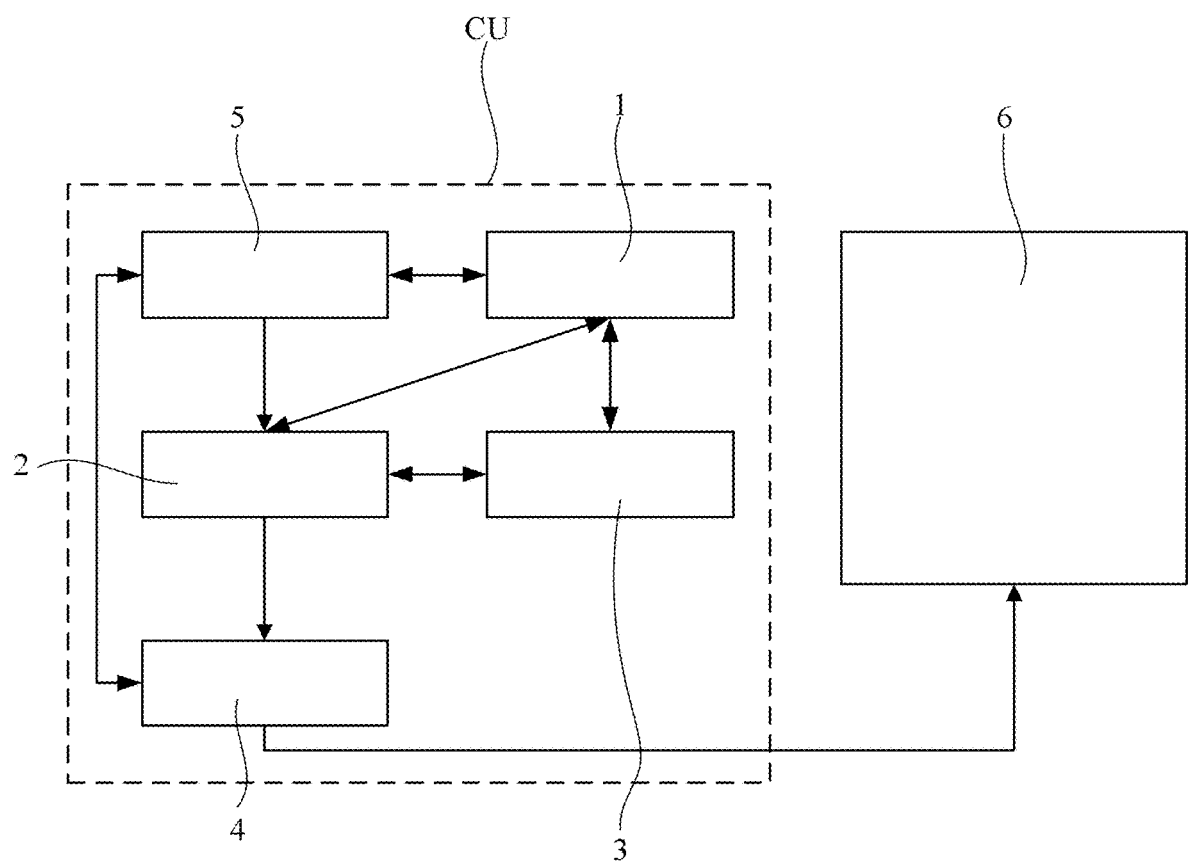
FIG. 1 schematically illustrates a block diagram of a display apparatus according to some exemplary embodiments of the present disclosure.

It should be noted that, for clarity, in the accompanying drawings used to describe the embodiments of the present disclosure, a dimension of a layer, a structure, or an area may be enlarged or reduced, that is, these accompanying drawings are not drawn according to actual scale.

DETAILED DESCRIPTION OF EMBODIMENTS

In the following description, for the purpose of explanation, many specific details are set forth to provide a comprehensive understanding of various exemplary embodiments. However, it is obvious that the various exemplary embodiments can be implemented without these specific details, or with one or more equivalent arrangements. In other cases, well-known structures and devices are shown in a form of a block diagram to avoid unnecessarily obscuring the various exemplary embodiments. In addition, the various exemplary embodiments may be different, but not exclusive. For example, without departing from the inventive concept, a specific shape, a configuration, and characteristics of an exemplary embodiment may be used or implemented in another exemplary embodiment.

In the accompanying drawings, a dimension and a relative dimension of an element may be enlarged for clarity and/or description purposes. A dimension and a relative dimension of each element may not be limited to the dimension and relative dimension shown in the drawings. When the exemplary embodiments may be implemented differently, a specific process sequence may be performed differently from the described sequence. For example, two consecutively described processes may be performed substantially simultaneously or in an order opposite to the described order. In addition, same reference sighs indicate same elements.

When an element is described as being "on", "connected to" or "attached to" another element, the element may be directly on the another element, directly connected to the another element or directly attached to the another element, or an intermediate element may be present. However, when an element is described as being "directly on", "directly connected to" or "directly attached to" another element, no intermediate elements exist. Other terms and/or expressions used to describe the relationship between elements can be interpreted in a similar manner, for example, "between" and "directly between", "adjacent" and "directly adjacent", or "on" versus "directly on", etc. In addition, the term "connection" may refer to a physical connection, an electrical connection, a communication connection, and/or a fluid connection. In addition, the X axis, the Y axis, and the Z axis are not limited to the three axes of the Cartesian coordinate system, and may be interpreted in a broader meaning. For example, the X axis, the Y axis, and the Z axis may be perpendicular to each other, or may represent different directions that are not perpendicular to each other.

The expression A and/or expression B includes the following combinations of expression A and expression B: only expression A, only expression B, and a combination of expression A and expression B.

It should be understood that, although the terms first, second, etc. may be used herein to describe different elements, these elements cannot be limited by these terms. These terms are only used to distinguish one element from another element. For example, without departing from a scope of the exemplary embodiments, a first element may be named as a second element, and similarly, the second element may be named as the first element.

It should be understood that, an integrated circuit (abbreviated as IC) is a miniaturized circuit (including a semiconductor apparatus, a passive device, etc.), for example, a device manufactured on a surface of a semiconductor wafer. For example, the integrated circuit may also be referred to as a microcircuit, a wafer, a chip, etc. Generally, integrated circuits are fabricated on a large semiconductor wafer in large batches, through a plurality of steps such as photolithography, and then divided into several small pieces. Each small piece is called a chip, and each chip is a collection of integrated circuits. Generally, a semiconductor material used in a wafer is a mono-crystal of electronic grade silicon or other semiconductors (such as gallium arsenide).

It should be understood that a bare die (also known as a bare chip, a grain or a die) is a small piece of non-encapsulated integrated circuit made of a semiconductor material. The established function of the integrated circuit is realized on this small piece of semiconductor.

It should be understood that, in a field of integrated circuits, encapsulating is a process of assembling an integrated circuit into a resulting product of the chip. For example, an integrated circuit die is arranged on a substrate that plays a supporting role, with a pin leaded out, and then the integrated circuit die and the substrate are fixed and encapsulated as a whole. For example, a circuit pin on the integrated circuit die is connected to an external contact through a wire, so as to connect to other devices. An encapsulation structure plays roles such as mounting, fixing, sealing, protecting the chip and enhancing the electrothermal performance, and pins of the encapsulation structure are connected to contacts on the chip through wires, and these pins are connected to other devices through wires on a printed circuit board, thereby realizing the connection between the internal chip and the external circuit.

In the present disclosure, the panel-level encapsulating technology includes sticking the semiconductor bare die on a carrier, and pulling the required circuit from the end of the bare die to a redistribution layer (referred to as RDL) to form an encapsulation. There is no need to encapsulate a carrier board, let alone wire bonding and bumps, thereby reducing production costs.

In the present disclosure, a digital exposure process refers to a direct writing or maskless lithography process, which may generally be implemented by a digital exposure machine. For example, a digital exposure process (that is, no mask is used) may be used to form a wiring layer that is electrically connected to terminals of the chip on the substrate. For example, a plurality of chips may be transferred to the substrate through a low-precision transfer process; a position of each terminal of the chip on the substrate may be read through mapping, or an image of the chip may be obtained through an optical detection, and then the position of each terminal may be obtained through an algorithm; after the position of each terminal is obtained, coordinate information of each terminal is converted into a file that can be recognized by the digital exposure machine, and the digital exposure machine may perform an exposure process on a conductive layer based on the file, so as to form the wiring layer electrically connecting the terminals of the chip. In the above-mentioned process, the digital exposure process may automatically calibrate a position offset of each chip transferred to the substrate. For example, an accuracy of the digital exposure process may less than 1 μm. Therefore, the process difficulty caused by bonding may be greatly reduced, and the process accuracy is increased.

In the present disclosure, the expression "terminal" refers to a part of the chip that is electrically connected to an external lead, a wire, an electrode, etc., including but not limited to a pad of the chip.

In the present disclosure, the "post-alignment process" refers to a process for aligning a terminal (such as a pad) of a chip. For example, in the embodiments of the present disclosure, a plurality of chips may be first transferred to a base substrate through a process such as SMT or a mass transfer process; and then parameters of a pad of each chip transferred to the base substrate, such a position (e.g., coordinate information of each pad), an area and morphology may be determined through image analysis technology; based on the parameters and through a high-precision patterning process such as a lithography process, an expansion wire or a lead electrically connected to the pad of each chip is formed, so as to realize the bonding of each chip. It should be understood that, since the post-alignment process includes the high-precision patterning process such as the lithography process, the accuracy thereof will be higher than that of the mass transfer process. For example, a metal expansion wire formed by a lithography machine generally has an offset accuracy less than 0.6 microns, and an accuracy of current mass transfer device is about 5 to 10 microns. In embodiments of the present disclosure, through the post-alignment process, it may be solved that the transfer accuracy is low when a mass transfer process is performed for a microchip.

In the present disclosure, the "post-alignment process" may be used to repair a defective point in addition to identifying the terminals of the chip for automatic wiring. For example, in the post-alignment process, a defective point may be identified and obtained, so as to obtain coordinate information of the defective point; then based on the coordinate information and through a high-precision patterning process such as a lithography process, an expansion wire or a lead connected to each defective point may be formed, to repair the defective point.

It should be noted that, herein, the expression "defective point" includes a terminal having an open circuit in an electrical connection path thereof.

In the present disclosure, unless otherwise specified, the expressions "position" and "relative position" refer to a position of a component such as a chip, a main body of the chip in a spatial coordinate system, for example, in an XYZ coordinate system, coordinate values of X, Y, Z axes may be used for representation. The expression "orientation" refers to, in the space coordinate system, an angle of a component such as the chip and the main body of the chip, relative to each coordinate axis, for example, in the XYZ coordinate system, angles relative to the X, Y, and Z axes may be used for representation.

For example, a maskless lithography technology can be roughly divided into two categories: (1) charged particle maskless lithography, such as electron beam direct writing and ion beam lithography; (2) optical maskless technology, such as DMD maskless lithography, laser direct writing, interference lithography, diffractive optical element lithography, etc. For example, DMD maskless lithography is a technology derived from conventional optical lithography, and the exposure and imaging manner thereof is substantially similar to that of the conventional projection lithography. The difference is that the DMD maskless lithography uses digital DMD instead of the conventional mask. The main principle of the DMD maskless lithography technology is that a desired lithography pattern is input into a DMD chip through a software on a computer, a corner of a micromirror of the DMD chip is changed according to a distribution of black and white pixels in the image, the DMD chip is irradiated by a collimated light source to form a same light image as the desired pattern, the light image is projected onto a surface of a substrate, and large-area microstructure preparation is achieved by controlling a movement of a sample stage. Electron beam lithography (generally abbreviated as EBL) is a technology that uses an electron beam to draw a custom pattern on a resist-covered surface. The electron beam changes the solubility of the resist, and by immersing the resist in a solvent (that is, developing), an exposed area or an unexposed area of the resist may be selectively removed.

It should also be understood that, wire bonding is a process of tightly welding a metal bonding wire to a substrate pad, by using heat, pressure or ultrasonic energy. For example, in IC encapsulating, the wire bonding may be used to connect a semiconductor chip pad with an I/O bonding wire of a microelectronic encapsulation or a metal wiring pad on a substrate with a metal filament. The principle of wire bonding is to destroy an oxide layer and pollution on a welded surface by heating, pressurizing or ultrasound, and to produce plastic deformation, so that the metal bonding wire and the welded surface are in close contact, reaching the range of gravitational force between atoms, and causing atoms to diffuse between the interfaces to form welded joints.

In the present disclosure, the expression "light-emitting chip" refers to a chip used to emit light of a specific wavelength. For example, the light-emitting chip may include a light-emitting diode chip, and the light-emitting diode chip includes but is not limited to a Mini LED chip or a Micro LED chip.

In the present disclosure, an inorganic light-emitting diode refers to a light-emitting element made of an inorganic material, and LED refers to an inorganic light-emitting element that is different from OLED. For example, the inorganic light-emitting element may include a mini light-emitting diode (abbreviated as Mini LED) and a micro light-emitting diode (abbreviated as Micro LED). The Micro LED refers to an ultra-small light-emitting diode with a grain dimension less than 100 microns, and the Mini LED refers to a small light-emitting diode with a grain dimension between those of the Micro LED and a conventional LED. For example, the grain dimension of the Mini LED may range from 100 microns to 300 microns, and the grain dimension of the Micro LED may range from 10 microns to 100 microns.

In the present disclosure, SMT or an SMT process means surface mount technology, and mass transfer or a mass transfer process is a technology of transferring a large number of microchips to a target base substrate. For example, the common mass transfer technology includes the following steps: picking up microchips at a predetermined position with a relatively high spatial accuracy and a direction; moving these microchips to a predetermined position, while maintaining the relative spatial position and the direction of the microchips; and then selectively allocating these microchips to the target base substrate at the new position while maintaining the new relative position and the direction.

In the present disclosure, PVDF refers to a polyvinylidene fluoride material having piezoelectric properties.

Regarding the "chip dimension", the dimension of the encapsulated chip is increased by at least 20% relative to the dimension of the original bare die, and at the same time, a variety of different functional modules are integrated in the chip, which will also cause the dimension of the chip to increase. In the embodiments of the present disclosure, by splitting the functions of the chip and encapsulating the apparatus including the chip (for example, a display substrate), the dimension of the chip may be reduced. With a reduction of the dimension of the chip, the effect of a defect on the yield of chips on each wafer may be effectively reduced. In addition, as the dimension of the chip decreases, the yield rate gradually increases, the equivalent diameter of a single wafer continues to increase, and the number of chips produced per wafer increases, which may greatly reduce the costs of the chips.

In the present disclosure, unless otherwise specified, the expressions "chip", "chip module", "microchip", etc. refer to a chip with relatively small dimension, for example, an non-encapsulated micron-level chip. Taking a display substrate as an example, the display substrate may include, but is not limited to, the following chips: a sensor chip, a control chip, a logic operation chip, a memory chip, a driver chip, a LED chip, and other functional chips, and may also include more subdivided sub-module chips such as a digital-to-analog conversion circuit, an amplifying circuit, a comparator, and a counter. It should be understood that, the display substrate may include at least one of the above-mentioned chips.

In the present disclosure, unless otherwise specified, the expression "functional device" may include a device for realizing a specific function, which may include a single chip, a chipset composed of a plurality of chips, or a circuit structure, etc. For example. the functional device may include at least one of a thin film transistor manufactured through a thin film process and a sensor.

In the present disclosure, unless otherwise specified, the expression "regular shape" means a regular figure, including but not limited to, a rectangle, a rounded rectangle, a rhombus, a square, a hexagon, an octagon, a circle, and an ellipse, a rectangle, a triangle, etc.

Some exemplary embodiments of the present disclosure provide a semiconductor apparatus and method for manufacturing the same. The semiconductor apparatus includes: a base substrate; a chip provided on the base substrate, in which the chip includes a chip main body and a plurality of terminals provided on the chip main body; a terminal expansion layer provided on the base substrate, in which the terminal expansion layer includes a conductive material, and the terminal expansion layer and at least one terminal are located on a same side of the chip main body; a plurality of expansion wires located in the terminal expansion layer, in which the plurality of expansion wires are electrically connected to the plurality of terminals, respectively, so as to lead out the plurality of terminals. An orthographic projection of at least one expansion wire on the base substrate completely covers an orthographic projection of a terminal electrically connected to the expansion wire on the base substrate. In the semiconductor apparatus, the terminal of the chip is led out through the terminal expansion layer, which is conducive to the bonding of the chip.

For example, the semiconductor apparatus includes: a base substrate; a plurality of chips arranged on the base substrate, in which each chip includes a chip main body and a plurality of terminals arranged on the chip main body; a plurality of fixed connection portions arranged on the base substrate; a terminal expansion layer arranged on the base substrate, in which the terminal expansion layer includes a conductive material, and the plurality of fixed connection portions are arranged adjacent to the chips, respectively; a plurality of expansion wires in the terminal expansion layer, in which the plurality of expansion wires are used for electrically connecting the plurality of chips. An expansion wire used for electrically connecting two chips includes at least a first wire segment and a second wire segment, and the first wire segment is used for electrically connecting a terminal of a chip and a fixed connection portion adjacent to the chip, and the second wiring segment is used for connecting two fixed connection portions between two chips. In the semiconductor apparatus, by providing the fixed connection portions, it is conducive to an electrical connection between the respective chips.

For example, the semiconductor apparatus includes: a first base substrate and a second base substrate arranged opposite to each other; a chip arranged on the first base substrate, in which the chip includes a chip main body and a plurality of terminals arranged on the chip main body; a terminal expansion layer provided on the first base substrate, in which the terminal expansion layer includes a conductive material; and a plurality of second terminals arranged on the second base substrate, in which the terminal expansion layer and at least one first terminal are located on s same side of the chip main body; a plurality of expansion wires located in the terminal expansion layer, in which the plurality of expansion wires are connected to the plurality of first terminals, respectively, so as to lead out the plurality of first terminals. An orthographic projection of the plurality of expansion wires on the first base substrate completely covers an orthographic projection of the plurality of first terminals electrically connected to the plurality of expansion wires on the first base substrate. The plurality of first terminals are electrically connected to the plurality of second terminals through the plurality of expansion wires, and an orthographic projection of the plurality of second terminals on the first base substrate and an orthographic projection of the plurality of expansion wires on the first base substrate at least partially overlap. In the semiconductor apparatus, the terminal of the chip is led out through the terminal expansion layer, which is conducive to the bonding between the chip and other components.

It should be noted that, the display apparatus such as a display substrate, a display panel is mainly used as an example to illustrate exemplary embodiments of the present disclosure. However, the embodiments of the present disclosure are not limited thereto, and may also be applied to other type of semiconductor apparatus including at least one chip. Herein, the chips include, but are not limited to, light-emitting chips, sensor chips, control chips, and driver chips, for example, LED chips, analog circuit chips, digital circuit chips, memory chips, digital-to-analog conversion chips, sensor (acoustic, optical, electrical, etc.) chips or other functional module chips.

For example, FIG. 1 schematically illustrates a block diagram of a display apparatus according to some exemplary embodiments of the present disclosure. Referring to FIG. 1, in the embodiments of the present disclosure, a chip with integrated functions and used in a display apparatus may be split into a plurality of microchips, and each microchip may have fewer functions than the chip with integrated functions. That is, the chip with integrated functions may be split according to functions. As such, the plurality of microchips are provided in the display apparatus. It should be understood that, a dimension of each microchip is smaller than a dimension of the chip with integrated functions, for example, each microchip may be a non-encapsulated micrometer chip. Accordingly, a dimension of a terminal on the microchip is smaller than that of a conventional chip, for example, the dimension of the terminal on the microchip is at a level of ten micrometers, and may even be less than ten micrometers. The conventional bonding process cannot meet the dimensional accuracy of the terminal on the microchip, and the existing mass transfer process cannot meet the dimensional accuracy of the terminal on the microchip.

For example, in the display apparatus, a plurality of chips may be provided, and each chip may be used for implementing a function. For example, the plurality of chips may include a LED chip and a display-related driver chip, a memory chip, a digital-to-analog conversion chip, an information processing chip, etc. As shown in FIG. 1, a control chip 1, a logic operation chip 2, a memory ship 3, a driver chip 4, and other functional chip 5 may be provided. The driver chip 4 may be electrically connected with a display unit 6.

For example, the display unit 6 may include one of an LCD display (liquid crystal display) unit, an OLED (organic light-emitting diode) display unit, or an LED (inorganic light-emitting diode) display unit.

Figure 2:
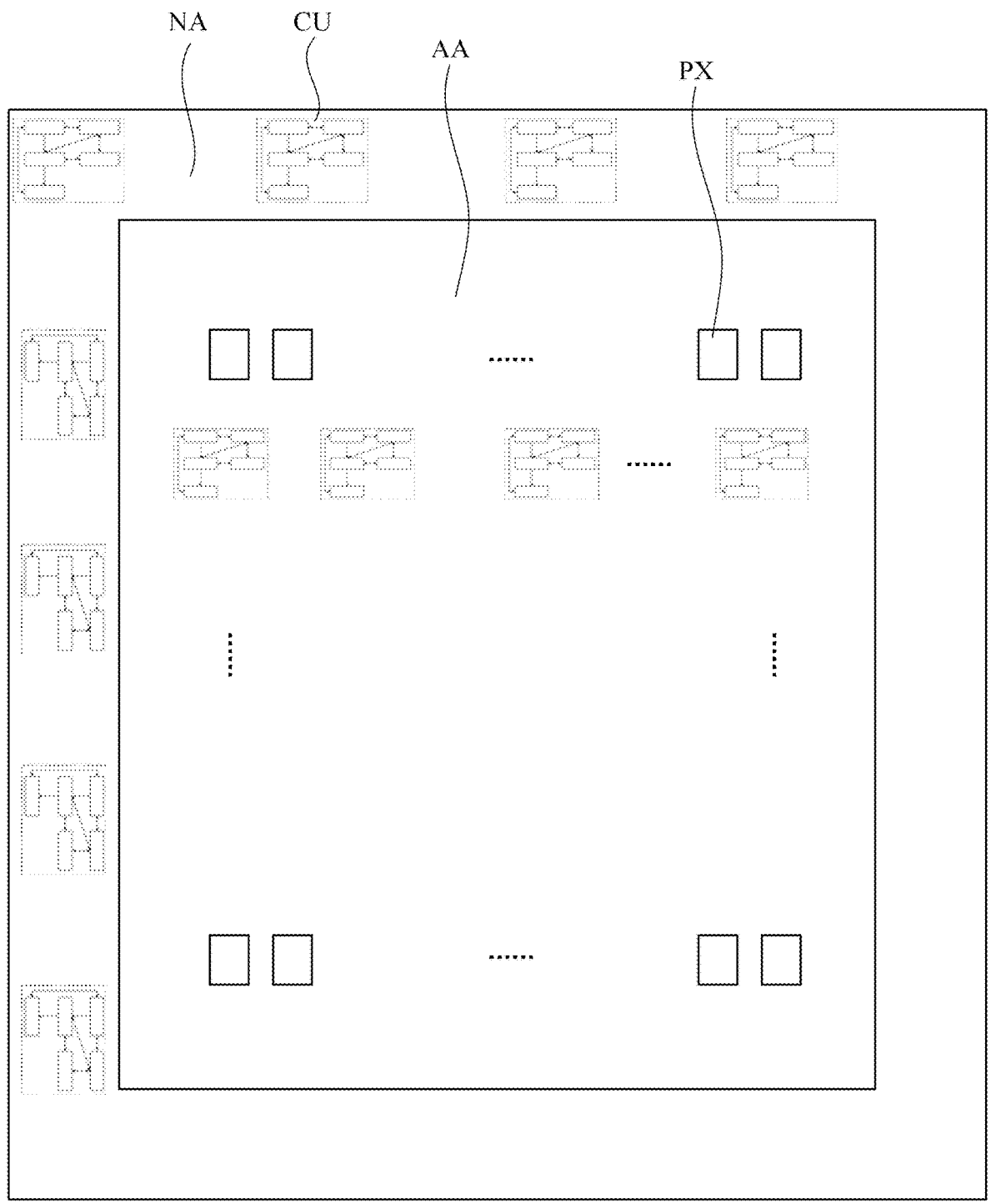
FIG. 2 schematically illustrates a schematic diagram of an arrangement of a plurality of chips in a display substrate according to the embodiments of the present disclosure.
Figure 3A:
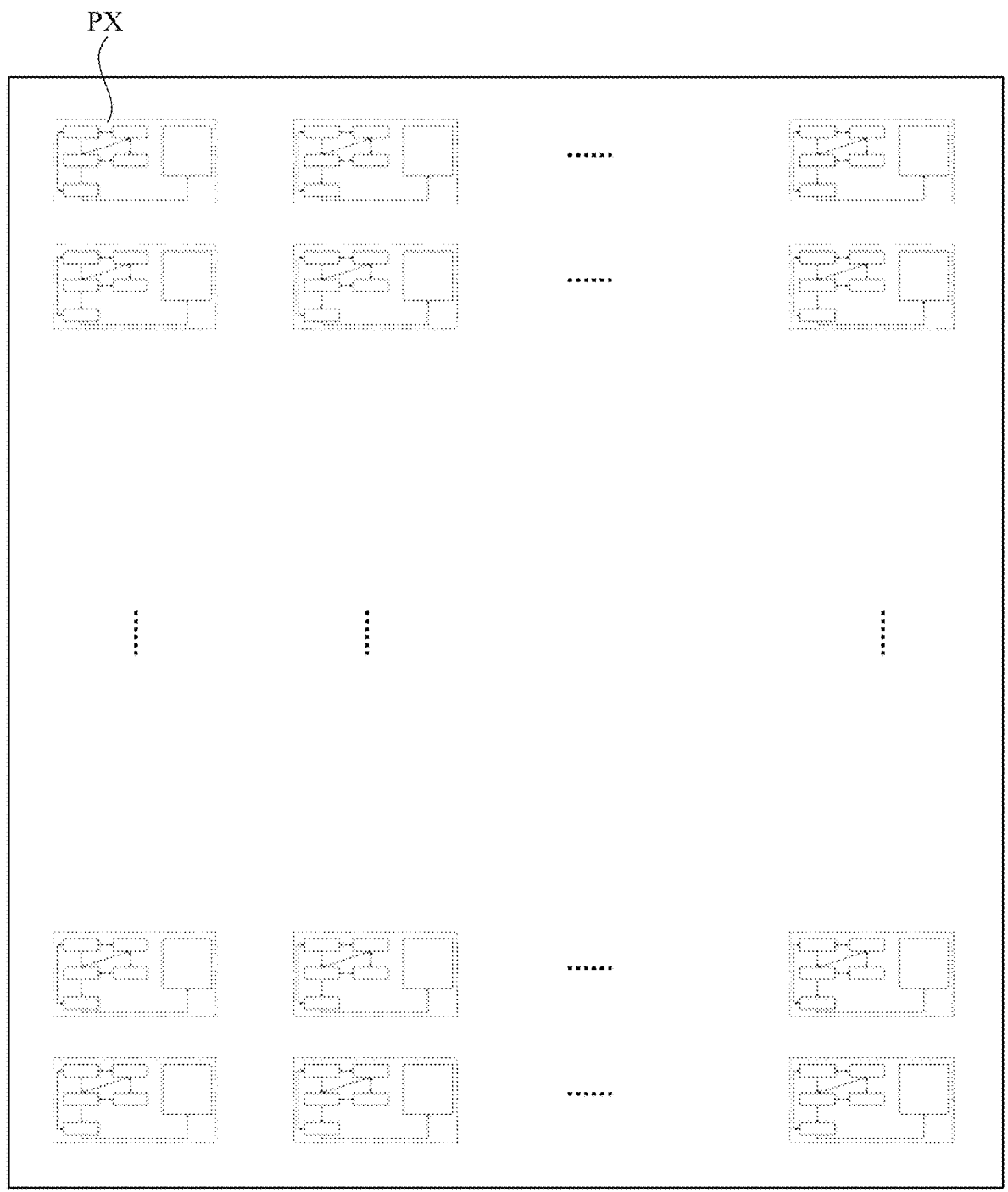
FIGS. 3A to 3C each schematically illustrates a schematic diagram of a relative positional relationship between a functional unit group and a display area in a display substrate according to the embodiments of the present disclosure.
Figure 3B:
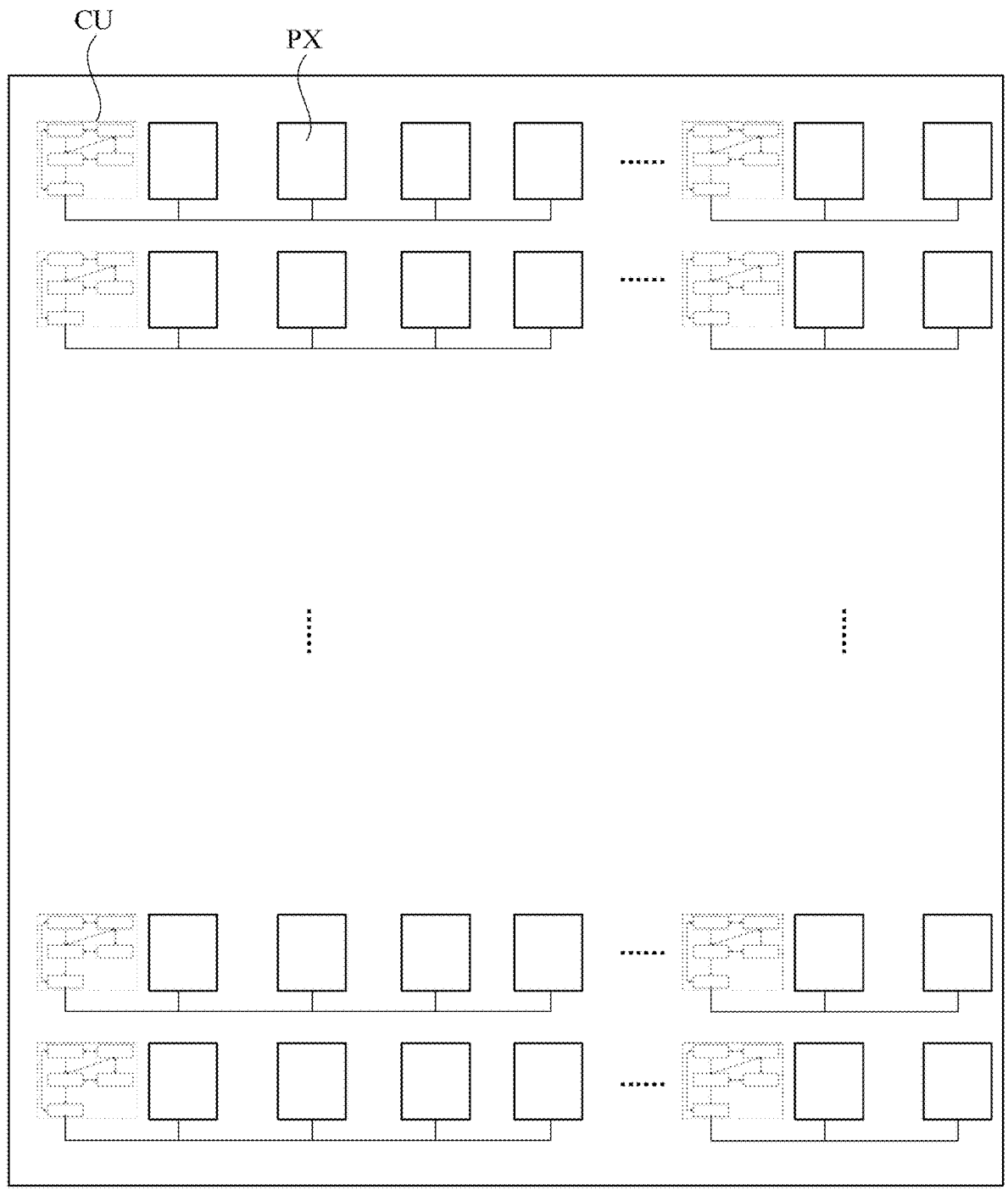
Figure 3C:
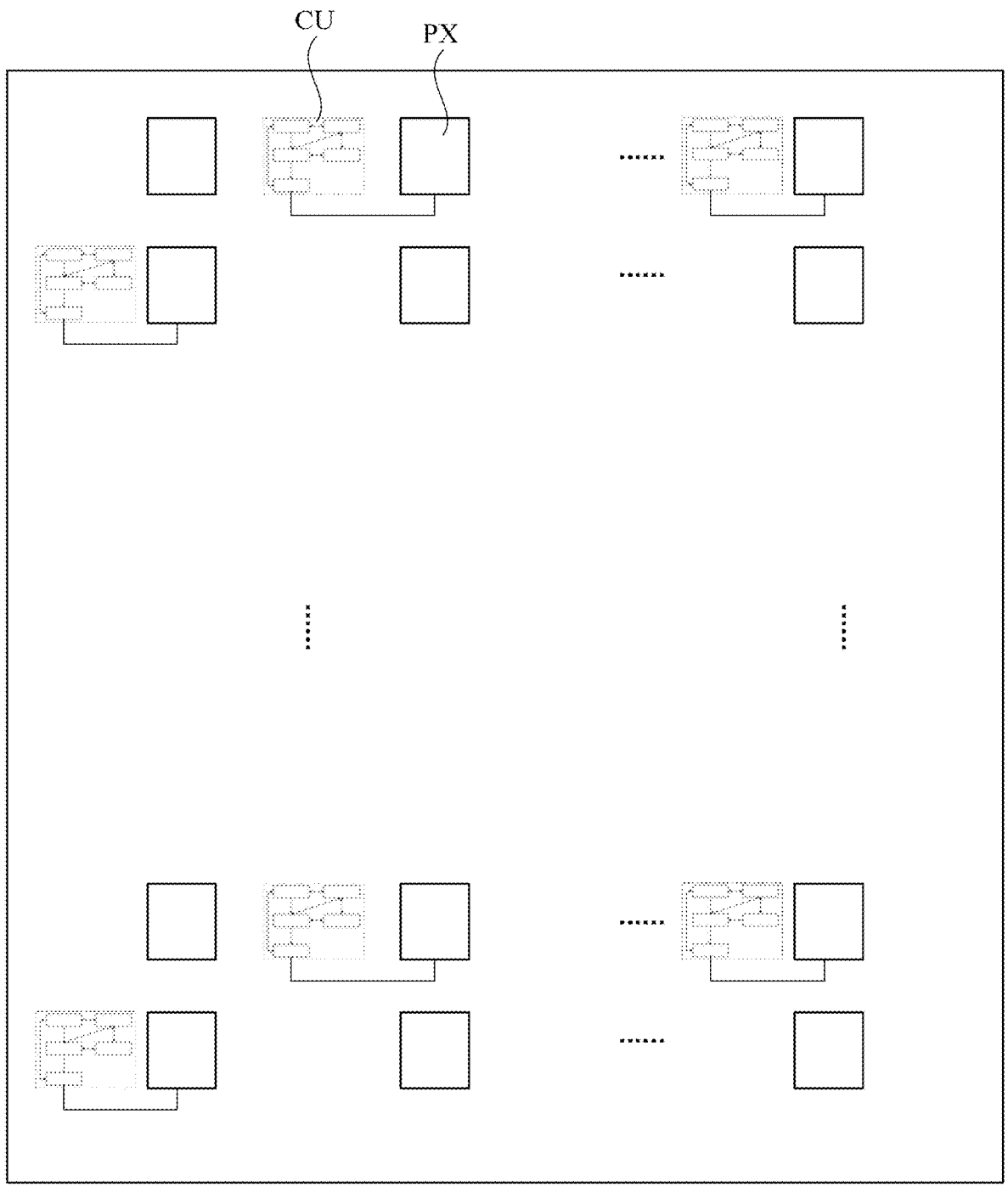

FIG. 2 schematically illustrates a schematic diagram of an arrangement of a plurality of chips in a display substrate according to the embodiments of the present disclosure. FIGS. 3A to 3C each schematically illustrates a schematic diagram of a relative positional relationship between a functional unit group and a display area in a display substrate according to the embodiments of the present disclosure.

With reference to FIGS. 1 to 3C, a plurality of chips with specific functions may be interconnected to form a functional unit group CU. For example, the control chip 1, the logic operation chip 2, the memory ship 3, the driver chip 4, and other functional chip 5 may be interconnected to form a functional unit group CU.

For example, the display apparatus may include a display substrate. The display substrate may include a display area AA and a non-display area NA. The display substrate may include a plurality of pixels PX located in the display area AA. For example, the plurality of functional unit groups CU may be periodically or non-periodically arranged on a base substrate of the display substrate. The plurality of functional unit groups CU may be located in the display area AA, or may be located in the non-display area NA. For example, some of the plurality of functional unit groups CU may be located in the display area AA, and some other ones of the plurality of functional unit groups CU may be located in the non-display area NA.

For example, referring to FIG. 3A, the plurality of functional unit groups CU may be respectively located in the plurality of pixels PX. For example, one functional unit group CU may be provided in one pixel PX. Referring to FIG. 3B, two or more pixels PX may share one functional unit group CU. Referring to FIG. 3C, a functional unit group CU may be provided in some pixels PX, and a functional unit group CU may not be provided in some other pixels PX.

For example, the functional unit group CU may only be provided in a specific pixel PX, so as to implement applications with low data amount requirements, for example, in application scenarios such as eye tracking.

For example, the plurality of functional unit groups CU may be interconnected as desired, to implement data interaction.

The semiconductor apparatus (for example, the display apparatus) according to the embodiments of the present disclosure includes the plurality of chips arranged on the base substrate. In the embodiments of the present disclosure, through a post-alignment process, an electrical connection within the chips, an electrical connection between the chips, and an electrical connection between the chip and the display unit may be realized, which may solve the problem of wiring accuracy of the microchips.

Figure 4:
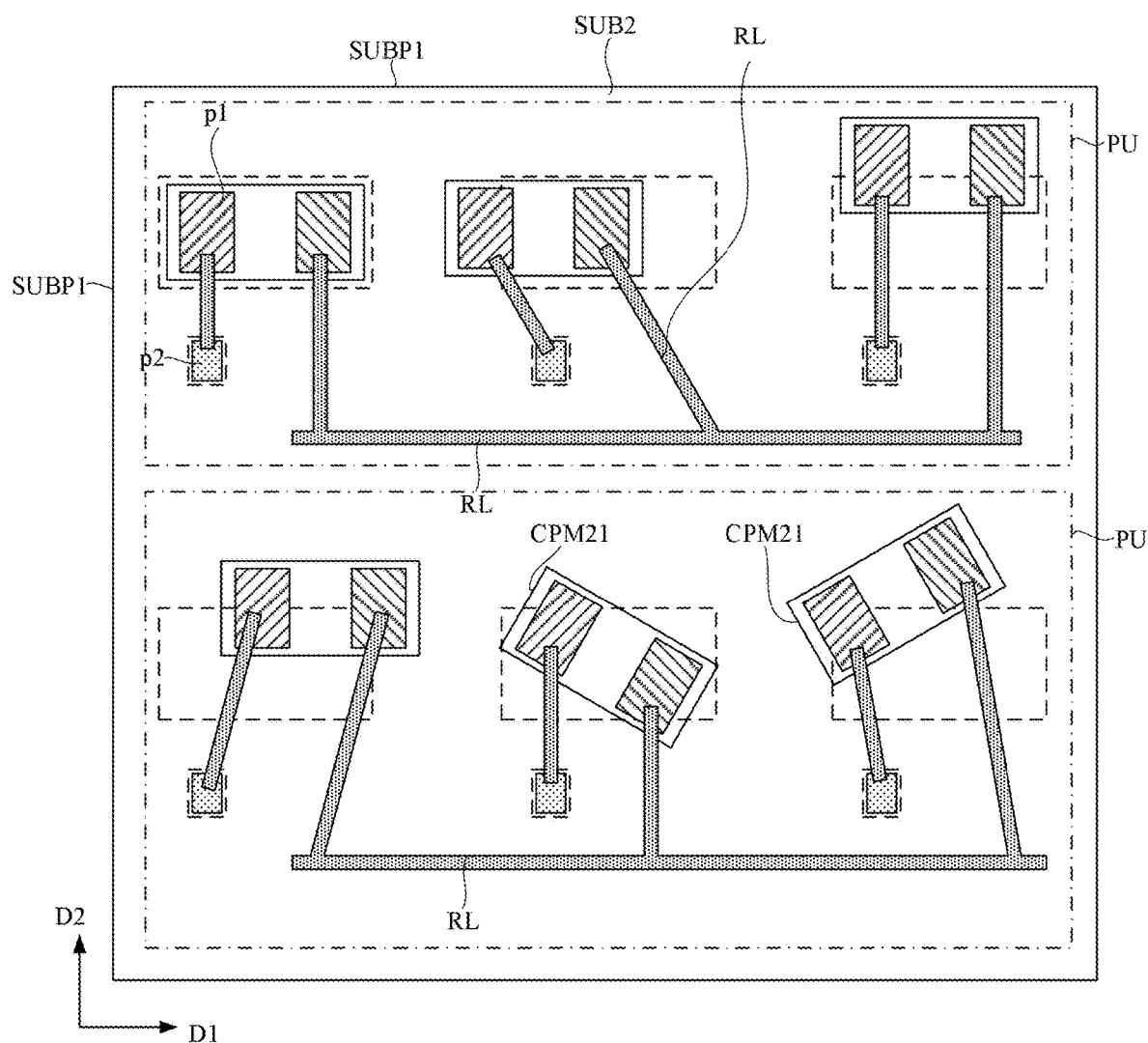
FIG. 4 schematically illustrates a schematic diagram of an alignment relationship between a terminal (pad) on a base substrate and a terminal (pad) on a chip in a semiconductor apparatus (for example, a display substrate) according to the embodiments of the present disclosure.

FIG. 4 schematically illustrates a schematic diagram of an alignment relationship between a terminal (pad) on a base substrate and a terminal (pad) on a chip in a semiconductor apparatus (for example, a display substrate) according to the embodiments of the present disclosure. Referring to FIGS. 1 to 4, the plurality of chips described above may be transferred to, for example, a base substrate through a mass transfer process. Through the mass transfer process, an alignment of a terminal p2 on the base substrate and a terminal p1 on the chip may be realized. Limited by the accuracy of the mass transfer process, a certain alignment deviation may occur between the terminal p2 on the base substrate and the terminal p1 on the chip.

It should be noted that, in the embodiments of the present disclosure, the terminal on the chip (for example, p1) and the terminal on the base substrate (for example, p2) do not need to coincide, and at least in some areas, the terminal on the chip (for example, p1) and the terminal on the base substrate (for example, p2) are not in face-to-face contact. In the above description, that "a certain alignment deviation may occur between the terminal p2 on the base substrate and the terminal p1 on the chip" may be understood as a position deviation during the transfer process of the chip, which may be caused by an alignment deviation between the terminal p1 on the chip and an ideal position thereof.

For example, FIG. 4 schematically illustrates six pairs of terminal p2 on the base substrate and terminal p1 on the chip. In FIG. 4, a small dashed box indicates a position of a terminal p2, and a large dashed box indicates an ideal position of a terminal p1 (that is, the position of the terminal p1 precisely aligned with the terminal p2). For ease of description, from left to right and top to bottom, the terminals are described as a first pair of terminals, a second pair of terminals, a third pair of terminals, a fourth pair of terminals, a fifth pair of terminals, and a sixth pair of terminals. For the first pair of terminals, the terminal p1 is located at an ideal position thereof, and in this case, the terminal p2 is precisely aligned with the terminal p1. For the second pair of terminals, the terminal p1 is offset to the left by a certain distance relative to an ideal position thereof, which causes the terminal p1 to be offset to the left by a certain distance relative to the terminal p2. For the third pair of terminals, the terminal p1 is offset upward by a certain distance relative to an ideal position thereof, which causes the terminal p1 to be offset upward by a certain distance relative to the terminal p2. For the fourth pair of terminals, the terminal p1 is offset to the upper right by a certain distance relative to an ideal position thereof, which causes the terminal p1 to be offset to the upper right by a certain distance relative to the terminal p2. For the fifth pair of terminals, the terminal p1 is deflected clockwise relative to an ideal position thereof by a certain angle, which causes the terminal p1 to be deflected clockwise relative to the terminal p2 by a certain angle. For the sixth pair of terminals, the terminal p1 is deflected counterclockwise relative to an ideal position thereof by a certain angle, which causes the terminal p1 to be deflected counterclockwise relative to the terminal p2 by a certain angle. That is, in an actual mass transfer process, the following cases may occur: the terminal p1 and the terminal p2 are precisely aligned; the terminal p1 is offset relative to the terminal p2 in at least one of a first direction and a second direction; and the terminal p1 is deflected relative to the terminal p2 by a certain angle.

With reference to FIG. 4, the semiconductor apparatus may include a plurality of repeating units PU, and the plurality of repeating units PU are arranged on the base substrate in an array in the first direction D1 and the second direction D2. Each repeating unit PU may include a plurality of chips, and the plurality of chips in each repeating unit PU are arranged on the base substrate in an array in the first direction D1 and the second direction D2, or at least some of the plurality of chips in each repeating unit PU are arranged on the base substrate in an array in the first direction D1 and the second direction D2.

It should be noted that, in the illustrated embodiment, two repeating units PU are schematically illustrated, and each repeating unit PU includes three chips, however, these numbers cannot be regarded as a limitation to the embodiments of the present disclosure.

For example, in at least two of the plurality of repeating units PU, a relative position of at least one chip in one repeating unit PU is different from a relative position of a corresponding chip in another repeating unit.

In at least two of the plurality of repeating units PU, an orientation of at least one chip in one repeating unit is different from an orientation of a corresponding chip in another repeating unit.

In at least two of the plurality of repeating units PU, an expansion wire for leading out at least one terminal of at least one chip in one repeating unit has a length different from a length of an expansion wire for leading out a corresponding terminal of a corresponding chip in another repeating unit.

In at least two of the plurality of repeating units PU, an expansion wire for leading out at least one terminal of at least one chip in one repeating unit has an extension direction different from an extension direction of an expansion wire for leading out a corresponding terminal of a corresponding chip in another repeating unit.

It should be noted that, in the embodiments of the present disclosure, the expression "corresponding chip" may be understood as a chip in a corresponding position in each repeating unit. For example, in the embodiment shown in FIG. 4, the leftmost chip in one repeating unit located on the upper side and the leftmost chip in another repeating unit located on the lower side correspond to each other.

In the embodiments of the present disclosure, an expansion wire may be formed in a terminal expansion layer (i.e., RDL) through a post-alignment process, so as to electrically connect the terminal p1 and the terminal p2. For example, positions of the terminal p1 and the terminal p2 may be identified by taking photographs, a lithography pattern is designed according to the positions of the terminal p1 and the terminal p2, and the maskless lithography technology is used for performing the exposure, such that a plurality of expansion wires RL are formed in the terminal expansion layer RDL. Based on the designed lithography pattern, the plurality of expansion wires RL are electrically connected to the terminal p1 and the terminal p2 according to design requirements. In the embodiments of the present disclosure, without the need to improve the alignment accuracy of the mass transfer process, electrical connections inside and between the microchips may be realized, and the wiring accuracy of the microchips may be improved.

Figure 5A:
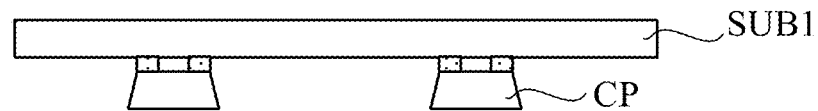
FIGS. 5A to 5D schematically illustrate schematic diagrams of some steps of a post-alignment process according to the embodiments of the present disclosure.

FIGS. 5A to 5D schematically illustrate schematic diagrams of some steps of a post-alignment process according to the embodiments of the present disclosure. Referring to FIG. 5A, a plurality of chips CP may be formed on a carrier board SUB1, for example, the plurality of chips CP may be formed on the carrier board SUB1 in an array. Alternatively, the plurality of chips CP may be formed on the carrier board SUB1 non-periodically. For example, the "chips CP" here may be the microchip described above, including but not limited to the above-mentioned LED chip, control chip 1, logic operation chip 2, memory chip 3, driver chip 4, and other functional chip 5, etc.

Figure 5B:
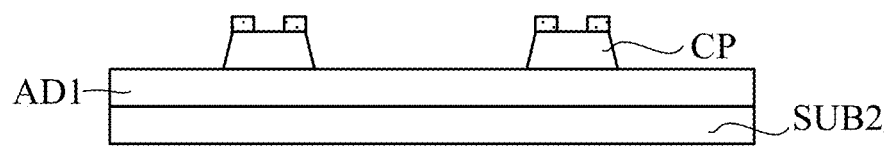

Referring to FIG. 5B, the plurality of chips CP are transferred onto a base substrate SUB2 through the mass transfer process. For example, an adhesive layer AD1 may be provided on the base substrate SUB2. The adhesive layer AD1 may play a role in fixing the chip. The adhesive layer AD1 may be whole or patterned. Then, the plurality of expansion wires may be formed through the post-alignment process. For example, referring to FIG. 5C, a metal layer ML1 and a photoresist layer PR1 may be deposited onto the chip CP, and then a patterned photoresist layer PR1 is formed through a patterning process. Referring to FIG. 5D, the metal layer ML1 is etched to form a patterned metal layer ML1, which is the terminal expansion layer RDL described above, and a plurality of patterns formed in the terminal expansion layer RDL constitute the expansion wires RL to electrically connect with respective terminals.

Figure 5C:
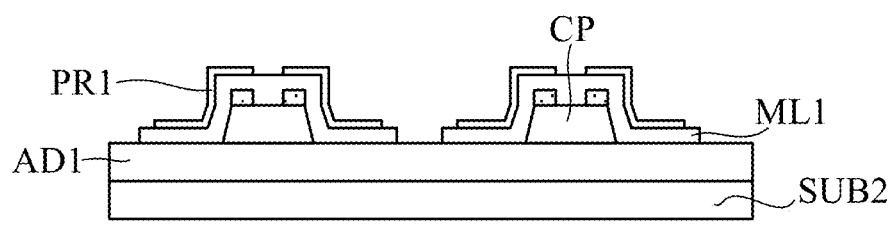
Figure 5D:
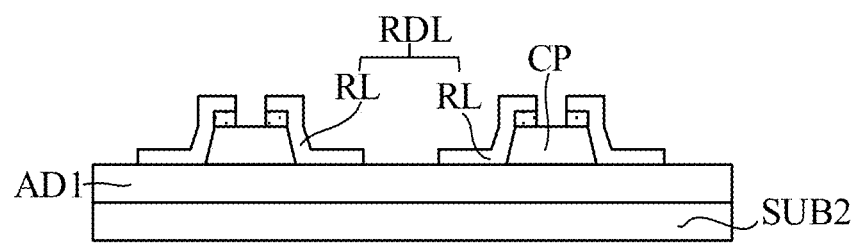

For example, in the embodiment shown in FIG. 5C, the patterning process includes, but is not limited to, sub-micron exposure technologies such as digital exposure, laser direct writing, and EBL.

In the embodiments of the present disclosure, a chip may be transferred to a base substrate through the mass transfer process with low position accuracy, and then the chip with low position accuracy may be identified and analyzed through the post-alignment process. For example, the terminal p1 on the chip and the terminal p2 on the base substrate may be identified and analyzed by taking photographs and image recognition, so as to determine the relative positional relationship between the terminals. Based on a recognition and analysis result, an automatic wiring file is generated. In the patterning process shown in FIG. 5C, the photoresist layer PR1 may be patterned according to the automatic wiring file. In this way, the automatic wiring and high-precision chip bonding may be realized, so as to integrate the microchip and the display unit. In addition, the post-alignment process has at least the following advantages: the accuracy of the post-alignment process depends on the alignment accuracy of the optical exposure, and the alignment accuracy of the optical exposure is much higher than that of the mass transfer process, which is more suitable for bonding the microchip; and the post-alignment process adopts exposure, development, and etching processes, which are more suitable for bonding large-area, high-efficiency batch chips.

Figure 6A:
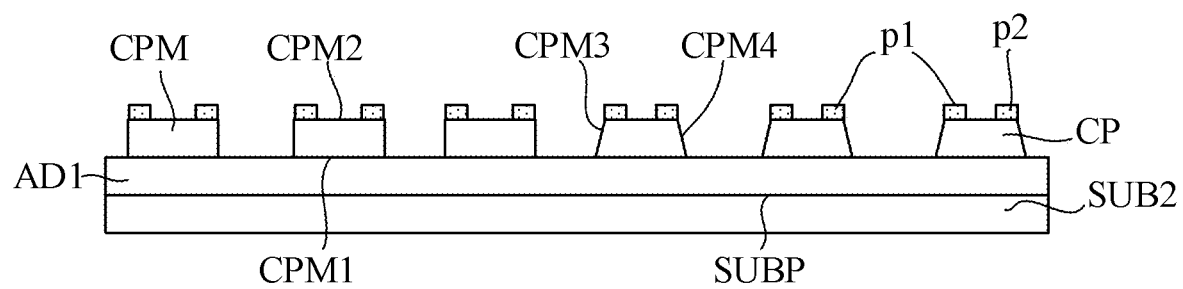
FIGS. 6A and 6B schematically illustrate a cross-sectional view and a top view of a microchip according to the embodiments of the present disclosure, respectively.
Figure 6B:
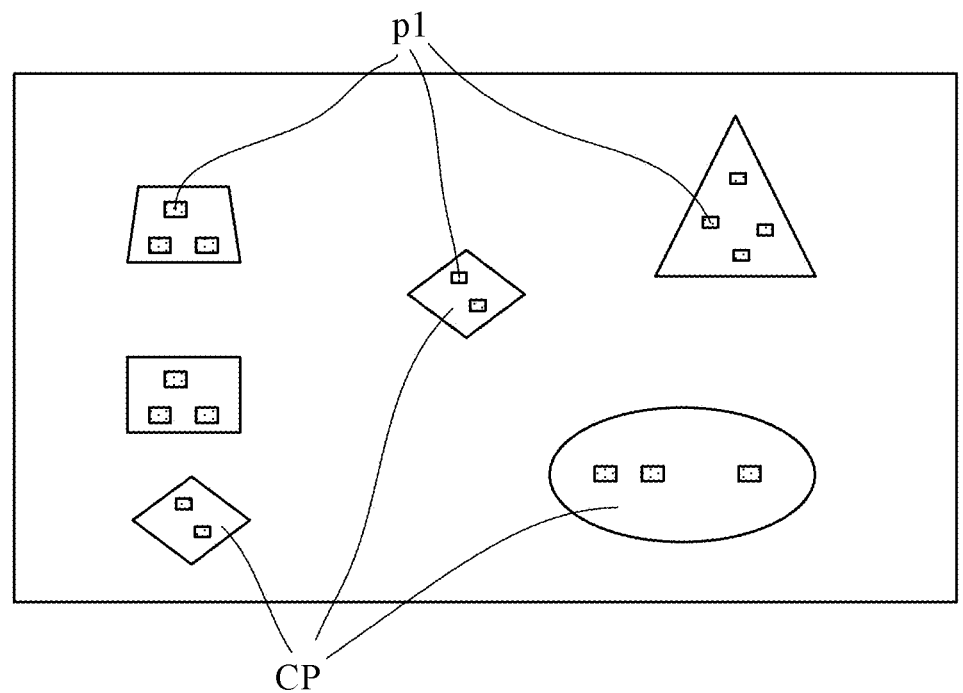

For example, chips on a same base substrate may have a same shape and function, or different shapes and functions. The terminal p1 of the chip may have pins upward, the number of the pins may be greater than or equal to two, and respective terminals p1 may have a same dimension and morphology or different dimensions and morphologies. FIGS. 6A and 6B schematically illustrate a cross-sectional view and a top view of a microchip according to the embodiments of the present disclosure, respectively. As shown in FIG. 6A, a plurality of chips CP are provided on the same base substrate SUB2, and the plurality of chips CP may have different functions. The shapes of the plurality of chips CP may be different in the cross-sectional view and the top view. For example, referring to FIG. 6A, the chips CP in the cross-sectional view may have various shapes, such as rectangle, trapezoid. Referring to FIG. 6B, the chips CP in the top view may have various shapes, such as trapezoid, rectangle, rhombus, triangle, circle, ellipse, etc.

Figure 7A:
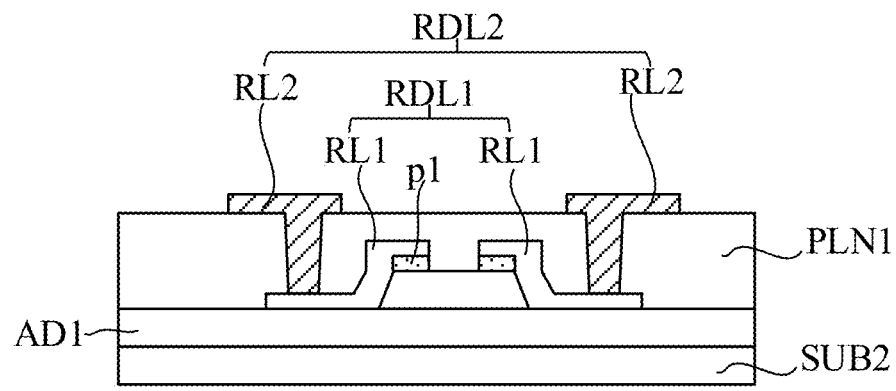
FIGS. 7A, 7B, and 7C schematically illustrate a perspective view and cross-sectional views of a microchip and an expansion wire in a terminal expansion layer according to the embodiments of the present disclosure.
Figure 7B:
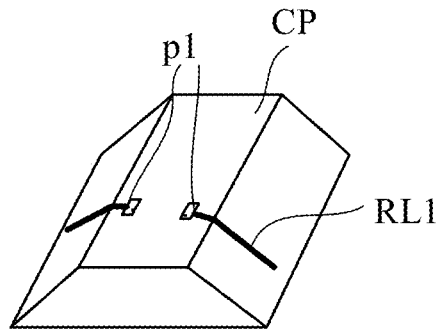
Figure 7C:
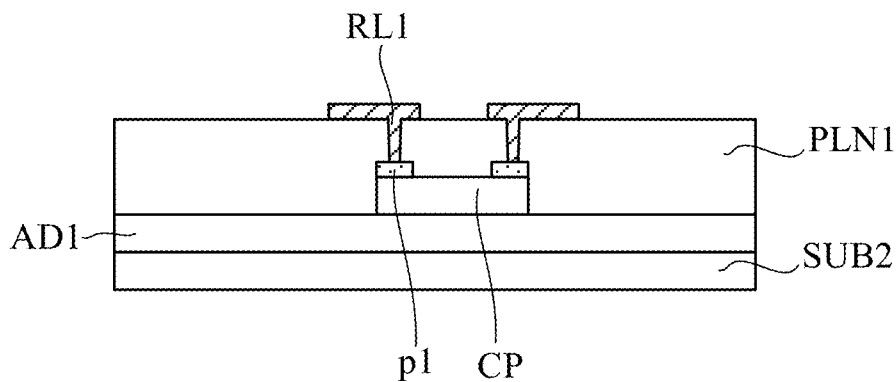

FIGS. 7A, 7B, and 7C schematically illustrate a perspective view and cross-sectional views of a microchip and an expansion wire in a terminal expansion layer according to the embodiments of the present disclosure. As shown in FIGS. 7A and 7B, the chip CP in a cross-sectional view has a trapezoidal shape. In other words, at least one side surface of the chip CP is relatively gentle, that is, the chip CP has at least one side surface with a slope angle less than 90°, for example, less than 70°. In this case, an expansion wire may be directly led out from the terminal p1 of the chip CP. As shown in FIG. 7B, the expansion wire RL led out from the terminal p1 of the chip CP may be formed on the side surface with the slope angle less than 90°. For example, a terminal expansion layer and at least one redistribution layer may be provided, for ease of description, they are called a terminal expansion layer RDL1 and a redistribution layer RDL2, respectively. Accordingly, the expansion wires in the terminal expansion layer RDL1 and the redistribution layer RDL2 are respectively called an expansion wire RL1 and a first wire RL2. As shown in FIG. 7A, a planarization layer PLN1 may be arranged between the terminal expansion layer RDL1 and the redistribution layer RDL2. The expansion wire RL1 is directly led out from the terminal p1 of the chip CP. The first wire RL2 is electrically connected to the expansion wire RL1 through a via hole passing through the planarization layer PLN1. In this way, the terminals of the chip may be led out, which is conducive to the electrical connections between respective terminals of the chips.

As shown in FIG. 7C, a chip CP in a cross-sectional view has a substantially rectangular shape. In other words, a side surface of the chip CP is relatively steep, that is, a slope angle of the side surface of the chip CP is substantially equal to or close to 90°, for example, in a range of 70° to 90°. In this case, an expansion wire is not suitable to be directly formed on the side surface of the chip CP, that is, it is not suitable to directly lead out the expansion wire from the terminal p1 of the chip CP. A planarization layer PLN1 may be formed on a side of the chip CP away from the base substrate first, a height of the planarization layer PLN1 is greater than that of the chip CP, so that the planarization layer PLN1 may cover the chip CP and the terminal p1 on the chip CP. Then, the expansion wire RL1 is formed through the post-alignment process. As shown in FIG. 7C, the semiconductor apparatus may include a base substrate SUB2, an adhesive layer AD1 arranged on the base substrate SUB2, a chip CP arranged on the adhesive layer AD1, a planarization layer PLN1 arranged on a side of the chip CP away from the base substrate, and an expansion wire RL1 arranged on a side of the planarization layer PLN1 away from the base substrate. The expansion wire RL1 may be electrically connected to the terminal p1 through a via hole passing through the planarization layer PLN1. In this way, the terminals of the chip may be led out, which is conducive to the electrical connection between respective terminals of the chips.

Referring to FIG. 7C, in the case that the chip CP has a substantially rectangular shape in the cross-sectional view, a planarization layer may be formed on at least one side surface of the chip CP, to form a side surface with a smaller slope. In this way, similar to FIGS. 7A and 7B, an expansion wire may be formed on the side surface of the planarization layer with the smaller slope.

It should be noted that, the planarization layer PLN1 may have a single-layer or multi-layer structure.

Figure 8A:
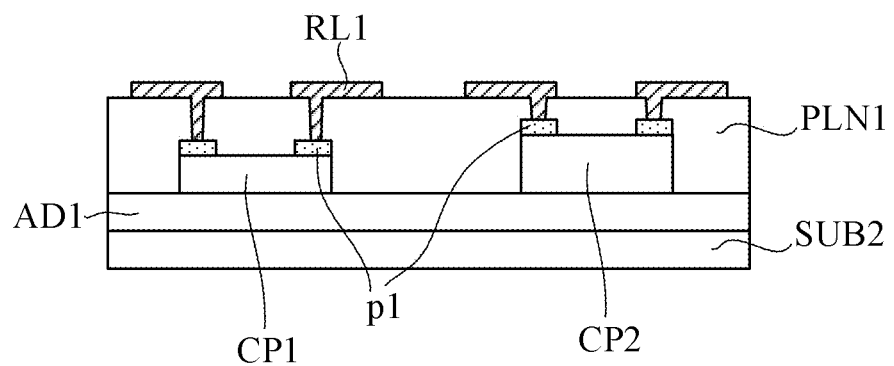
FIGS. 8A, 8B, and 8C schematically illustrate cross-sectional views of a microchip and an expansion wire in a terminal expansion layer according to some embodiments of the present disclosure.
Figure 8B:
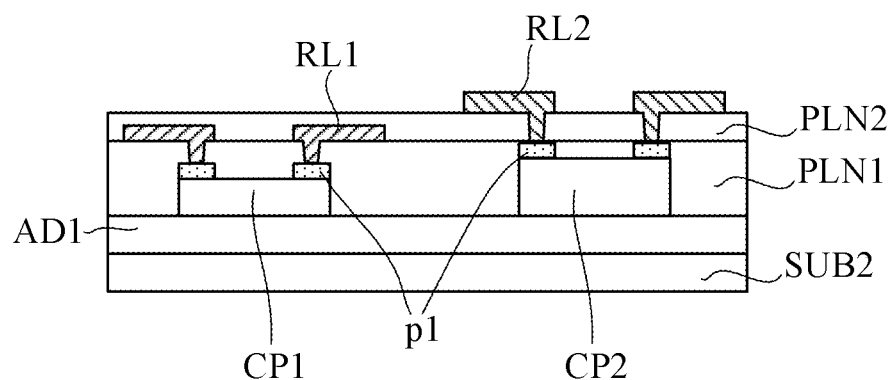
Figure 8C:
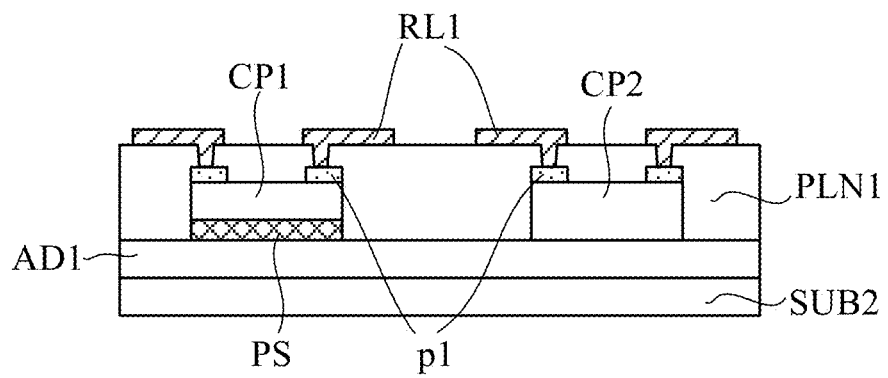

FIGS. 8A, 8B, and 8C schematically illustrate cross-sectional views of a microchip and an expansion wire in a terminal expansion layer according to some embodiments of the present disclosure. As shown in FIG. 8A, in a semiconductor apparatus according to the embodiments of the present disclosure, a plurality of chips CP are arranged on a base substrate SUB2, and there is a height difference between at least two chips CP. For ease of description, two chips with a height difference are respectively referred to as a chip CP1 and a chip CP2.

As shown in FIG. 8A, in a case that the height difference between the chip CP1 and the chip CP2 is smaller than a process limit of the post-alignment exposure process in a vertical direction, wiring may be realized through one post-alignment process, that is, through the post-alignment process, a layer of terminal expansion layer RDL1 is formed, and a plurality of expansion wires RL1 located in the terminal expansion layer RDL1 may lead out terminals of the chip CP1 and the chip CP2. For example, the semiconductor apparatus may include a base substrate SUB2, an adhesive layer AD1 arranged on the base substrate SUB2, the chip CP1 and chip CP2 arranged on the adhesive layer AD1, a planarization layer PLN1 arranged on a side of the chip CP1 and chip CP2 away from the base substrate, and a terminal expansion layer RDL1 arranged on a side of the planarization layer PLN1 away from the base substrate. A plurality of expansion wires RL1 are arranged in the terminal expansion layer RDL1. A height of the planarization layer PLN1 is greater than each of a height of the chip CP1 and a height of the chip CP2. Some of the expansion wires RL1 may be electrically connected to the terminal p1 of the chip CP1 through a via hole passing through the planarization layer PLN1, and some other ones of the expansion wires RL1 may be electrically connected to the terminal p1 of the chip CP2 through a via hole passing through the planarization layer PLN1. In this way, terminals of the chip CP1 and the chip CP2 may be led out, which is conducive to the electrical connection between respective terminals of the chips. By analogy, terminals of the plurality of chips may be led out, which is conducive to the electrical connection between terminals of the plurality of chips.

As shown in FIG. 8B, in a case that the height difference between the chip CP1 and the chip CP2 is greater than the process limit of the post-alignment exposure process in the vertical direction, wiring may be realized through at least two post-alignment processes. That is, one post-alignment process and wiring are performed for the thin chip CP1 first, and then another post-alignment process and wiring are performed for the chip CP2 with a different thickness range (for example, thicker than that of the chip CP1). A planarization layer may be formed between the last post-alignment process and the previous post-alignment process. For example, the semiconductor apparatus may include a base substrate SUB2, an adhesive layer AD1 arranged on the base substrate SUB2, the chip CP1 and chip CP2 arranged on the adhesive layer AD1, a planarization layer PLN1 arranged on a side of the chip CP1 away from the base substrate, a terminal expansion layer RDL1 arranged on a side of the planarization layer PLN1 away from the base substrate, a planarization layer PLN2 arranged on a side of the terminal expansion layer RDL1 away from the base substrate, and a redistribution layer RDL2 arranged on a side of the planarization layer PLN2 away from the base substrate. An expansion wire RL1 is arranged in the terminal expansion layer RDL1, and a first wire RL2 is arranged in the redistribution layer RDL2. The expansion wire RL1 may be electrically connected to the terminal p1 of the chip CP1 through a via hole passing through the planarization layer PLN1, and the first wire RL2 may be electrically connected to the terminal p1 of the chip CP2 through a via hole passing through the planarization layer PLN2. In this way, the terminals of the chip CP1 and the chip CP2 may be led out, which is conducive to the electrical connection between respective terminals of the chips.

As shown in FIG. 8C, in a case that the height difference between the chip CP1 and the chip CP2 is greater than the process limit of the post-alignment exposure process in the vertical direction, a spacer may be prepared on the base substrate first, and a difference between the height difference of the chips and the process limit of the post-alignment exposure process in the vertical direction is less than or equal to a height of the spacer, and the height of the spacer is less than or equal to the height difference of the chips; then, wiring may be realized through one post-alignment process. For example, the semiconductor apparatus may include a base substrate SUB2, an adhesive layer AD1 arranged on the base substrate SUB2, a spacer PS and the chip CP2 arranged on the adhesive layer AD1, the chip CP1 arranged on the spacer PS, a planarization layer PLN1 arranged on a side of the chip CP1 and the chip CP2 away from the base substrate, and a terminal expansion layer RDL1 arranged on a side of the planarization layer PLN1 away from the base substrate. A plurality of expansion wires RL1 are arranged in the terminal expansion layer RDL1. A height of the planarization layer PLN1 is greater than each of the height of the chip CP1 and the height of the chip CP2, that is, a height of the planarization layer PLN1 away from a surface of the base substrate SUB2 is greater than each of the height of the chip CP1 and the height of the chip CP2 away from the surface of the base substrate SUB2. An orthographic projection of the chip CP1 on the base substrate is within an orthographic projection of the spacer PS on the base substrate, and an area of the orthographic projection of the chip CP1 on the base substrate is less than an area of the orthographic projection of the spacer PS on the base substrate. As such, the alignment between the chip CP1 and the spacer PS does not need high accuracy, which is conducive to the disposition of the chip CP1 on the spacer PS. Some of the expansion wires RL1 may be electrically connected to the terminal p1 of the chip CP1 through a via hole passing through the planarization layer PLN1, and some other ones of the expansion wires RL1 may be electrically connected to the terminal p1 of the chip CP2 through a via hole passing through the planarization layer PLN1. In this way, terminals of the chip CP1 and the chip CP2 may be led out, which is conducive to the electrical connection between respective terminals of the chips.

It should be noted that, in the embodiment shown in FIG. 8C, the height of the spacer PS may also be slightly greater than the height difference of the chips. For example, a difference between the height of the spacer PS and the height difference of the chips may be less than the process limit of the post-alignment exposure process in the vertical direction.

In the embodiments of the present disclosure, a chip first process or a chip later process may be used to form the chip on the base substrate. For example, taking the semiconductor apparatus as the display apparatus as an example, in the chip first process, the chip may be formed first and then a driving unit of the display apparatus is formed; and in the chip later process, the driving unit of the display apparatus may be formed first and then the chip is formed.

Referring to FIGS. 4 to 8C, in the embodiments of the present disclosure, the chip may include a chip main body CPM and a plurality of terminals p1 and p2 arranged on the chip main body CPM. The chip main body CPM may include a first surface CPM1, a second surface CPM2, a first side surface CPM3, and a second side surface CPM4. The second surface CPM2 and the first surface CPM1 are respectively located on opposite sides of the chip main body, the first side surface CPM3 and the second side surface CPM4 are respectively located on side surfaces of the chip main body CPM, and each of the first side surface CPM3 and the second side surface CPM4 connects the first surface CPM1 and the second surface CPM2. The second surface CPM2 faces or is in contact with the adhesive layer AD1, and at least one of the terminals p1 and p2 is arranged on the first surface CPM1. In some embodiments, at least one of the terminals p1 and p2 may also be arranged on a surface of the chip main body CPM except the first surface CPM1 (e.g., CPM2, CPM3 and CPM4).

As shown in FIGS. 4 and 6A, the base substrate may include a first base substrate surface SUBP, the chip is arranged on the first base substrate surface SUBP, and the first base substrate surface SUBP includes a first base substrate edge SUBP1.

In the embodiments of the present disclosure, an orthographic projection of at least one expansion wire RL on the base substrate is inclined relative to the first base substrate edge SUBP1.

For example, an orthographic projection of the second surface CPM2 on the base substrate has a regular shape. As shown in FIG. 6B, the regular shape includes, but is not limited to, the rectangle, rounded rectangle, rhombus, square, hexagon, octagon, circle, ellipse, rectangle, triangle, etc. As shown in FIG. 4, the orthographic projection of the second surface CPM2 on the base substrate includes a first edge CPM21, and the first edge CPM21 is inclined relative to the first base substrate edge SUBP1.

For example, a first angle is formed between an extension line of an orthographic projection of at least one expansion wire RL on the base substrate and an extension line of the first base substrate edge SUBP1, and the first angle is greater than 0° and less than 90°.

For example, a second angle is formed between an extension line of the first edge CPM21 and an extension line of the first base substrate edge SUBP1, and the second angle is greater than 0° and less than 90°.

In a conventional semiconductor apparatus and a manufacturing process therefor, an orientation of a chip relative to a base substrate cannot be deflected or only be deflected by a small angle. For example, the deflection angle may be less than 10°, which may ensure the bonding of respective terminals of the chips is effective. In the embodiments of the present disclosure, an orientation of the chip relative to the base substrate may be deflected by a certain angle, and the deflection angle may range from 0° to 90°. For example, the deflection angle may range from 0° to 50°, may range from 1° to 60°, may be greater than 10° and less than 90°, and may be about 10°, about 20°, about 30°, about 40°, about 15°, about 25°, about 35°, about 45°, about 50°, about 60°, about 70°, about 80°, etc. That is, in the embodiments of the present disclosure, the chip may be deflected by a relatively large angle with respect to the base substrate, for example, the deflection angle may be greater than 10°. In the embodiments of the present disclosure, even when the chip is deflected by a relatively large angle with respect to the base substrate, a terminal expansion layer may still be formed through the subsequent post-alignment process, so as to effectively bond the chip and avoid formation of a defective point.

Figure 9:
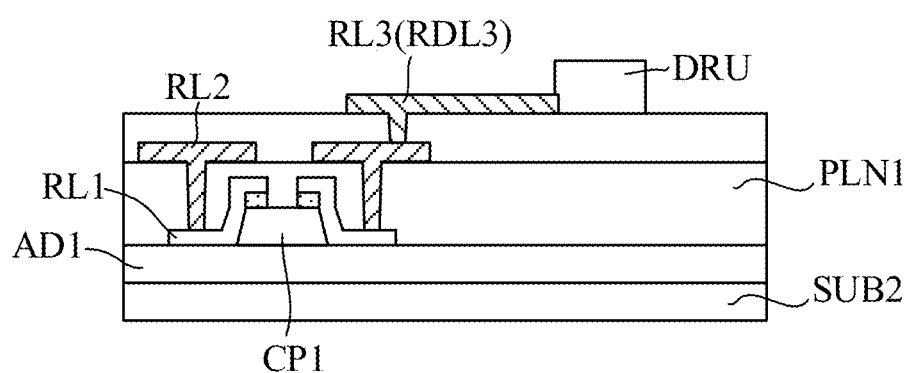
FIG. 9 schematically illustrates a schematic diagram of a structure forming through a chip first process according to the embodiments of the present disclosure.
Figure 10:
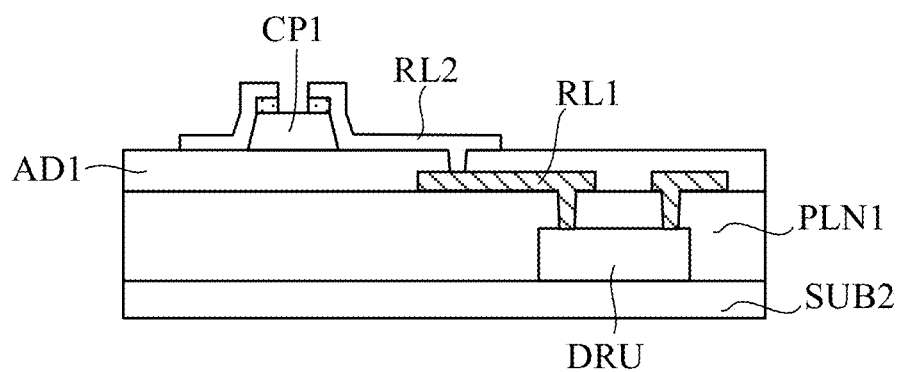
FIG. 10 schematically illustrates a schematic diagram of a structure formed through a chip later process according to the embodiments of the present disclosure.

FIG. 9 schematically illustrates a schematic diagram of a structure forming through a chip first process according to the embodiments of the present disclosure. FIG. 10 schematically illustrates a schematic diagram of a structure formed through a chip later process according to the embodiments of the present disclosure.

As shown in FIG. 9, the display apparatus may include a base substrate SUB2, an adhesive layer AD1 arranged on the base substrate SUB2, a chip CP1 arranged on the adhesive layer AD1, a terminal expansion layer RDL1 arranged on a side of the chip CP1 away from the base substrate, a planarization layer PLN1 arranged on a side of the terminal expansion layer RDL1 away from the base substrate, a redistribution layer RDL2 arranged on a side of the planarization layer PLN1 away from the base substrate, a planarization layer PLN2 arranged on a side of the redistribution layer RDL2 away from the base substrate, and a redistribution layer RDL3 and a driving unit DRU arranged on a side of the planarization layer PLN2 away from the base substrate. An expansion wire RL1 is arranged in the terminal expansion layer RDL1, a first wire RL2 is arranged in the redistribution layer RDL2, and a second wire RL3 is arranged in the redistribution layer RDL3. For example, at least part of the expansion wire RL1 is arranged on a sidewall of the chip CP1, being directly electrically connected to the terminal p1 of the chip CP1. The first wire RL2 may be electrically connected to the extended wire RL1 through a via hole passing through the planarization layer PLN1, and the second wire RL3 may be electrically connected to the first wire RL2 through a via hole passing through the planarization layer PLN2. For example, the second wire RL3 and the driving unit DRU may be located in a same layer, and may be electrically connected to each other. In this way, a terminal of the chip CP1 may be led out, and an electrical connection between the chip CP1 and the driving unit DRU may be realized. In this embodiment, the chip CP1 is closer to the base substrate SUB2 than the driving unit DRU. In actual manufacturing, the chip CP1 may be formed on the base substrate SUB2 first, then the terminal expansion layer may be formed through the post-alignment process, and after that, the driving unit DRU may be formed. It should be understood that, the processing accuracy of a microchip is generally higher than that of the driving unit such as a thin film transistor. In this embodiment, after the chip is transferred onto the base substrate, the bonding and integration are performed through the post-alignment process, which is beneficial to avoid barriers of a processing technology of a driving unit such as the thin film transistor, so as to realize a high-resolution display.

For example, as shown in FIG. 10, the display apparatus may include a base substrate SUB2, a driving unit DRU arranged on the base substrate SUB2, a planarization layer PLN1 arranged on a side of the driving unit DRU away from the base substrate, an terminal expansion layer RDL1 arranged on a side of the planarization layer PLN1 away from the base substrate, an adhesive layer AD1 arranged on a side of the terminal expansion layer RDL1 away from the base substrate, a chip CP1 arranged on the adhesive layer AD1, and a redistribution layer RDL2 arranged on a side of the chip CP1 away from the base substrate. An expansion wire RL1 is arranged in the terminal expansion layer RDL1, and a first wire RL2 is arranged in the redistribution layer RDL2. For example, at least a part of the first wire RL2 is arranged on a sidewall of the chip CP1, being directly electrically connected to the terminal p1 of the chip CP1. The first wire RL2 may be electrically connected to the expansion wire RL1 through a via hole passing through the adhesive layer AD1, and the expansion wire RL1 may be electrically connected to the driving unit DRU through a via hole passing through the planarization layer PLN1. In this way, an electrical connection between the chip CP1 and the driving unit DRU may be realized. In this embodiment, the chip CP1 is farther away from the base substrate SUB2 than the driving unit DRU. In actual manufacturing, the driving unit DRU may be formed on the base substrate SUB2 first, then the terminal expansion layer may be formed through the post-alignment process, and after that, the chip CP1 may be formed. In this embodiment, the driving unit such as a thin film transistor is first transferred or prepared on the base substrate, and then the chip is transferred to the base substrate, so as to prevent the processing of the driving unit such as the thin film transistor from affecting the performance of the chip.

In the embodiments of the present disclosure, the driving unit DRU includes, but is not limited to, a thin film transistor (TFT) driving circuit, a MOS driving circuit, a driver chip (IC), and the like. For example, the driving unit or driving element may be used for providing an electrical signal for a LED chip, so as to control the luminance of the LED chip. For example, in some examples, the driving unit or driving element may be a structure including a plurality of pixel driving circuits connected with light-emitting diode chips in a one-to-one correspondence, or a plurality of microchips connected with the light-emitting diode chips in a one-to-one correspondence, which may control each LED chip to emit light with a different gray scale and luminance. It should be noted that the specific circuit structure of the driving unit or the driving element may be set according to actual needs, which is not limited in the embodiments of the present disclosure.

Hereinafter, taking the semiconductor apparatus as the display apparatus as an example, some exemplary embodiments of the present disclosure are further described.

Figure 11A:
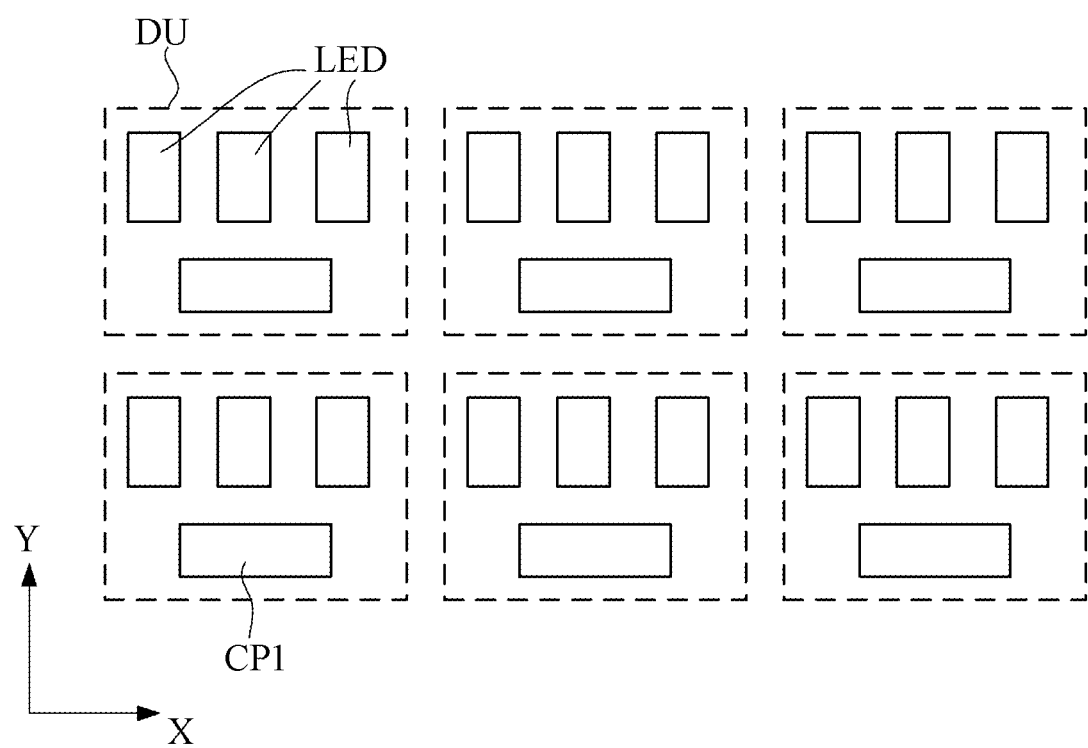
FIGS. 11A and 11B each schematically illustrates a schematic diagram of an exemplary arrangement of a chip and a display unit included in a display apparatus according to some embodiments of the present disclosure.
Figure 11B:
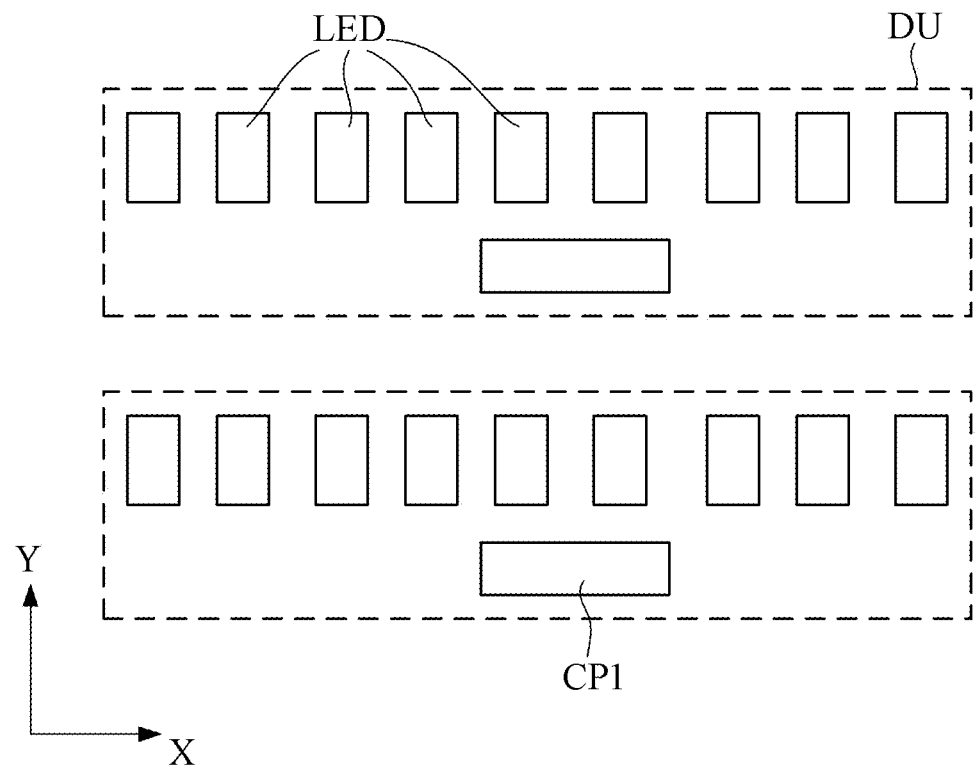

FIGS. 11A and 11B each schematically illustrates schematic diagrams of exemplary arrangements of a chip and a display unit included in a display apparatus according to some embodiments of the present disclosure. For example, a chip CP1 may be a driver chip for driving a display unit DU, and the display unit DU may be an LED chip that can emit light.

Referring to FIG. 11A, a pixel may include 3 LED chips, for example, corresponding to R, G, and B sub-pixels. One chip CP1 may correspond to one pixel, that is, one driver chip is used for driving one pixel. For example, referring to FIG. 11B, one chip CP1 may correspond to a plurality of pixels, that is, one driver chip is used for driving a plurality of pixels. With such arrangement, a plurality of pixels may be driven in an active matrix mode (AM mode) using a driver chip.

Referring to FIG. 11A, a plurality of light-emitting diodes are arranged in an array in a first direction X and a second direction Y. For example, the first direction X is a row direction, and the second direction Y is a column direction. The embodiments of the present disclosure are not limited thereto, the first direction X and the second direction Y may be any direction, as long as they are crossed. A plurality of LED chips are not limited to being arranged along a straight line, but may also be arranged along a curve, along a ring, or in any manner, which may be determined according to actual desires, and the embodiments of the present disclosure are not limited to this.

It should be noted that, in the embodiments of the present disclosure, the chip CP1 is not limited to a driver chip for driving a display unit, and may also include a control chip, a logic operation chip, a memory chip, and other functional chips.

Herein, for ease of description, a chip used to drive or control the LED is referred to as chip CP1, and a LED chip used to emit light is referred to as chip CP3.

According to a dimension of the chip CP1, a method for manufacturing a display apparatus according to the embodiments of the present disclosure may include at least two process routes.

FIGS. 12A to 12F each schematically illustrates a cross-sectional view of a structure formed after performing some steps in a method for manufacturing a display apparatus according to the exemplary embodiments of the present disclosure. In a case that the dimension of the chip CP1 is small, the method for manufacturing the display apparatus according to the exemplary embodiments of the present disclosure may include at least the following steps. It should be noted that, the case that the chip CP1 has a small dimension may include: the dimension of the chip CP1 being substantially equal to or less than a dimension of the LED chip, or in other words, a ratio between an area of an orthographic projection of the chip CP1 on the base substrate and an area of an orthographic projection of the LED chip on the base substrate is less than or equal to 1.2.

Figure 12A:
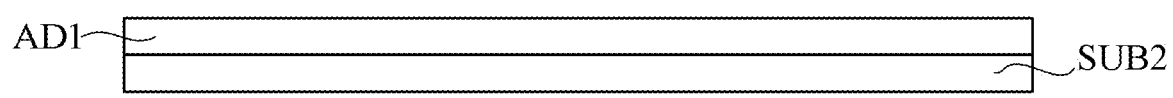
FIGS. 12A to 12F each schematically illustrates a cross-sectional view of a structure formed after performing some steps in a method for manufacturing a display apparatus according to the exemplary embodiments of the present disclosure.

Referring to FIG. 12A, an adhesive layer AD1 is coated on or attached to a base substrate SUB2. For example, the base substrate SUB2 may be a glass base substrate. A material of the adhesive layer AD1 may include hot melt adhesive, laser curing adhesive, or ultraviolet curing adhesive.

Figure 12B:
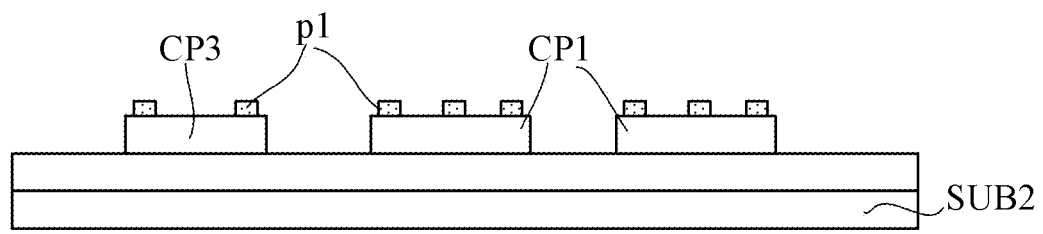

Referring to FIG. 12B, the driver chip CP1 and/or the LED chip CP3 are transferred to the base substrate SUB2 through SMT or the mass transfer process, and fixed on the base substrate by the adhesive layer AD1.

For example, the driver chip CP1 and the LED chip CP3 may be arranged on the adhesive layer AD1, and terminals p1 of the driver chip CP1 and the LED chip CP3 may face upward, that is, the terminals p1 of the driver chip CP1 and the LED chip CP3 are located on a side of the chips away from the base substrate.

For example, the driver chip CP1 may adopt a Si-based CMOS process, which is not limited in the embodiments of the present disclosure.

Figure 12C:
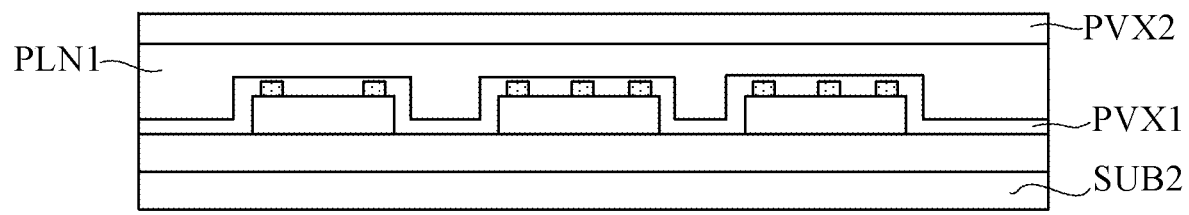

Referring to FIG. 12C, a passivation layer PVX1 is deposited on a side of the driver chip CP1 and the LED chip CP3 away from the base substrate, and a planarization layer PLN1 is coated on a side of the passivation layer PVX1 away from the base substrate.

For example, the passivation layer PVX1 may include a material such as silicon dioxide, which is used for insulation and increasing adhesion of a cover layer. The planarization layer PLN1 may include a resin material, which is used for filling a segment gap between chips such as the driver chip CP1 and the LED chip CP3, so as to achieve planarization.

For example, in some other embodiments, the passivation layer PVX1 may not be provided.

For example, a passivation layer PVX2 may be provided on a side of the planarization layer PLN1 away from the base substrate. For example, the passivation layer PVX2 may include a material such as silicon nitride, which is used for isolating water vapor in the planarization layer PLN1, so as to prevent the water vapor in the planarization layer PLN1 from corroding an upper terminal expansion layer.

Figure 12D:
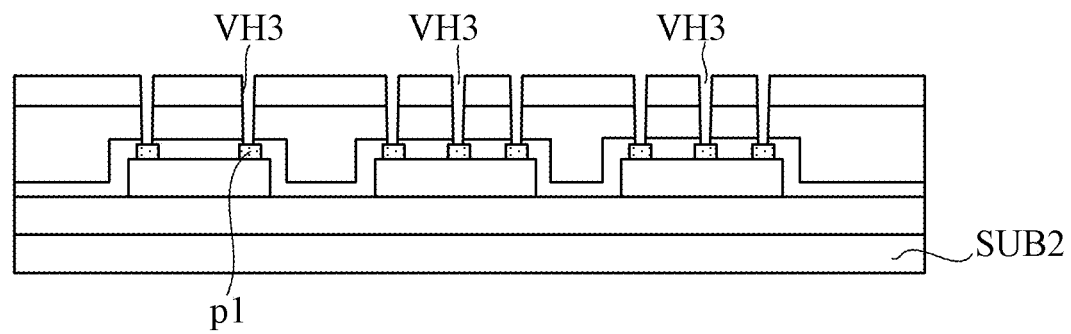

Referring to FIG. 12D, the base substrate (may be referred to as a backplane) on which the chip is formed is photographed, and positions of the terminals p1 of each driver chip CP1 and the LED chip CP3 arranged on the backplane are determined through the image recognition technology. According to a corresponding logic, a graphic file of holes in a terminal area (i.e., a pad area) is generated. Then, a photoresist is coated onto the backplane, and the photoresist is patterned by digital direct writing or a digital exposure machine according to the graphic file described above. Then, parts of the passivation layer PVX1, the planarization layer PLN1 and the passivation layer PVX2 that are not covered by the pattern of the photoresist are etched, so as to form via holes VH3 each exposing a part of one of the terminals p1 of the driver chip CP1 and the LED chip CP3. For example, EBL may be used for directly etching parts of the passivation layer PVX1, the planarization layer PLN1, and the passivation layer PVX2 above the terminals, so as to form the via holes VH3 each exposing a part of one of the terminals p1 of the driver chip CP1 and the LED chip CP3.

Figure 12E:
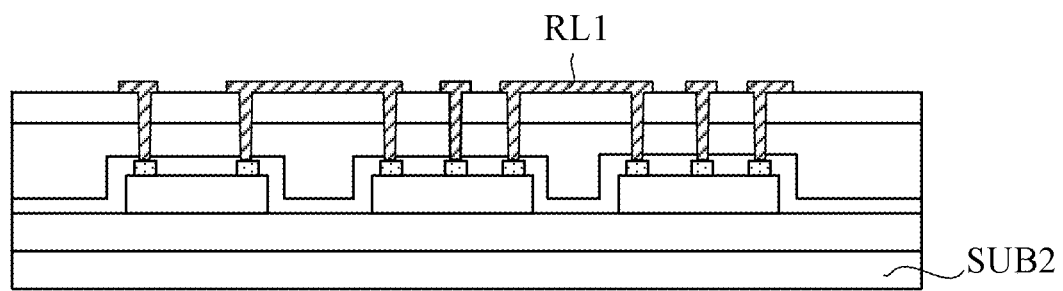

Referring to FIG. 12E, a terminal expansion layer RDL1 is prepared on a side of the passivation layer PVX2 away from the base substrate. Then, according to a connection relationship of each terminal, and based on the previously determined positions of the terminals p1 of the driver chip CP1 and the LED chip CP3, a graphic file of the terminal expansion layer RDL1 is automatically generated. The terminal expansion layer RDL1 is patterned by digital exposure or EBL, to form a plurality of expansion wires RL1. That is, through the post-alignment process, the expansion wires RL1 for electrically connecting respective chips are formed in the terminal expansion layer RDL1.

For example, the terminal expansion layer RDL1 may include a single film layer structure or a stack structure composed of a plurality of film layers. In a case that the terminal expansion layer RDL1 includes the single film layer structure, the terminal expansion layer RDL1 may include a metal material such as copper (Cu). In a case that the terminal expansion layer RDL1 includes the stack structure composed of the plurality of film layers, the terminal expansion layer RDL1 may include a material such as titanium-aluminum-titanium (Ti/Al/Ti) and molybdenum-aluminum-molybdenum (Mo/Al/Mo).

Figure 12F:
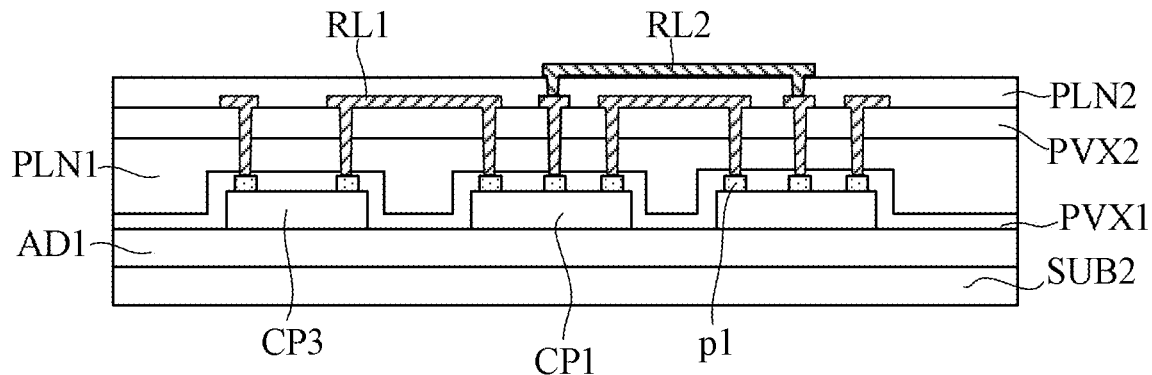

For example, referring to FIG. 12F, after the above-mentioned post-alignment process is completed, a redistribution layer RDL2 may be prepared according to requirements of wire interconnection.

For example, a cover layer PLN2 may be formed on a side of the terminal expansion layer RDL1 away from the base substrate. Then, the redistribution layer RDL2 is formed on a side of the cover layer PLN2 away from the base substrate.

For example, the redistribution layer RDL2 may be prepared through a conventional lithography process, so as to form a first wire RL2 for electrically connecting the respective chips, in the redistribution layer RDL2. The embodiments of the present disclosure are not limited thereto, and the redistribution layer RDL2 may also be prepared through a post-alignment process.

For example, the cover layer PLN2 may include silicon nitride, silicon oxide, or a stack structure composed of silicon nitride and silicon oxide, and may also include a polymer material for isolating and insulating the terminal expansion layer RDL1 and the redistribution layer RDL2.

For example, according to wiring requirements, a third wiring layer, a fourth wiring layer, and the like may also be prepared, and the embodiments of the present disclosure are not particularly limited herein.

Referring to FIG. 12F, the semiconductor apparatus according to some embodiments of the present disclosure may be a display apparatus, and the display apparatus may include: a base substrate SUB2; an adhesive layer AD1 arranged on the base substrate SUB2; a plurality of chips CP1 and CP3 arranged on a side of the adhesive layer AD1 away from the base substrate, in which each of the chips CP1 and chip CP3 may include at least one terminal p1; a passivation layer PVX1 arranged on a side of the chips CP1 and CP3 away from the base substrate; a planarization layer PLN1 arranged on a side of the passivation layer PVX1 away from the base substrate; a passivation layer PVX2 arranged on a side of the planarization layer PLN1 away from the base substrate; a terminal expansion layer RDL1 arranged on a side of the passivation layer PVX2 away from the base substrate; a cover layer PLN2 arranged on a side of the terminal expansion layer RDL1 away from the base substrate; and a redistribution layer RDL2 arranged on a side of the cover layer PLN2 away from the base substrate. A plurality of expansion wires RL1 are arranged in the terminal expansion layer RDL1, and a plurality of first wires RL2 are arranged in the redistribution layer RDL2.

For example, the plurality of chips CP1 and CP3 may be located in a same layer, that is, surfaces of the chips CP1 and CP3 facing the base substrate may be in contact with the adhesive layer AD1. Some terminals p1 of the chips CP1 and CP3 may be electrically connected through the plurality of expansion wires RL1. Some other terminals p1 of the chips CP1 and CP3 may be electrically connected through the plurality of first wires RL2.

FIGS. 13A to 13G each schematically illustrates a cross-sectional view of a structure formed after performing some steps in a method for manufacturing a display apparatus according to the exemplary embodiments of the present disclosure. In a case that a chip CP1 is relatively large, the method for manufacturing the display apparatus according to the exemplary embodiments of the present disclosure may include at least the following steps. It should be noted that, the case that the relatively large chip CP1 may include: a dimension of the chip CP1 is larger than a dimension of the LED chip, or in other words, a ratio between an area of an orthographic projection of the chip CP1 on the base substrate and an area of an orthographic projection of the LED chip on the base substrate is greater than 1.2.

Figure 13A:
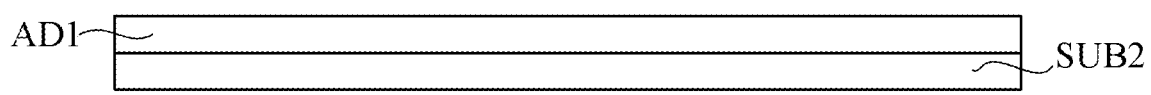
FIGS. 13A to 13G each schematically illustrates a cross-sectional view of a structure formed after performing some steps in a method for manufacturing a display apparatus according to the exemplary embodiments of the present disclosure.

Referring to FIG. 13A, an adhesive layer AD1 is coated on or attached to the base substrate SUB2.

Figure 13B:
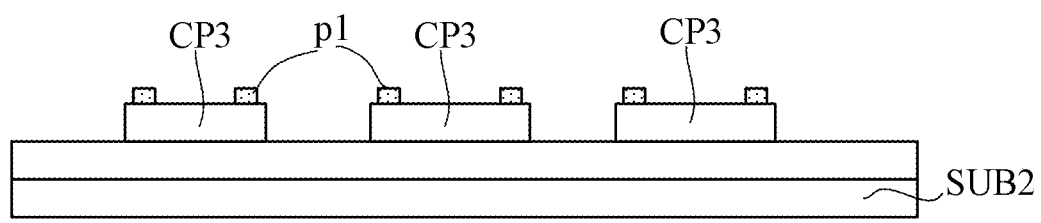

Referring to FIG. 13B, the LED chip CP3 is transferred to the base substrate SUB2 through SMT or the mass transfer process, and is fixed on the base substrate through the adhesive layer AD1.

For example, the terminal p1 of the LED chip CP3 may face upward, that is, may be on a side of the LED chip CP3 away from the base substrate.

Figure 13C:
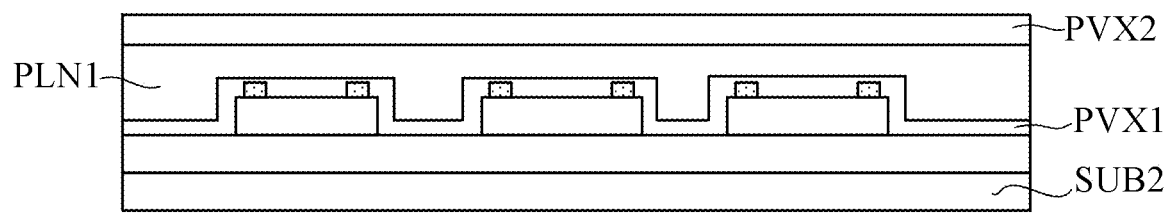

Referring to FIG. 13C, a passivation layer PVX1 is deposited on a side of the driver chip CP1 and the LED chip CP3 away from the base substrate, and a planarization layer PLN1 is coated on a side of the passivation layer PVX1 away from the base substrate.

In some embodiments, a passivation layer PVX2 may be prepared on a side of the planarization layer PLN1 away from the base substrate.

Figure 13D:
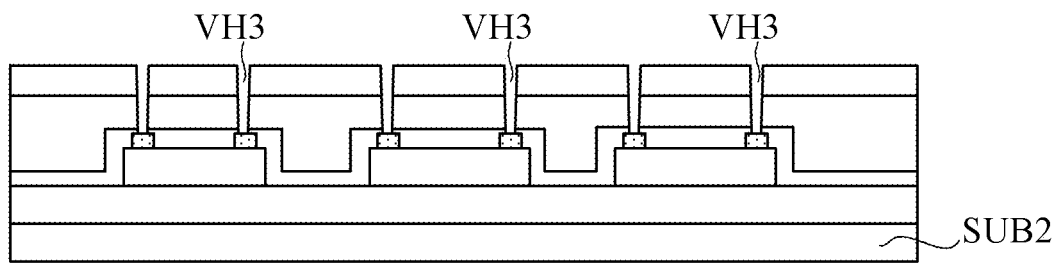

Referring to FIG. 13D, the base substrate (may be referred to as a backplane) with the chip formed thereon is photographed, and a position of the terminal p1 of each LED chip CP3 arranged on the backplane is determined by using the image recognition technology. According to a corresponding logic, a graphic file of a hole in a terminal area (i.e., a pad area) is generated. And then, a photoresist is coated onto the backplane, and the photoresist is patterned by digital direct writing or a digital exposure machine according to the graphic file. Then, parts of the passivation layer PVX1, the planarization layer PLN1 and the passivation layer PVX2 that are not covered by the pattern of the photoresist are etched, so as to form a via hole VH3 exposing part of the terminal p1 of each LED chip CP3. For example, EBL may be used for directly etching parts of the passivation layer PVX1, the planarization layer PLN1, and the passivation layer PVX2 above the terminals, to form the via hole VH3 exposing part of the terminal p1 of each LED chip CP3.

Figure 13E:
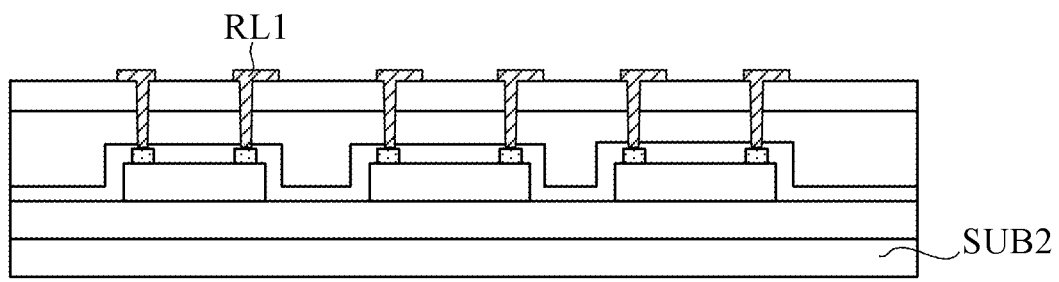

Referring to FIG. 13E, a terminal expansion layer RDL1 is prepared on a side of the passivation layer PVX2 away from the base substrate. Then, according to a connection relationship of each terminal, and based on the previously determined position of the terminal p1 of each LED chip CP3, a graphic file of the terminal expansion layer RDL1 is automatically generated. The terminal expansion layer RDL1 is patterned by digital exposure or EBL, to form a plurality of expansion wires RL1. That is, through the post-alignment process, the expansion wires RL1 for electrically connecting respective chips are formed in the terminal expansion layer RDL1.

Figure 13F:
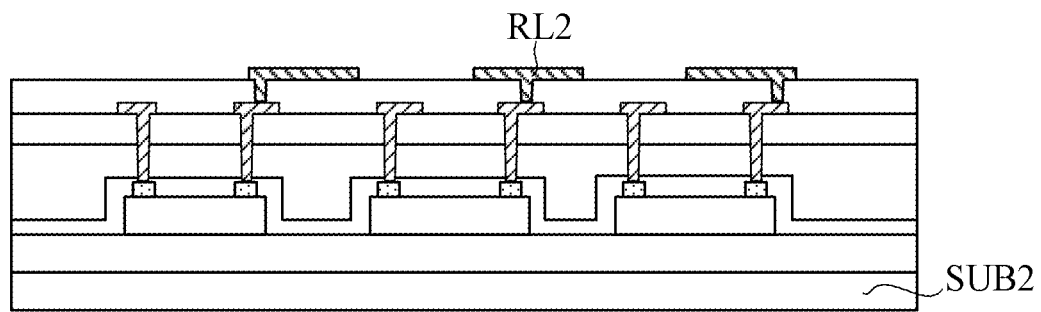

For example, referring to FIG. 13F, after the above-mentioned post-alignment process is completed, a redistribution layer RDL2 may be prepared according to requirements of wire interconnection.

For example, a cover layer PLN2 may be formed on a side of the terminal expansion layer RDL1 away from the base substrate. Then, the redistribution layer RDL2 is formed on a side of the cover layer PLN2 away from the base substrate.

For example, the redistribution layer RDL2 may be prepared through a conventional lithography process, to form a first wire RL2 for electrically connecting each chip in the redistribution layer RDL2. The embodiments of the present disclosure are not limited thereto, and the redistribution layer RDL2 may also be prepared through the post-alignment process.

For example, according to wiring requirements, a third wiring layer, a fourth wiring layer, and the like may also be prepared, and the embodiments of the present disclosure are not particularly limited herein.

Figure 13G:
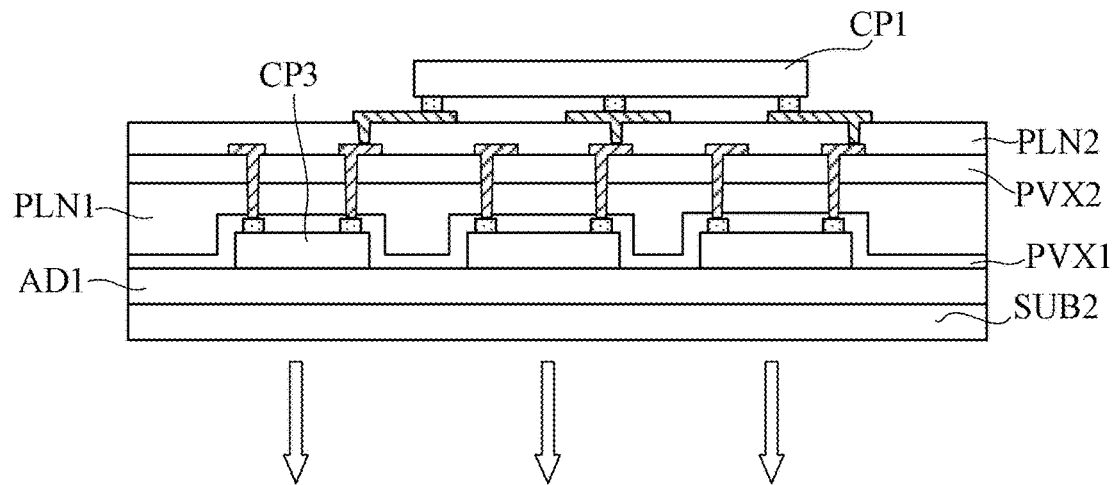

Referring to FIG. 13G, a driver chip CP1 is transferred to the base substrate SUB2 through SMT or the mass transfer process. For example, a terminal p1 of the driver chip CP1 may be electrically connected to the first wire RL2 located in the redistribution layer RDL2 through eutectic soldering, solder paste welding, conductive glue, etc., so that the electrical connection between the driver chip CP1 and the LED chip CP3 is realized.

Referring to FIG. 13G, the semiconductor apparatus according to some embodiments of the present disclosure may be a display apparatus, and the display apparatus may include: a base substrate SUB2; an adhesive layer AD1 arranged on the base substrate SUB2; a plurality of LED chips CP3 arranged on a side of the adhesive layer AD1 away from the base substrate, in which each LED chip CP3 may include at least one terminal p1; a passivation layer PVX1 arranged on a side of the plurality of LED chips CP3 away from the base substrate; a planarization layer PLN1 arranged on a side of the passivation layer PVX1 away from the base substrate; a passivation layer PVX2 arranged on a side of the planarization layer PLN1 away from the base substrate; a terminal expansion layer RDL1 arranged on a side of the passivation layer PVX2 away from the base substrate; a cover layer PLN2 arranged on a side of the terminal expansion layer RDL1 away from the base substrate; a redistribution layer RDL2 arranged on a side of the cover layer PLN2 away from the base substrate; and at least one chip CP1 arranged on a side of the redistribution layer RDL2 away from the base substrate. A plurality of expansion wires RL1 are arranged in the terminal expansion layer RDL1, and a plurality of first wires RL2 are arranged in the redistribution layer RDL2.

For example, the chip CP1 and the chip CP3 may be located in different layers. The plurality of LED chips CP3 may be located in a same layer, and each chip CP3 is in contact with the adhesive layer AD1. The driver chip CP1 may be located on a side of the plurality of LED chips CP3 away from the base substrate. The LED chip CP3 located in the lower layer is electrically connected to the driver chip CP1 located in the upper layer through the expansion wire RL1 and the first wire RL2.

Figure 14:
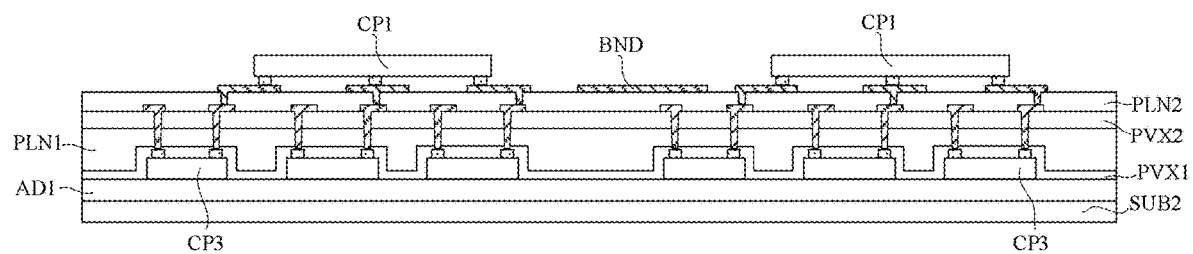
FIG. 14 schematically illustrates a cross-sectional view of a semiconductor apparatus (e.g., a display apparatus) according to some embodiments of the present disclosure, and the display apparatus may be a large-size display apparatus or a spliced display apparatus.

FIG. 14 schematically illustrates a cross-sectional view of a semiconductor apparatus (e.g., a display apparatus) according to some embodiments of the present disclosure, and the display apparatus may be a large-size display apparatus or a spliced display apparatus. With reference to FIGS. 13G and 14, a bonding region BND for electrically connecting a circuit board (for example, a flexible circuit board FPC) may be provided between two structures shown in FIG. 14. In the embodiments of the present disclosure, there is no need to punch or lead in the bonding region BND, and the bonding region BND is located on a back side of a light-emitting region of a LED, thereby facilitating seamless splicing display. In addition, there is no need to provide expansion wire region at an edge of the display apparatus, so that an edge dimension of the formed display apparatus is only related to a cutting process edge of the base substrate. For example, in a case of using a laser cutting process, a width of the laser cutting edge may be limited within 20 microns, and a width of a heat-affected region may be less than 50 microns. Therefore, a smaller bezel may be realized, and four sides of the display apparatus are of equal width, which may be conducive to the application of splicing display.

Referring back to FIG. 13G, a main light-emitting surface of the LED may face the base substrate SUB2, that is, the driver chip CP1 may be located on a back side of the light-emitting side of the LED, so that the driver chip CP1 may not occupy an area of the light-emitting region, that is, an orthographic projection of the driver chip CP1 on the base substrate SUB2 may at least partially overlap an orthographic projection of the LED chip CP3 on the base substrate SUB2. Therefore, a plurality of driver chips CP1 may be arranged at a relatively small interval, which is conducive to realize high-resolution display.

Figure 15:
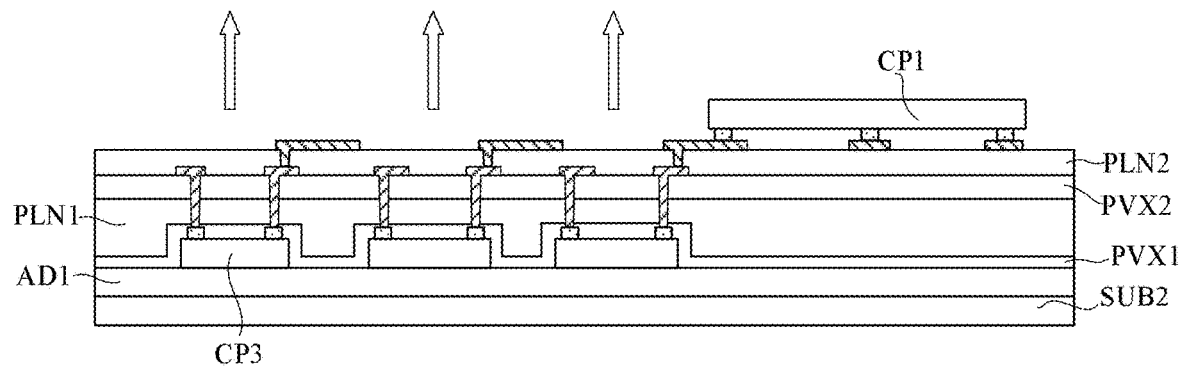
FIG. 15 schematically illustrates a cross-sectional view of a semiconductor apparatus (e.g., a display apparatus) according to some embodiments of the present disclosure, which schematically illustrates an upward light-emitting embodiment.

It should be noted that, the embodiments of the present disclosure are not limited to the implement of downward light-emitting. FIG. 15 schematically illustrates a cross-sectional view of a semiconductor apparatus (e.g., a display apparatus) according to some embodiments of the present disclosure, which schematically illustrates an upward light-emitting embodiment. Referring to FIG. 15, the LED chip CP3 may emit light upward, that is, the driver chip CP1 may be located on a light-emitting side of the LED. That is, an orthographic projection of the driver chip CP1 on the base substrate SUB2 and an orthographic projection of the LED chip CP3 on the base substrate SUB2 do not overlap.

Figure 16:
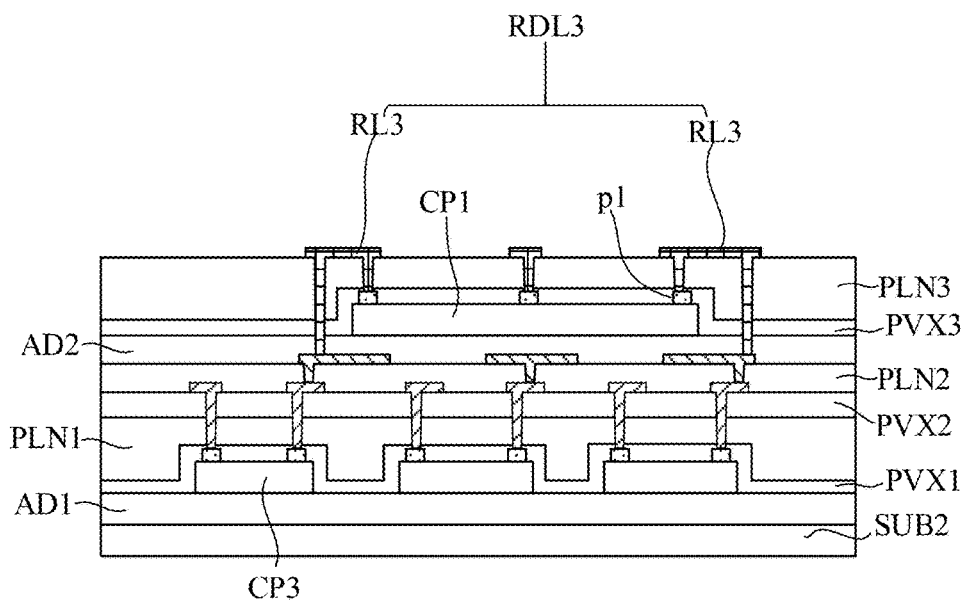
FIG. 16 schematically illustrates a cross-sectional view of a semiconductor apparatus (e.g., a display apparatus) according to some embodiments of the present disclosure.

FIG. 16 schematically illustrates a cross-sectional view of a semiconductor apparatus (e.g., a display apparatus) according to some embodiments of the present disclosure. Referring to FIGS. 13G and 16, the display apparatus may further include: an adhesive layer AD2 arranged on a side of the redistribution layer RDL2 away from the base substrate; a driver chip CP1 arranged on a side of the adhesive layer AD2 away from the base substrate; a passivation layer PVX3 arranged on a side of the driver chip CP1 away from the base substrate; a planarization layer PLN3 arranged on a side of the passivation layer PVX3 away from the base substrate; and a redistribution layer RDL3 arranged on a side of the planarization layer PLN3 away from the base substrate. A plurality of second wires RL3 may be arranged in the redistribution layer RDL3. A plurality of terminals p1 of the driver chip CP1 may face upward, that is, the terminals p1 face a side of the driver chip CP1 away from the base substrate. The driver chip CP1 is arranged on the adhesive layer AD2, which is conducive to the fixing of the driver chip CP1.

For example, a process for preparing the redistribution layer RDL3 and the second wire RL3 may be similar to the process for preparing the terminal expansion layer RDL1 and the expansion wire RL1, that is, the post-alignment process may also be used to prepare the redistribution layer RDL3 and the second wire RL3.

The driver chip CP1 may be electrically connected to the first wire RL2 through the second wire RL3, the first wire RL2 is electrically connected to the expansion wire RL1, and the expansion wire RL1 is electrically connected to the terminal p1 of the LED chip CP3. In this way, the electrical connection between the driver chip CP1 and the LED chip CP3 may be realized.

Hereinafter, taking a display apparatus as an example, some exemplary embodiments of the present disclosure are further described in detail.

FIGS. 17A to 17I each schematically illustrates a cross-sectional view of a structure formed after performing some steps in a method for manufacturing a display apparatus according to the exemplary embodiments of the present disclosure.

Figure 17A:
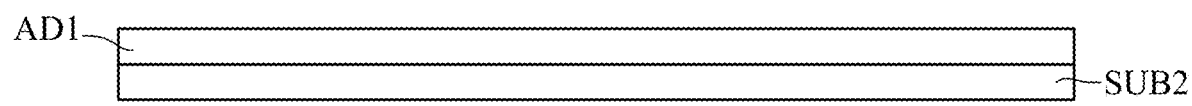
FIGS. 17A to 17I each schematically illustrates a cross-sectional view of a structure formed after performing some steps in a method for manufacturing a display apparatus according to the exemplary embodiments of the present disclosure.
Figure 17B:
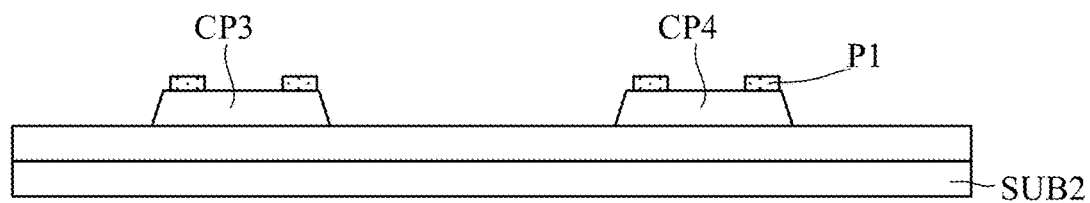

Referring to FIGS. 17A and 17B, an adhesive layer AD1 is coated on or attached to a base substrate SUB2. For example, the base substrate SUB2 may be a glass base substrate, a polyimide (i.e., PI) base substrate, or a quartz base substrate. The adhesive layer AD1 may include laser dissociation glue, temperature change dissociation glue, UV dissociation glue, etc. In this way, the adhesive layer AD1 may be peeled off through a specific mean in a subsequent process, to remove the base substrate SUB2.

For example, in the embodiments of the present disclosure, a material of the base substrate may include, but is not limited to, glass, quartz, plastic, silicon, polyimide, etc. The terminal may have a columnar structure. A material of the terminal may include a conductive material, such as a metal material, etc., For example, the material of the terminal may be at least one or a combination of at least two selected from a group consisting of gold, silver, copper, aluminum, molybdenum, gold alloy, silver alloy, copper alloy, aluminum alloy, molybdenum alloy, etc., which is not limited in the embodiments of the present disclosure.

Then, the LED chip CP3 and/or the functional element CP4 are transferred to the base substrate SUB2 through SMT or the mass transfer process, and are fixed on the base substrate through the adhesive layer AD1.

For example, the LED chip CP3 and the functional element CP4 may be located on the adhesive layer AD1, and terminals p1 of the LED chip CP3 and the functional element CP4 may face upward, that is, located on a side of the chips away from the base substrate. For example, the functional element CP4 may be the microchip described above, which is used to implement a specific function, including but not limited to, a control chip, a memory chip, a logic operation chip, a sensor chip, and the like.

Figure 17C:
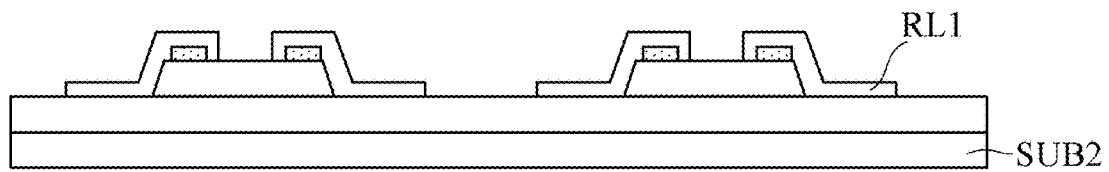

Referring to FIGS. 17B and 17C, the base substrate (which may be referred to as a backplane) provided with the LED chip CP3 and the functional element CP4 is photographed, and a coordinate and an area of a terminal p1 of each of the LED chip CP3 and the functional element CP4 arranged on the backplane are determined through the image recognition technology, so as to generate a graphic file of a terminal area (that is, a pad area). Next, a metal layer is deposited on the backplane, a photoresist is coated on the metal layer, and the photoresist is patterned by digital direct writing or a digital exposure machine according to the above-mentioned graphic file. Then, based on the patterned photoresist, the metal layer is etched to form a terminal expansion layer RDL1. A plurality of expansion wires RL1 are formed in the terminal expansion layer RDL1, and the plurality of expansion wires RL1 may be electrically connected to the terminals p1 of the LED chip CP3 and the functional element CP4, respectively, so as to lead out respective terminals p1. That is, through the post-alignment process, the plurality of expansion wires RL1 used for electrically connecting the respective chips are formed in the terminal expansion layer RDL1.

For example, the terminal expansion layer RDL1 may include a single film layer structure or a stack structure composed of a plurality of film layers. In a case that the terminal expansion layer RDL1 includes the single film layer structure, the terminal expansion layer RDL1 may include a metal material such as copper (Cu). In a case that the terminal expansion layer RDL1 includes the stack structure composed of the plurality of film layers, the terminal expansion layer RDL1 may include a material such as titanium-aluminum-titanium (Ti/Al/Ti), molybdenum-aluminum-molybdenum (Mo/Al/Mo).

Figure 17D:
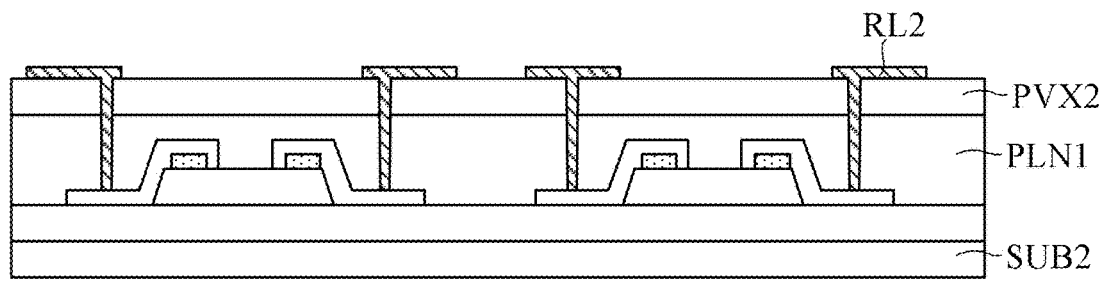

Referring to FIG. 17D, a planarization layer PLN1 is coated on a side of the terminal expansion layer RDL1 away from the base substrate.

For example, the planarization layer PLN1 may include a resin material for filling a segment gap between the LED chip CP3 and the functional element CP4, so as to achieve planarization.

For example, a passivation layer PVX2 may be prepared on a side of the planarization layer PLN1 away from the base substrate. For example, the passivation layer PVX2 may include a material such as silicon nitride, for isolating water vapor in the planarization layer PLN1, so as to prevent the water vapor in the planarization layer PLN1 from corroding the upper terminal expansion layer.

With reference to FIG. 17D, a via hole passing through the planarization layer PLN1 and the passivation layer PVX2 may be formed to expose at least a part of each expansion wire RL1. Then, a metal layer is deposited on a side of the passivation layer PVX2 away from the base substrate, and a redistribution layer RDL2 is formed through a patterning process including photoresist coating, exposure, development, etching, etc. For example, a plurality of first wires RL2 are formed in the redistribution layer RDL2. Each of the plurality of first wires RL2 may be electrically connected to each of the plurality of expansion wires RL1 through the above-mentioned via hole, so as to lead out each terminal p1.

Figure 17E:
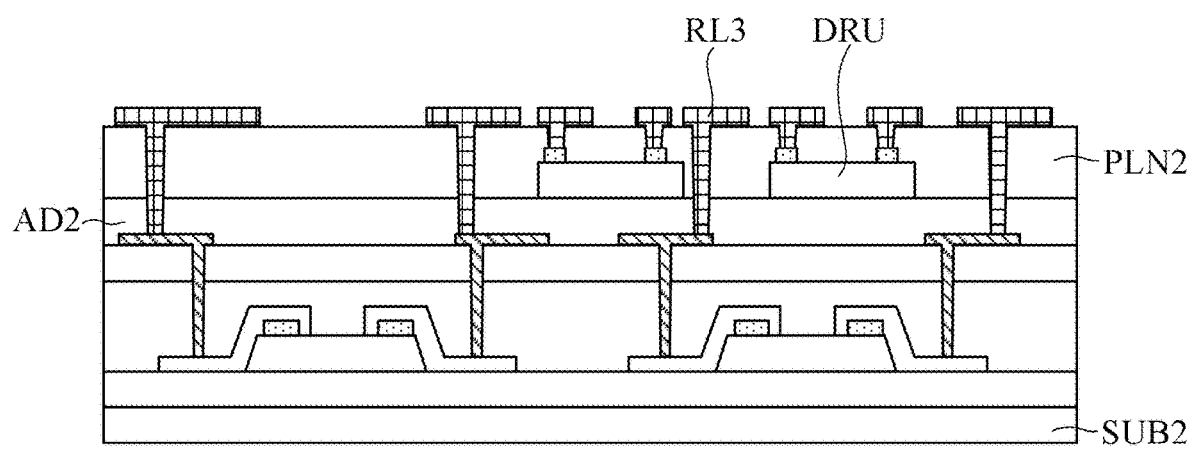

According to FIG. 17E, an adhesive layer AD2 is formed on a side of the redistribution layer RDL2 away from the base substrate. Next, a driving element DRU is formed on a side of the adhesive layer AD2 away from the base substrate. The driving element DRU may be fixed on the base substrate through the adhesive layer AD2.

For example, the driving element DRU may include a driver chip CP1, and the driver chip CP1 may be transferred to the base substrate SUB2 through SMT or the mass transfer process, and may be fixed on the base substrate SUB2 through the adhesive layer AD2. For another example, the driving element DRU may include an electronic element such as a thin film transistor, that is, a plurality of thin film transistors may be formed on the base substrate SUB2 through a process of preparing a TFT.

Next, a planarization layer PLN2 is formed on a side of the driving element DRU away from the base substrate. For example, the planarization layer PLN2 may include a resin material, which is used to fill a segment gap between the driving elements DRU, so as to achieve planarization.

Then, a via hole passing through the planarization layer PLN2 and the adhesive layer AD2 may be formed to expose at least a part of each first wire RL2. A metal layer is deposited on a side of the planarization layer PLN2 away from the base substrate, and a redistribution layer RDL3 is formed through a patterning process including photoresist coating, exposure, development, etching, etc. For example, a plurality of second wires RL3 are formed in the redistribution layer RDL3. The plurality of second wires RL3 may be electrically connected to the plurality of first wires RL2 through the above-mentioned via holes, respectively, so as to lead out respective terminals p1, and electrically connect the driving element DRU and each LED chip CP3 and each functional element CP4.

Figure 17F:
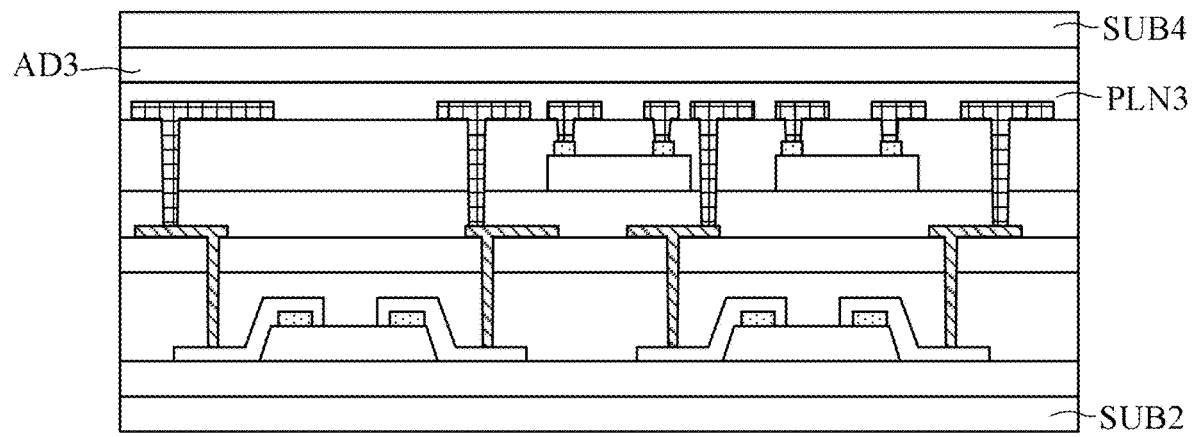

Referring to FIG. 17F, a planarization layer PLN3 is formed on a side of the redistribution layer RDL3 away from the base substrate. Then, a base substrate SUB4 is attached to a surface of the planarization layer PLN3 away from the base substrate SUB2 through the adhesive layer AD3.

Figure 17G:
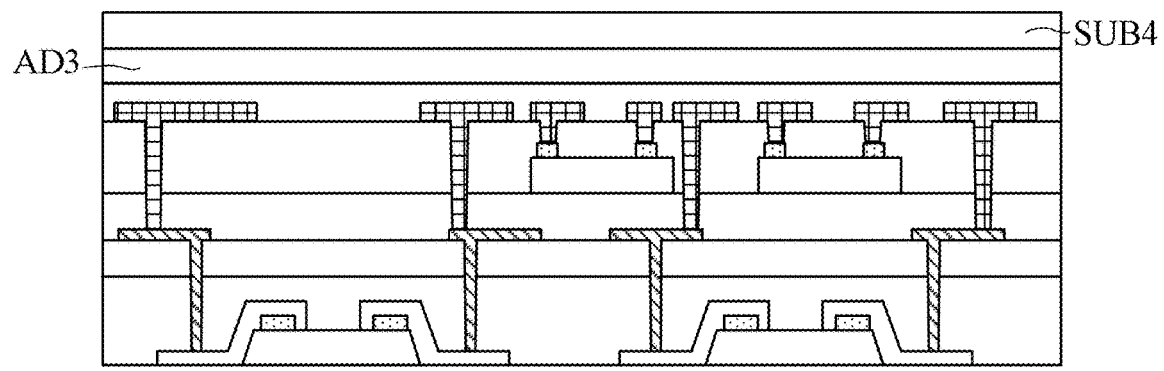

Referring to FIG. 17G, the base substrate SUB2 is separated from the devices formed thereon through laser dissociation, temperature dissociation, UV dissociation or the like.

Figure 17H:
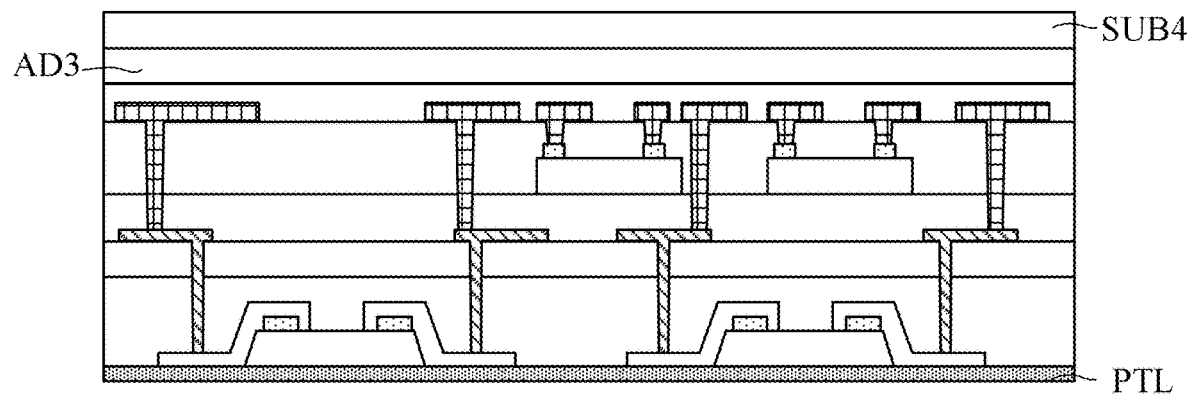

Referring to FIG. 17H, a protective layer PTL is coated on a side of each LED chip CP3 and each functional element CP4 away from the base substrate SUB4.

Figure 17I:
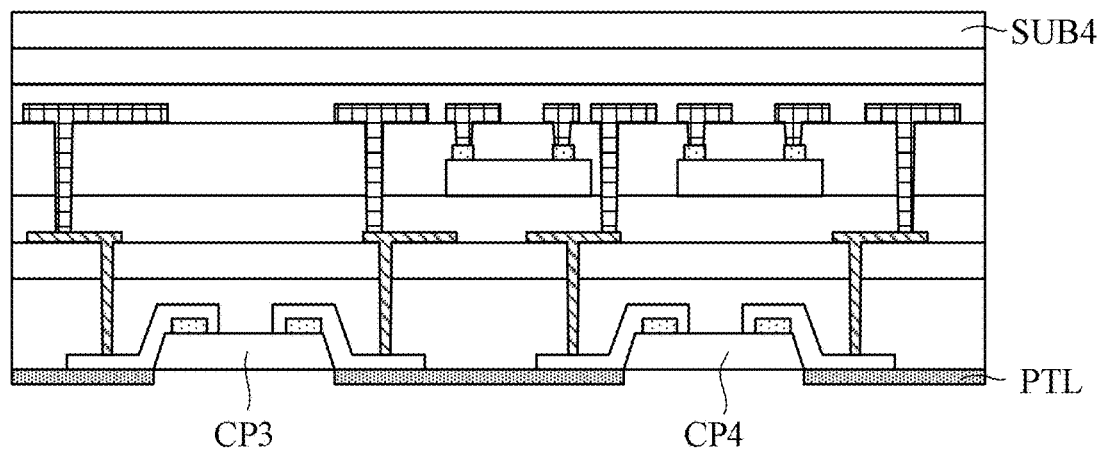

Referring to FIG. 17I, a patterning process is performed on the protective layer PTL to expose surfaces of each LED chip CP3 and each functional element CP4 close to the protective layer PTL. In this way, the protective layer PTL may protect, for example, a metal layer of the expansion wire RL1, so that the metal layer may not be exposed to the air, while a main light-emitting surface of each LED chip CP3 and a functional surface of each functional element CP4 may be exposed, which is conducive to light emission and realization of their respective functions.

It should be noted that, in the embodiments of the present disclosure, it is optional that the patterning process is performed on the protective layer PTL. For example, in some embodiments, surfaces of at least some of the chips or the functional elements facing the protective layer PTL may not be exposed. In this case, it is not necessary to perform the patterning process on parts of the protective layer PTL corresponding to these chips or functional elements.

For example, the protective layer PTL may include an insulating layer for insulation.

In the above-mentioned embodiments, the terminals p1 of each chip is located on a same surface of the chip. For example, the LED chip CP3 includes at least two terminals p1, which are both located on a surface of the LED chip CP3 away from the light-emitting surface, that is, on a back surface of the light-emitting side. However, the embodiments of the present disclosure are not limited to such a terminal arrangement.

Figure 18:
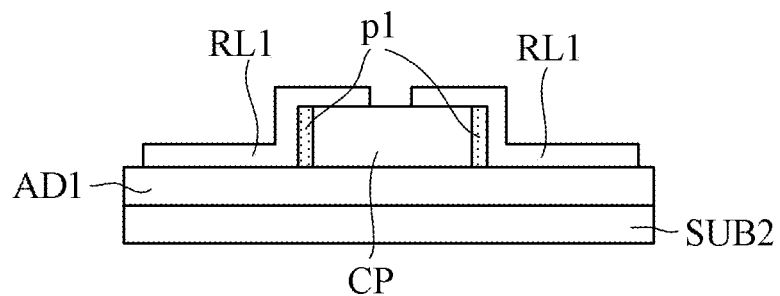
FIG. 18 schematically illustrates a cross-sectional view of a semiconductor apparatus according to some embodiments of the present disclosure, in which terminals of a chip are on two opposite sides of the chip.

FIG. 18 schematically illustrates a cross-sectional view of a semiconductor apparatus according to some embodiments of the present disclosure, in which terminals of a chip are on two opposite sides of the chip. Referring to FIG. 18, a chip CP includes at least two terminals p1, and the at least two terminals p1 are located on two opposite sides of the chip CP, respectively. The chip CP includes a surface facing a base substrate SUB2 (i.e., a lower surface in FIG. 18), and the two opposite sides of the chip CP are respectively located on both sides of the lower surface. For example, the chip CP shown in FIG. 18 may be the LED chip CP3 and/or functional element CP4 described above.

In the embodiments shown in FIG. 18, an expansion wire RL1 located in a terminal expansion layer RDL1 may also be electrically connected to the at least two terminals p1, so as to lead out the terminals p1 of the chip.

FIGS. 19A to 19H each schematically illustrates a cross-sectional view of a structure formed after performing some steps in a method for manufacturing a display apparatus according to the exemplary embodiments of the present disclosure, in which terminals of a chip are located on an upper surface and a lower surface of the chip.

Figure 19A:
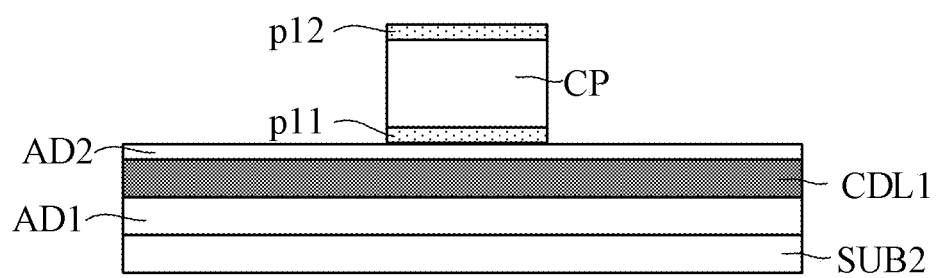
FIGS. 19A to 19H each schematically illustrates a cross-sectional view of a structure formed after performing some steps in a method for manufacturing a display apparatus according to the exemplary embodiments of the present disclosure, in which terminals of a chip are located on an upper surface and a lower surface of the chip.

Referring to FIG. 19A, an adhesive layer AD1 is coated on or attached to a base substrate SUB2. For example, the base substrate SUB2 may be a glass base substrate, a polyimide (i.e., PI) base substrate, or a quartz base substrate. The adhesive layer AD1 may include laser dissociation glue, temperature change dissociation glue, UV dissociation glue, etc. In this way, the adhesive layer AD1 may be peeled off through a special mean in a subsequent process, to remove the base substrate SUB2.

Next, a conductive layer CDL1 is formed on a side of the adhesive layer AD1 away from the base substrate. For example, the conductive layer CDL1 may include a conductive material such as a metal, a conductive oxide.

An adhesive layer AD2 is formed on a side of the conductive layer CDL1 away from the base substrate. For example, the adhesive layer AD2 may have a property of stickiness, and can be evaporated by heating and refluxing. For example, the adhesive layer AD2 may include a solder resist.

Then, a chip CP (for example, a LED chip CP3 and/or a functional element CP4) is transferred to a base substrate SUB2 through SMT or the mass transfer process. As shown in FIG. 19A, the chip CP has terminals on both a surface close to the base substrate SUB2 (i.e., the lower surface in the figure) and a surface away from the base substrate SUB2 (i.e., the upper surface in the figure). For ease of description, a terminal located on the lower surface is referred to as terminal p11, and a terminal located on the upper surface is referred to as terminal p12.

Figure 19B:
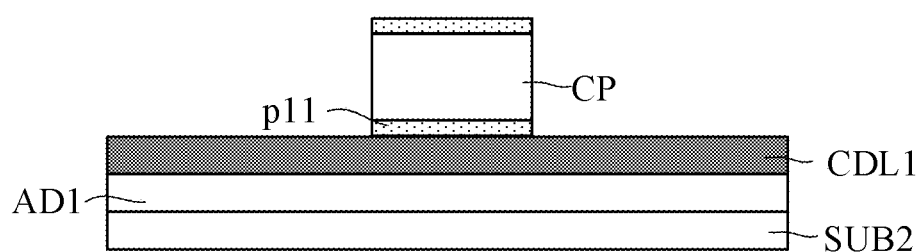

Referring to FIG. 19B, by heating and refluxing, the adhesive layer AD2 is evaporated, so that the terminal p11 may be electrically connected to the conductive layer ADL1. In this way, the chip CP and the conductive layer ADL1 underneath may achieve good conduction.

Figure 19C:
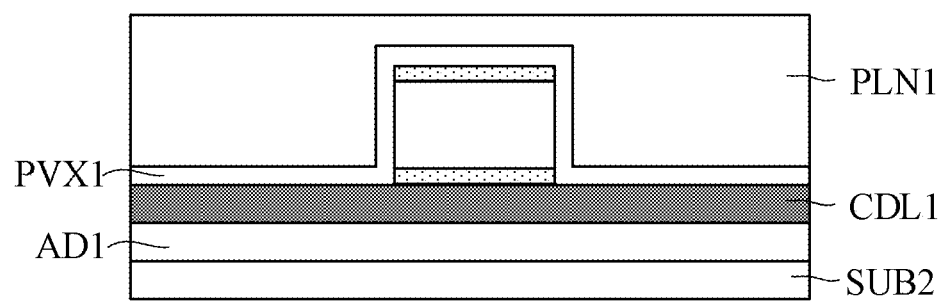

Referring to FIG. 19C, a passivation layer PVX1 is formed on a side of the chip CP away from the base substrate, and a planarization layer PLN1 is formed on a side of the passivation layer PVX1 away from the base substrate.

Figure 19D:
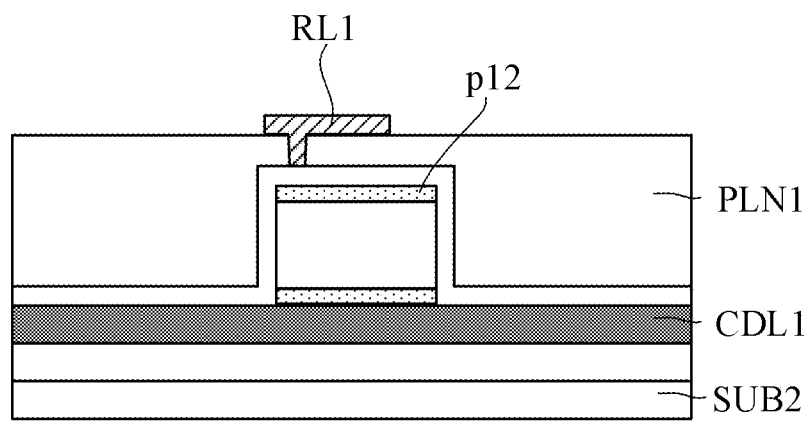

Referring to FIGS. 19C and 19D, the base substrate (which may be referred to as a backplane) provided with the chip CP is photographed, and a coordinate and an area of a terminal p12 of each chip CP arranged on the backplane are determined through the image recognition technology, so as to generate a graphic file of a terminal area (that is, a pad area). Next, a metal layer is deposited on the backplane, a photoresist is coated on the metal layer, and the photoresist is patterned by digital direct writing or a digital exposure machine according to the above-mentioned graphic file. Then, according to the patterned photoresist, the metal layer is etched to form a terminal expansion layer RDL1. A plurality of expansion wires RL1 are formed in the terminal expansion layer RDL1, and one of the plurality of expansion wires RL1 may be electrically connected to the terminal p12 of each chip CP through a via hole, so as to lead out the terminal p12. That is, through the post-alignment process, the plurality of expansion wires RL1 for electrically connecting respective chips are formed in the terminal expansion layer RDL1.

Figure 19E:
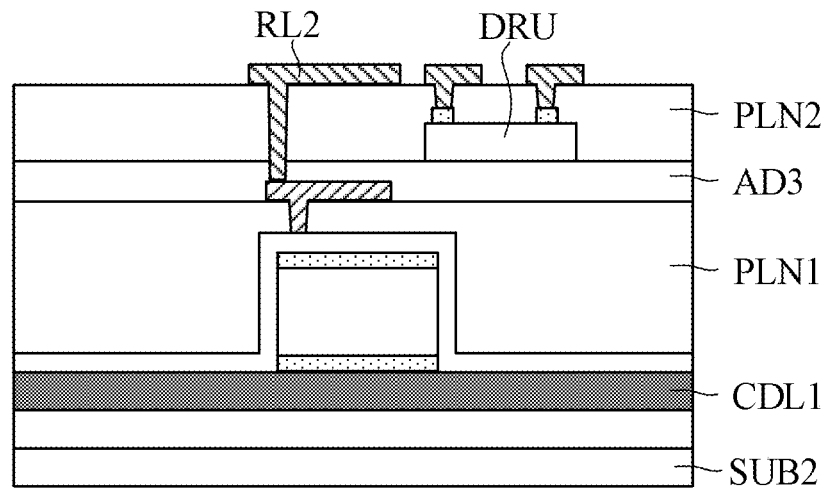

Referring to FIG. 19E, an adhesive layer AD3 is formed on a side of the terminal expansion layer RDL1 away from the base substrate. Next, a driving element DRU is formed on a side of the adhesive layer AD3 away from the base substrate. The driving element DRU may be fixed on the base substrate through the adhesive layer AD3.

Next, a planarization layer PLN2 is formed on a side of the driving element DRU away from the base substrate.

Then, a via hole passing through the planarization layer PLN2 and/or the adhesive layer AD3 may be formed to expose at least a part of a terminal of the driving element DRU and each expansion wire RL1. A metal layer is deposited on a side of the planarization layer PLN2 away from the base substrate, and a redistribution layer RDL2 is formed through a patterning process including photoresist coating, exposure, development, etching, etc. For example, a plurality of first wires RL2 are formed in the redistribution layer RDL2. Each of the plurality of first wires RL2 may be electrically connected to one of the plurality of expansion wires RL1 through the above-mentioned via hole, so as to lead out the terminal p12, and electrically connect the driving element DRU and each chip CP.

Figure 19F:
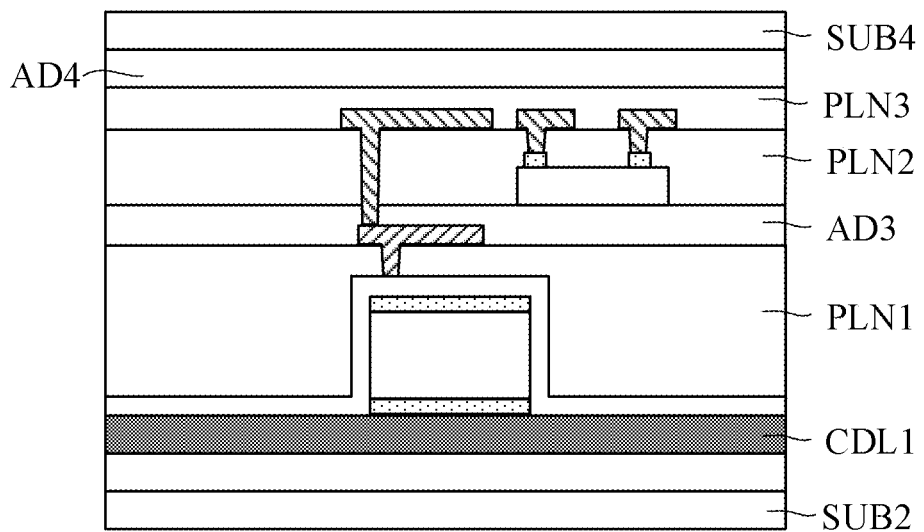

Referring to FIG. 19F, a planarization layer PLN3 is formed on a side of the redistribution layer RDL2 away from the base substrate. Then, a base substrate SUB4 is attached to a surface of the planarization layer PLN3 away from the base substrate SUB2 through an adhesive layer AD4.

Figure 19G:
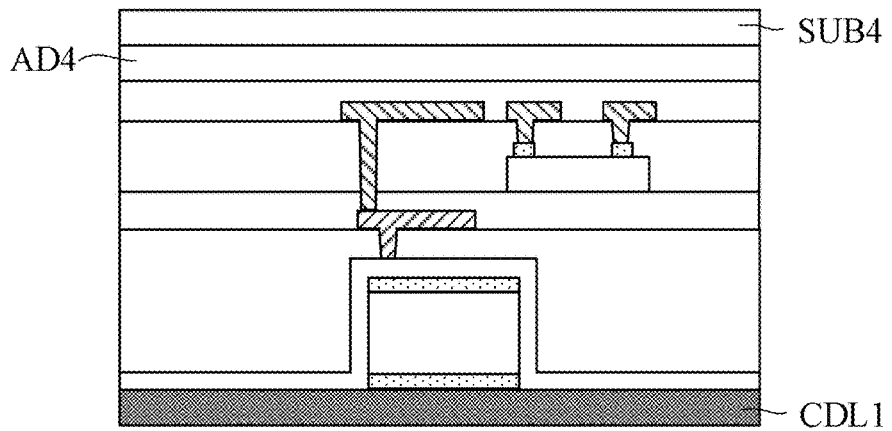

Referring to FIG. 19G, the base substrate SUB2 is separated from the devices formed thereon through laser dissociation, temperature dissociation, UV dissociation or the like.

Figure 19H:
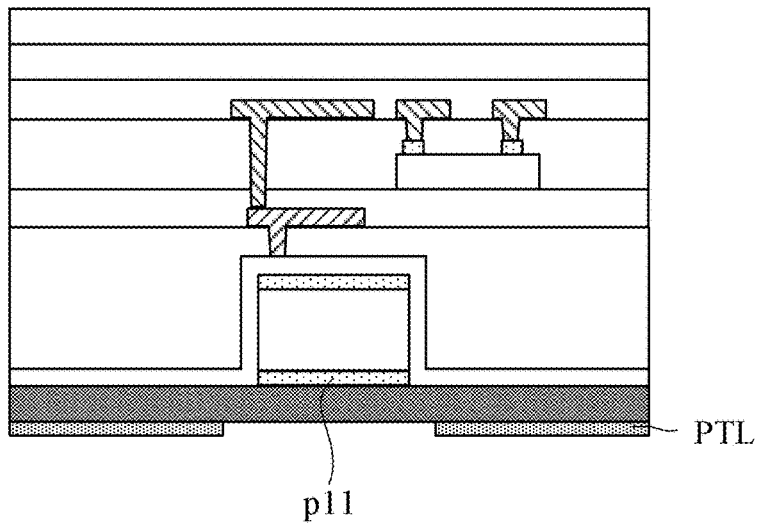

Referring to FIG. 19H, a protective layer PTL is coated on a side of the conductive layer CDL1 away from the base substrate SUB4. Then, a patterning process is performed on the protection layer PTL to expose a surface of a part of the conductive layer CDL1 (for example, a part corresponding to each chip CP) close to the protection layer PTL. In this way, the terminal p11 of the chip CP may be lead out through the exposed part of the conductive layer CDL1.

Hereinafter, some exemplary embodiments of the present disclosure will be described in detail, by further taking the semiconductor apparatus as a display apparatus and a driving element of the display apparatus including a TFT driving circuit as an example.

FIGS. 20A to 20F each schematically illustrates a cross-sectional view of a structure formed after performing some steps in a method for manufacturing a display apparatus according to the exemplary embodiments of the present disclosure, in which a driving element of the display apparatus includes a TFT driving circuit, and the method is realized through the chip first process.

Figure 20A:
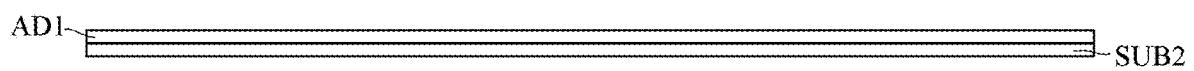
FIGS. 20A to 20F each schematically illustrates a cross-sectional view of a structure formed after performing some steps in a method for manufacturing a display apparatus according to the exemplary embodiments of the present disclosure, in which a driving element of the display apparatus includes a TFT driving circuit, and the method is realized through the chip first process.

Referring to FIG. 20A, an adhesive layer AD1 is coated on or attached to a base substrate SUB2. For example, the base substrate SUB2 may be a glass base substrate, a polyimide (i.e., PI) base substrate, or a quartz base substrate. The adhesive layer AD1 may include laser dissociation glue, temperature change dissociation glue, UV dissociation glue, etc. In this way, the adhesive layer AD1 may be peeled off through a specific mean in a subsequent process, to remove the base substrate SUB2.

Figure 20B:
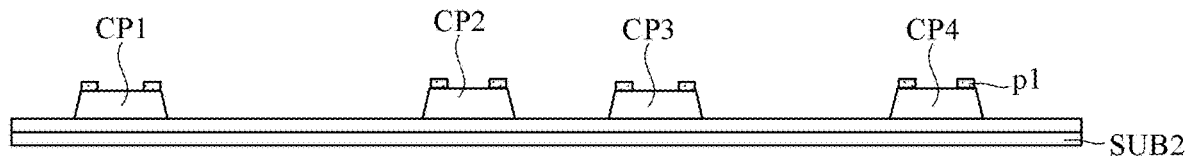

Referring to FIG. 20B, a plurality of chips CP are transferred to the base substrate SUB2 through SMT or the mass transfer process, and are fixed on the base substrate through the adhesive layer AD1. For example, the plurality of chips CP may include, but are not limited to, a LED chip, a driver chip, a memory chip, a control chip, a digital-to-analog conversion chip, an information processing chip, a sensor chip, and the like. For example, the LED chip may be a LED chip with a sapphire base substrate removed, and the driver chip, memory chip, control chip, digital-to-analog conversion chip, information processing chip and sensor chip may be Si-based chips, which may be bare chips without encapsulation structures, and heights of the chips may be less than 100 microns.

In the embodiment of FIG. 20B, four chips are schematically shown. For ease of description, the four chips are referred as chips CP1, CP2, CP3, and CP4, respectively. For example, the chip CP1 may be a control chip, and the chip CP2 may be a memory chip, the chip CP3 may be an LED chip, and the chip CP4 may be a sensor chip. It should be understood that the embodiments of the present disclosure are not limited to the arrangement shown in FIG. 20B.

For example, the chips CP1, CP2, CP3, and CP4 may be located on the adhesive layer AD1, and the terminal p1 of each chip CP1, CP2, CP3, CP4 may face upward, that is, located on a side of the chips away from the base substrate.

Figure 20C:
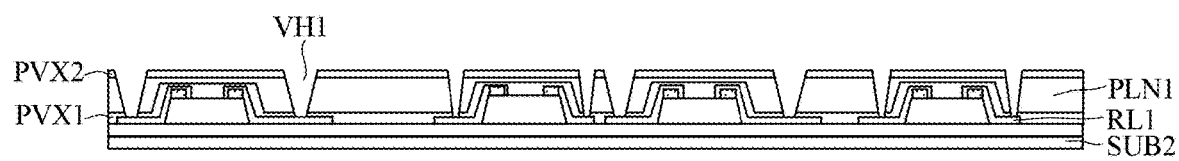

Referring to FIG. 20C, the base substrate (which may be referred to as a backplane) provided with the chips CP1, CP2, CP3, and CP4 is photographed, and a coordinate and an area of the terminal p1 of each of chips CP1, CP2, CP3, and CP4 arranged on the backplane are determined using the image recognition technology, so as to generate a graphic file of a terminal area (i.e., a pad area). Next, a, a metal layer is deposited on the backplane, a photoresist is coated on the metal layer, and the photoresist is patterned by digital direct writing or a digital exposure machine according to the above-mentioned graphic file. Then, according to the patterned photoresist, the metal layer is etched to form a terminal expansion layer RDL1. A plurality of expansion wires RL1 are formed in the terminal expansion layer RDL1, and the plurality of expansion wires RL1 may be electrically connected to terminals p1 of the chips CP1, CP2, CP3, and CP4, respectively, so as to lead out respective terminals p1. That is, through the post-alignment process, the expansion wires RL1 for electrically connecting respective chips are formed in the terminal expansion layer RDL1.

With reference to FIG. 20C, a planarization layer PLN1 is coated on a side of the terminal expansion layer RDL1 away from the base substrate.

For example, a passivation layer PVX1 may be prepared on a side of the planarization layer PLN1 close to the base substrate, and a passivation layer PVX2 may be prepared on a side of the planarization layer PLN1 away from the base substrate. For example, the passivation layer PVX1 and the passivation layer PVX2 may include a material such as silicon nitride and silicon oxide, for isolating water vapor in the planarization layer PLN1, so as to prevent water vapor in the planarization layer PLN1 from corroding the terminal expansion layer.

With reference to FIG. 20C, a via hole VH1 passing through the passivation layer PVX1, the planarization layer PLN1 and the passivation layer PVX2 may be formed, to expose at least part of each expansion wire RL1.

In some embodiments of the present disclosure, the planarization layer PLN1 may include a resin material such as polyimide (i.e., PI), for filling segment gaps among the respective chips CP1, CP2, CP3, and CP4, to achieve planarization.

In some embodiments of the present disclosure, the planarization layer PLN1 may include a low-temperature curable planarization material such as an acrylic resin material. The cost of the low-temperature curable planarization material is lower than that of a polyimide-based material, which is conducive to the reduction of the product cost.

It should also be noted that, after transferring the chip is complete, the low-temperature curable planarization material is used, and then a low-temperature oxide TFT process may be used, or other low-temperature-fabricated semiconductor apparatus may be used, to complete the fabrication of a TFT device. For example, a curing temperature of the low-temperature curable planarization material may be less than 250° C. Accordingly, the TFT device may be prepared below 250° C. during the process for manufacturing the TFT. In this way, it is possible to reduce the risk of damage to the performance of the microchip caused by high temperature during the process for manufacturing the TFT.

For example, a thickness of the planarization layer PLN1 is greater than a maximum height of the respective chips CP1, CP2, CP3, and CP4 by 10 micrometers or more.

Figure 20D:
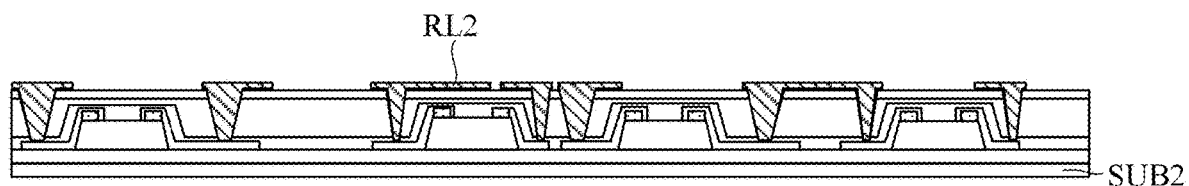

Referring to FIG. 20D, a metal layer is deposited on a side of the passivation layer PVX2 away from the base substrate, and the redistribution layer RDL2 is formed through a patterning process including photoresist coating, exposure, development, etching, etc. For example, a plurality of first wires RL2 are formed in the redistribution layer RDL2. The plurality of first wires RL2 may be electrically connected to the plurality of expansion wires RL1 through the above-mentioned via holes, respectively, so as to lead out respective terminals p1.

Figure 26A:
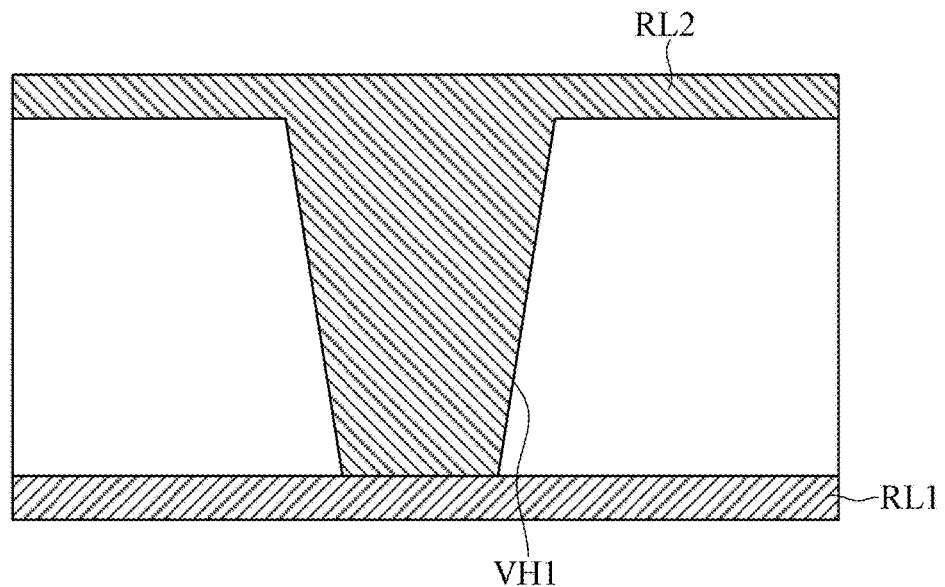
FIGS. 26A and 26B each schematically illustrates a cross-sectional view of a via hole of a display apparatus according to the exemplary embodiments of the present disclosure.
Figure 26B:
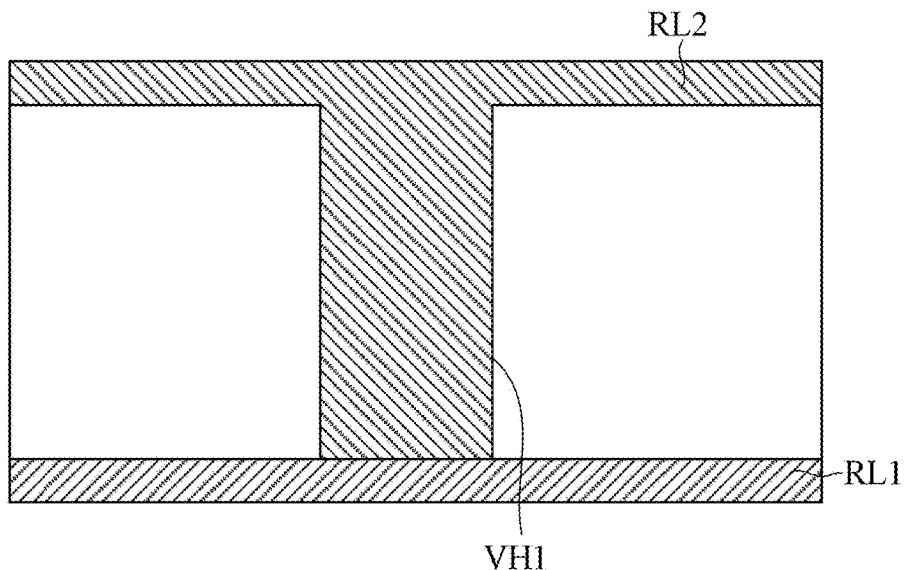

FIGS. 26A and 26B each schematically illustrates a cross-sectional view of a via hole of a display apparatus according to the exemplary embodiments of the present disclosure.

In a process of forming the redistribution layer RDL2, a part of the metal layer may be deposited in a via hole VH1, so that the plurality of first wires RL2 in the redistribution layer RDL2 may be electrically connected to the plurality of expansion wires RL1 in the terminal expansion layer RDL1 through via holes VH1, respectively. In this case, an insulating layer between the terminal expansion layer RDL1 and the redistribution layer RDL2 may be formed using a conventional organic material. Referring to FIG. 26A, the via hole VH1 shown in the cross-sectional view has a shape of inverted trapezoid, which facilitates the deposition of a part of the metal layer in the via hole VH1.

For example, in some embodiments of the present disclosure, the terminal expansion layer RDL1 may be used as a seed layer, to plate the metal layer (for example, a copper layer) by electrochemical plating or Electroless plating. As such, a metal layer with a same thickness as a combination of the passivation layer PVX1, the planarization layer PLN1 and the passivation layer PVX2 may be grown, to fill the via hole VH1, so that the plurality of first wires RL2 in the redistribution layer RDL2 may be electrically connected to the plurality of expansion wires RL1 in the terminal expansion layer RDL1 through the via holes VH1, respectively.

In this case, a high-temperature resistant organic material may be used to form an insulating layer between the terminal expansion layer RDL1 and the redistribution layer RDL2. On this basis, a relatively vertical via hole may be formed in a way of forming a hard mask layer, then exposing and developing, then dry etching, then removing the hard mask layer. Referring to FIG. 26B, the via hole VH1 shown in the cross-sectional view may have a shape of rectangle. That is, an area of an opening of the via hole VH1 on a side close to the terminal expansion layer RDL1 is substantially equal to an area of an opening of the via hole VH1 on a side close to the redistribution layer RDL2. Therefore, in this embodiment, the requirement on a profile of the via hole is relatively low, and a via hole with an opening dimension of less than 10 microns may be formed, which is conducive to improve PPI of the display apparatus.

It should be noted that, according to a circuit logic design requirement, the number of wiring layers may also be increased. For example, redistribution layers RDL3 and RDL4 may be further formed on a side of the redistribution layer RDL2 away from the base substrate, and an insulating layer may be used for isolation and insulation between two adjacent wiring layers.

In this way, the backplane including the respective chips CP1, CP2, CP3, CP4 and the terminal expansion layer is formed, and then the driving element including a TFT driving circuit may be formed on the backplane. That is, in this embodiment, the chip first process is used to form the display apparatus.

Figure 20E:
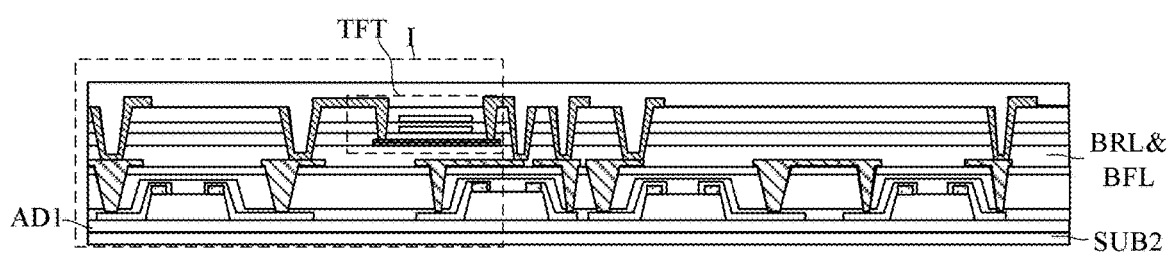
Figure 21:
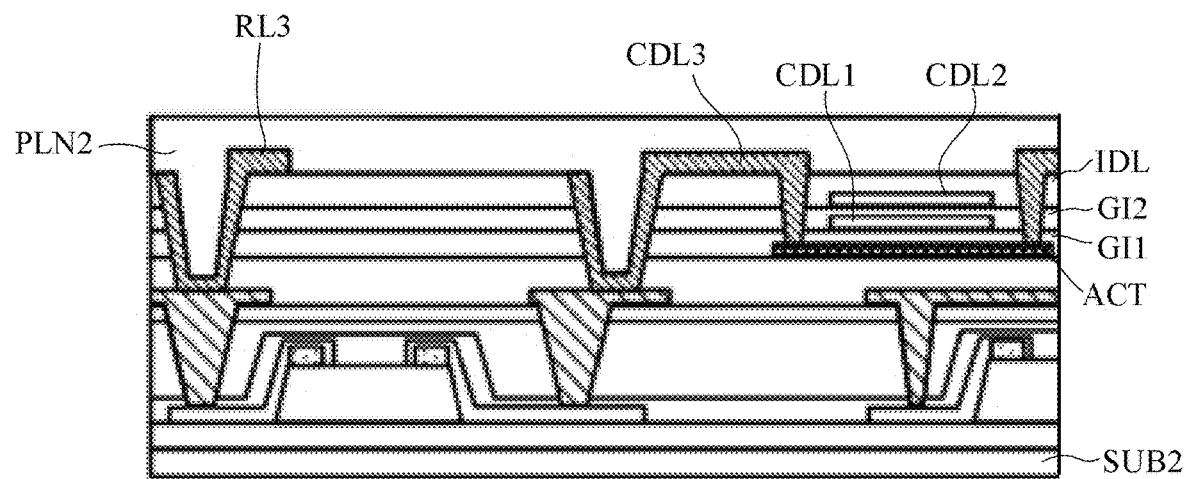
FIG. 21 is a partial enlarged view of a part I of FIG. 20E.

FIG. 21 is a partial enlarged view of a part I of FIG. 20E. For example, referring to FIGS. 20E and 21, a barrier layer BRL and a buffer layer BFL may be sequentially formed on a side of the redistribution layer RDL2 away from the base substrate. Then, a TFT film structure may be formed on a side of the buffer layer BFL away from the base substrate. For example, an active layer, a gate insulating layer GI1, a conductive layer CDL1, a gate insulating layer GI2, a conductive layer CDL2, an interlayer dielectric layer IDL, and a conductive layer CDL3 may be sequentially formed on the side of the buffer layer BFL away from the base substrate. For example, the TFT driving circuit may include at least one thin film transistor and at least one storage capacitor. A gate of the thin film transistor (i.e., TFT) and one electrode of the storage capacitor may be located in the conductive layer CDL1, another electrode of the storage capacitor may be located in the conductive layer CDL2, and a source and a drain of the thin film transistor may be located in the conductive layer CDL3. For example, a plurality of second wires RL3 may be located in the conductive layer CDL3. A second wire RL3 may be electrically connected to a first wire RL2 through a via hole passing through the gate insulating layer GI1, the gate insulating layer GI2 and the interlayer dielectric layer IDL. The source and the drain of the thin film transistor may be electrically connected to a source region and a drain region of the active layer through via holes passing through the gate insulating layer GI1, the gate insulating layer GI2, and the interlayer dielectric layer IDL, respectively.

For example, a planarization layer PLN2 may be formed on a side of the conductive layer CDL3 away from the base substrate.

It should be understood that, in this embodiment, a conventional process for manufacturing a TFT may be used to form the driving element including the TFT driving circuit, which will not be repeated here.

It should be noted that in the embodiments of the present disclosure, the thin film transistor included in the above-mentioned TFT driving circuit may include, but is not limited to, a polysilicon TFT, a low-temperature polysilicon TFT, an oxide TFT, and the like.

For example, as described above, referring to FIGS. 17F to 17I, the base substrate SUB4 may be attached to the surface of the planarization layer PLN3 away from the base substrate SUB2 through the adhesive layer AD3. The base substrate SUB2 is separated from the devices formed thereon by means of laser dissociation, temperature dissociation, or UV dissociation. The protective layer PTL is coated on a side of each of the chips CP1, CP2, CP3, CP4 away from the base substrate SUB4. A patterning process is performed on the protection layer PTL to expose the surface of each of the chips CP1, CP2, CP3, and CP4 close to the protection layer PTL. In this way, the protective layer PTL may protect, for example, the metal layer of the expansion wires RL1, so that the metal layer may not be exposed to the air, while the functional surface of each of the chips CP1, CP2, CP3, CP4 may be exposed, which is conducive to the realization of functions of respective chips.

Figure 20F:
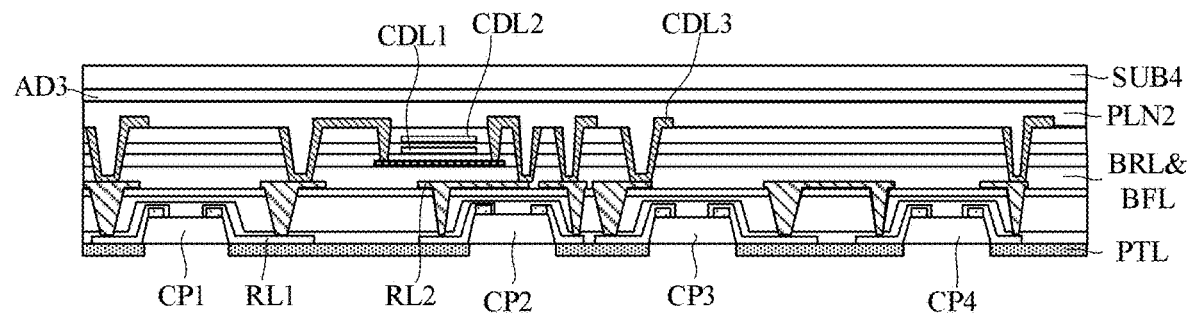

FIG. 20F schematically illustrates a cross-sectional view of a display apparatus according to the exemplary embodiments of the present disclosure. Referring to FIGS. 20F, 20E, and 21, a semiconductor apparatus according to some embodiments of the present disclosure may be a display apparatus, for example, the display apparatus may be a μLED display apparatus. The display apparatus may include: a base substrate SUB4; an adhesive layer AD3 arranged on the base substrate SUB4; a planarization layer PLN2 provided on a side of the adhesive layer AD3 away from the base substrate SUB4; a conductive layer CDL3 arranged on a side of the planarization layer PLN2 away from the base substrate SUB4; an interlayer dielectric layer IDL arranged on a side of the conductive layer CDL3 away from the base substrate SUB4; a conductive layer CDL2 arranged on a side of the interlayer dielectric layer IDL away from the base substrate SUB4; a gate insulating layer GI2 arranged on a side of the conductive layer CDL2 away from the base substrate SUB4; a conductive layer CDL1 arranged on a side of the gate insulating layer GI2 away from the base substrate SUB4; an active layer ACT arranged on a side of the conductive layer CDL1 away from the base substrate SUB4; a buffer layer BFL arranged on a side of the active layer ACT away from the base substrate SUB4; a barrier layer BRL arranged on a side of the buffer layer BFL away from the base substrate SUB4; a redistribution layer RDL2 arranged on a side of the barrier layer BRL away from the base substrate SUB4; a passivation layer PVX2 arranged on a side of the redistribution layer RDL2 away from the base substrate SUB4; a planarization layer PLN1 arranged on a side of the passivation layer PVX2 away from the base substrate SUB4; a passivation layer PVX1 arranged on a side of the planarization layer PLN1 away from the base substrate SUB4; a terminal expansion layer RDL1 arranged on a side of the passivation layer PVX1 away from the base substrate SUB4; a plurality of chips CP1, CP2, CP3, CP4 arranged on a side of the terminal expansion layer RDL1 away from the base substrate SUB4; and a protective layer PTL arranged on a side of the chips CP1, CP2, CP3, CP4 away from the base substrate SUB4.

For example, the TFT driving circuit may include at least one thin film transistor and at least one storage capacitor, a gate of the thin film transistor (i.e., TFT) and one electrode of the storage capacitor may be located in the conductive layer CDL1, the other electrode of the storage capacitor may be located in the conductive layer CDL2, and a source and a drain of the thin film transistor may be located in the conductive layer CDL3.

For example, a plurality of expansion wires RL1 may be located in the terminal expansion layer RDL1. A plurality of first wires RL2 may be located in the redistribution layer RDL2. The plurality of second wires RL3 may be located in the conductive layer CDL3. Each of the chips CP1, CP2, CP3, CP4 may include at least one terminal p1. The terminal p1 of each of the chips CP1, CP2, CP3, CP4 is led out through the expansion wires RL1. The plurality of first wires RL2 may be electrically connected to the plurality of expansion wires RL1 through via holes passing through the passivation layer PVX1, the planarization layer PLN1 and the passivation layer PVX2, respectively. The plurality of second wires RL3 may be electrically connected to the plurality of first wires RL2 through via holes passing through the gate insulating layer GI1, the gate insulating layer GI2, and the interlayer dielectric layer IDL, respectively. A source and a drain of the thin film transistor may be electrically connected to a source region and a drain region of the active layer through via holes passing through the gate insulating layer GI1, the gate insulating layer GI2, and the interlayer dielectric layer IDL, respectively. In this way, the electrical connection between the TFT driving circuit and the chip may be realized, and the electrical connections among the plurality of chips may be realized.

Figure 22:
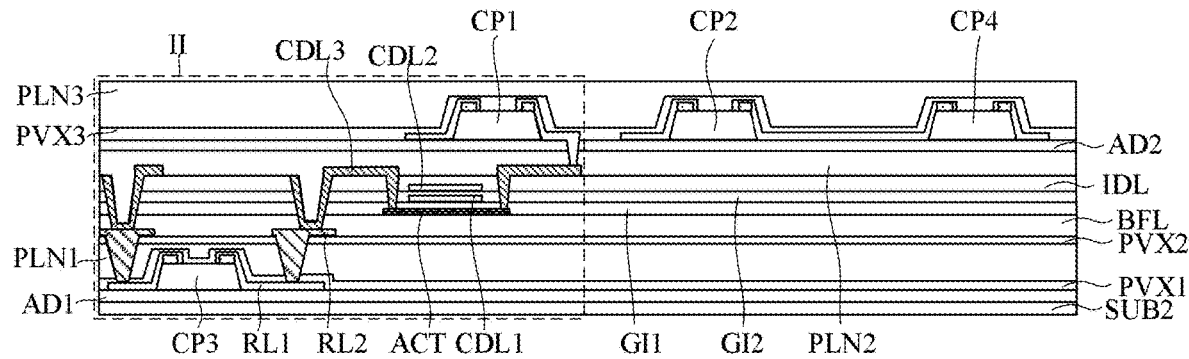
FIG. 22 schematically illustrates a cross-sectional view of a display apparatus according to some embodiments of the present disclosure, in which a LED chip and other chips are located in different layers.
Figure 23:
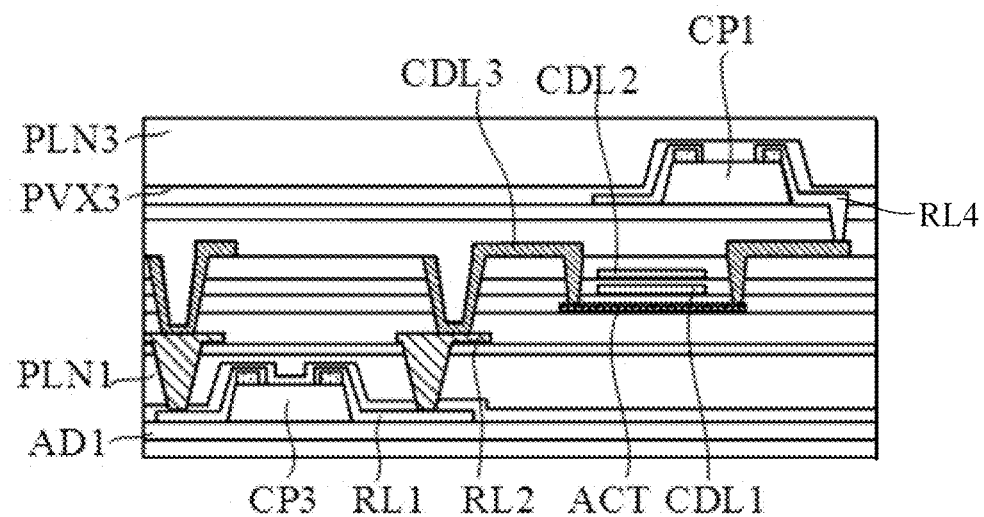
FIG. 23 is a partial enlarged view of a part II of FIG. 22.

FIG. 22 schematically illustrates a cross-sectional view of a display apparatus according to some embodiments of the present disclosure, in which a LED chip and other chips are located in different layers. FIG. 23 is a partial enlarged view of a part II of FIG. 22. With reference to FIGS. 22 and 23, taking into account differences in process and performance (e.g., temperature resistance) between a LED chip and a Si-based chip related to display and sensing, the LED chip and the other chips may be arranged on different sides of a TFT. For example, the LED chip may be arranged on a side of the thin film transistor close to the base substrate SUB2, and the other chips may be arranged on a side of the thin film transistor away from the base substrate SUB2. In this embodiment, the chips CP1, CP2, CP4 located in the upper layer may be electrically connected to the LED chip CP3 located in the lower layer through a plurality of second wires RL3 located in the redistribution layer RDL3.

For example, the display apparatus may be a μLED (i.e., a mini LED) display apparatus, and the display apparatus may include: a base substrate SUB2; an adhesive layer AD1 arranged on the base substrate SUB2; a LED chip CP3 arranged on a side of the adhesive layer AD1 away from the base substrate SUB2; a terminal expansion layer RDL1 arranged on a side of the LED chip CP3 away from the base substrate SUB2; a passivation layer PVX1 arranged on a side of the terminal expansion layer RDL1 away from the base substrate SUB2; a planarization layer PLN1 arranged on a side of the passivation layer PVX1 away from the base substrate SUB2; a passivation layer PVX2 arranged on a side of the planarization layer PLN1 away from the base substrate SUB2; a redistribution layer RDL2 arranged on a side of the passivation layer PVX2 away from the base substrate SUB2; a barrier layer BRL and/or a buffer layer BFL arranged on a side of the redistribution layer RDL2 away from the base substrate SUB2; an active layer ACT arranged on a side of the buffer layer BFL away from the base substrate SUB2; a gate insulating layer GI1 arranged on a side of the active layer ACT away from the base substrate SUB2; a conductive layer CDL1 arranged on a side of the gate insulating layer GI1 away from the base substrate SUB2; a gate insulating layer GI2 arranged on a side of the conductive layer CDL1 away from the base substrate SUB2; a conductive layer CDL2 arranged on a side of the gate insulating layer GI2 away from the base substrate SUB2; an interlayer dielectric layer IDL arranged on a side of the conductive layer CDL2 away from the base substrate SUB2; a conductive layer CDL3 arranged on a side of the interlayer dielectric layer IDL away from the base substrate SUB2; a planarization layer PLN2 arranged on a side of the conductive layer CDL3 away from the base substrate SUB2; an adhesive layer AD2 arranged on a side of the planarization layer PLN2 away from the base substrate SUB2; a plurality of chips CP1, CP2, CP4 arranged on a side of the adhesive layer AD2 away from the base substrate SUB2; a redistribution layer RDL3 arranged on a side of the chips CP1, CP2, CP4 away from the base substrate SUB2; a passivation layer PVX3 arranged on a side of the redistribution layer RDL3 away from the base substrate SUB2; and a planarization layer PLN3 arranged on a side of the passivation layer PVX3 away from the base substrate SUB2.

For example, the TFT driving circuit may include at least one thin film transistor and at least one storage capacitor, a gate of the thin film transistor (i.e., TFT) and one electrode of the storage capacitor may be located in the conductive layer CDL1, the other electrode of the storage capacitor may be located in the conductive layer CDL2, and a source and a drain of the thin film transistor may be located in the conductive layer CDL3.

For example, a plurality of expansion wires RL1 may be located in the terminal expansion layer RDL1. A plurality of first wires RL2 may be located in the redistribution layer RDL2. A plurality of second wires RL3 may be located in the conductive layer CDL3. A plurality of third wires RL4 may be located in the redistribution layer RDL3. Each of the chips CP1, CP2, CP3, CP4 may include at least one terminal p1. The terminal p1 of each of the chips CP1, CP2, and CP4 may be led out through the second wire RL3. The terminal p1 of each of the chips CP1, CP2, and CP4 may be electrically connected to the second wire RL3 through the first wire RL2. At least one third wire RL4 may be electrically connected to the second wire RL3, at least one of the source and the drain of the thin film transistor through a via hole passing through the adhesive layer AD2 and the planarization layer PLN2. The plurality of first wires RL2 may be electrically connected to the plurality of expansion wires RL1 through via holes passing through the passivation layer PVX1, the planarization layer PLN1 and the passivation layer PVX2, respectively. The plurality of second wires RL3 may be electrically connected to the plurality of first wires RL2 through via holes passing through the gate insulating layer GI1, the gate insulating layer GI2, and the interlayer dielectric layer IDL, respectively. A source and a drain of the thin film transistor may be electrically connected to a source region and a drain region of the active layer through via holes passing through the gate insulating layer GI1, the gate insulating layer GI2, and the interlayer dielectric layer IDL, respectively. In this way, the electrical connection between the TFT driving circuit and the chip may be realized, and the electrical connections among the plurality of chips may be realized.

In this embodiment, the chips CP1, CP2, CP4 and the LED chip CP3 are located on opposite sides of the thin film transistor. The plurality of terminal expansion layers are formed through the post-alignment process, and the electrical connection between the TFT driving circuit and the chip and the electrical connections among the plurality of chips may still be realized.

Figure 24:
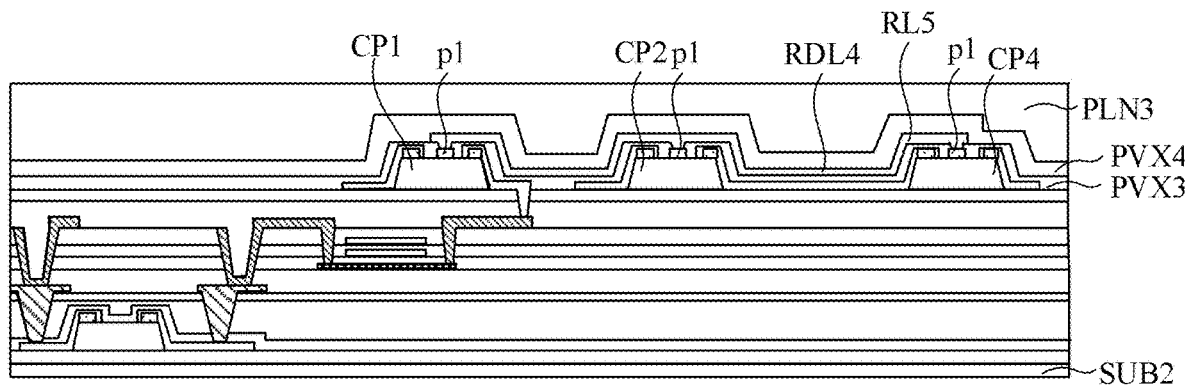
FIG. 24 schematically illustrates a cross-sectional view of a display apparatus according to some embodiments of the present disclosure, in which a LED chip and other chips are located in different layers.

FIG. 24 schematically illustrates a cross-sectional view of a display apparatus according to some embodiments of the present disclosure, in which a LED chip and other chips are located in different layers. Referring to FIG. 24, a plurality of terminal expansion layers may be provided to realize electrical connections among a plurality of chips CP1, CP2 and CP4 located in the upper layer. For example, a terminal expansion layer RDL4 and a passivation layer PVX4 may be arranged between a passivation layer PVX3 and a planarization layer PLN3. The passivation layer PVX4 is arranged on a side of the planarization layer PLN3 close to the base substrate SUB2, and the terminal expansion layer RDL4 is arranged between the passivation layer PVX4 and the passivation layer PVX3. A plurality of expansion wires RL5 may be located in the terminal expansion layer RDL4.

For example, each of the chips CP1, CP2, and CP4 may include at least three terminals p1. The third wire RL4 located in the redistribution layer RDL3 may lead out terminals p1 located on both sides of the chip. The expansion wire RL5 in the terminal expansion layer RDL4 may electrically connect a terminal p1 located in the middle of one chip and a terminal p1 located in the middle of another chip.

By providing the plurality of terminal expansion layers, it is advantageous to realize electrical connections among the plurality of chips CP1, CP2, and CP4 located in the upper layer. It should be understood that, according to actual wiring needs, more terminal expansion layers may be provided, to achieve electrical connections among the chips CP1, CP2 and CP4 located in the upper layer.

FIGS. 25A to 25F each schematically illustrates a cross-sectional view of a structure formed after performing some steps in a method for manufacturing a display apparatus according to the exemplary embodiments of the present disclosure, in which a driving element of the display apparatus includes a TFT driving circuit, and the method for manufacturing the display apparatus is realized through the above-mentioned chip later process.

Figure 25A:
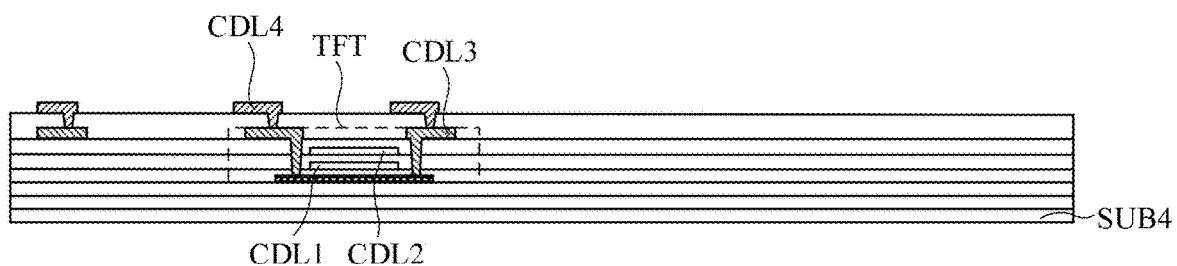
FIGS. 25A to 25F each schematically illustrates a cross-sectional view of a structure formed after performing some steps in a method for manufacturing a display apparatus according to the exemplary embodiments of the present disclosure, in which a driving element of the display apparatus includes a TFT driving circuit, and the method for manufacturing the display apparatus is realized through the above-mentioned chip later process.

Referring to FIG. 25A, a TFT driving circuit may be formed on a base substrate SUB4. For example, in the embodiments of the present disclosure, thin film transistor in the above-mentioned TFT driving circuit may include, but is not limited to, a polysilicon TFT, a low temperature polysilicon TFT, an oxide TFT, and the like. Taking a process of the polysilicon TFT as an example, a barrier layer BRL and a buffer layer BFL may be sequentially formed on the base substrate SUB4. Then, a TFT film structure may be formed on a side of the buffer layer BFL away from the base substrate. For example, an active layer ACT, a gate insulating layer GI1, a conductive layer CDL1, a gate insulating layer GI2, a conductive layer CDL2, an interlayer dielectric layer IDL, and a conductive layer CDL3 may be sequentially formed on a side of the buffer layer BFL away from the base substrate SUB4. For example, the TFT driving circuit may include at least one thin film transistor and at least one storage capacitor. A gate of the thin film transistor (i.e., TFT) and one electrode of the storage capacitor may be located in the conductive layer CDL1, and the other electrode of the storage capacitor may be located in the conductive layer CDL2. A source and a drain of the thin film transistor may be located in the conductive layer CDL3. For example, a plurality of second wires RL3 may be located in the conductive layer CDL3. A source and a drain of the thin film transistor may be electrically connected to a source region and a drain region of the active layer through via holes passing through the gate insulating layer GI1, the gate insulating layer GI2, and the interlayer dielectric layer IDL, respectively.

For example, a planarization layer PLN1 may be formed on a side of the conductive layer CDL3 away from the base substrate SUB4, and a conductive layer CDL4 may be formed on a side of the planarization layer PLN1 away from the base substrate SUB4. For example, a plurality of third wires RL4 may be located in the conductive layer CDL4. The plurality of third wires RL4 may be electrically connected to the plurality of second wires RL3 and a source and a drain of the thin film transistor through via holes passing through the planarization layer PLN1, respectively.

It should be understood that, in this embodiment, a conventional process for manufacturing a TFT may be used to form the driving element including the TFT driving circuit, which will not be repeated here.

In this embodiment, the TFT driving circuit is first formed on the base substrate SUB4, and then each chip and at least one terminal expansion layer are formed on the backplane where the TFT driving circuit is formed, that is, the chip later process is adopted to form the display apparatus.

Figure 25B:
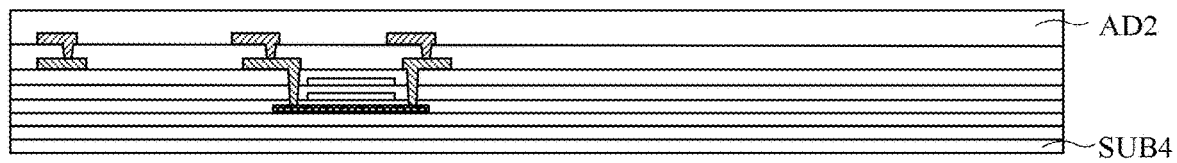
Figure 25C:
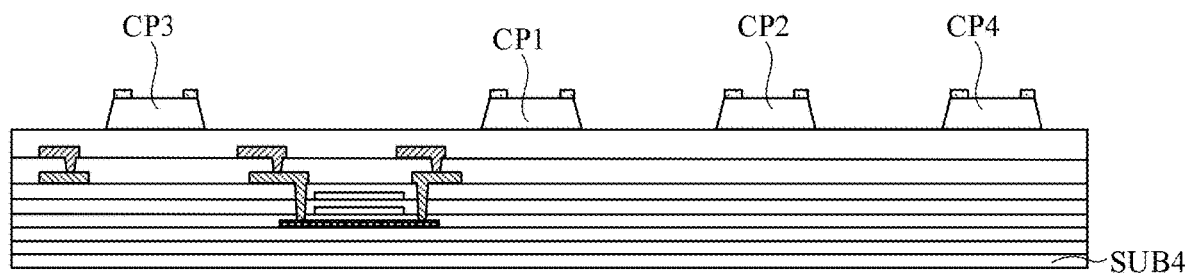

Referring to FIGS. 25B and 25C, an adhesive layer AD2 is formed on a side of the conductive layer CDL4 away from the base substrate SUB4. Then, the plurality of chips CP are transferred to the base substrate SUB4 through SMT or the mass transfer process, and are fixed on the base substrate SUB4 through the adhesive layer AD2. Each chip CP may include at least two terminals p1. In the illustrated embodiment, the terminal p1 of each chip CP faces upward, that is, toward a side of the chip away from the base substrate SUB4.

For example, the plurality of chips CP may include, but are not limited to, a LED chip, a driver chip, a memory chip, a control chip, a digital-to-analog conversion chip, an information processing chip, a sensor chip, etc. For example, the LED chip may be an LED chip with a sapphire base substrate removed, and the driver chip, memory chip, control chip, digital-to-analog conversion chip, information processing chip, and sensor chip may be Si-based chips, which may be bare chips without encapsulation structures. In the embodiment of FIG. 25C, four chips are schematically shown. For ease of description, the four chips are called a chip CP1, a chip CP2, a chip CP3, and a chip CP4, respectively. For example, the chip CP1 may be a control chip, and the chip CP2 may be a memory chip, the chip CP3 may be an LED chip, and the chip CP4 may be a sensor chip. It should be understood that, the embodiments of the present disclosure are not limited to the arrangement shown in FIG. 25C.

For example, the base substrate SUB4 may be a glass base substrate, a polyimide (i.e., PI) base substrate, or a quartz base substrate.

For example, the adhesive layer AD2 may include, but is not limited to, an adhesive material such as heat-sensitive adhesive, laser curing adhesive, photoresist, and UV curing adhesive.

Figure 25D:
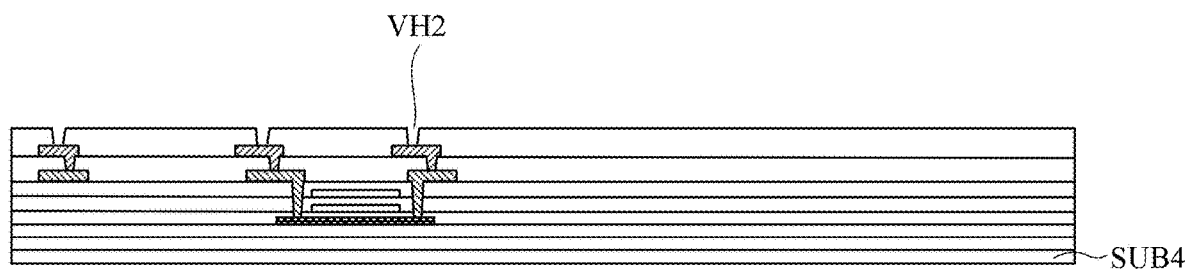

Referring to FIG. 25D, a patterning process may be used to form a plurality of via holes VH2 in the adhesive layer AD2, to expose at least a part of the third wire RL4 located in the conductive layer CDL4. For example, a conventional lithography process may be used to the patterning process, and the conventional lithography process may include photoresist coating, exposure, development, etching, etc., and a mask may be used in the exposure process.

Figure 25E:
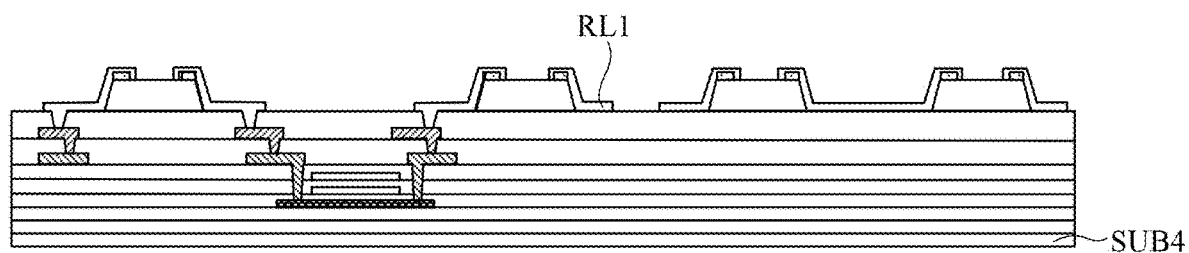

Referring to FIG. 25E, the base substrate (which may be referred to as a backplane) provided with the chips CP1, CP2, CP3, and CP4 is photographed, and a coordinate and an area of a terminal p1 of each of chips CP1, CP2, CP3, and CP4 arranged on the backplane are determined using the image recognition technology, so as to generate a graphic file of a terminal area (i.e., a pad area). Next, a metal layer is deposited on the backplane, a photoresist is coated on the metal layer, and the photoresist is patterned by digital direct writing or a digital exposure machine according to the above-mentioned graphic file. Then, according to the patterned photoresist, the metal layer is etched to form a terminal expansion layer RDL1. A plurality of expansion wires RL1 are formed in the terminal expansion layer RDL1, and the plurality of expansion wires RL1 may be electrically connected to terminals p1 of the chips CP1, CP2, CP3, and CP4, respectively, so as to lead out respective terminals p1. That is, through the post-alignment process, the expansion wires RL1 for electrically connecting respective chips are formed in the terminal expansion layer RDL1.

For example, at least one expansion wire RL1 may be electrically connected to the TFT driving circuit through the third wire RL4 located in the conductive layer CDL4, for example, electrically connected to a source or a drain of the thin film transistor. The at least one expansion wire RL1 may also electrically connect at least two of the chips CP1, CP2, CP3, and CP4. In this way, the electrical connection between the TFT driving circuit and the chip may be realized, and the electrical connections among the plurality of chips may be realized.

Figure 25F:
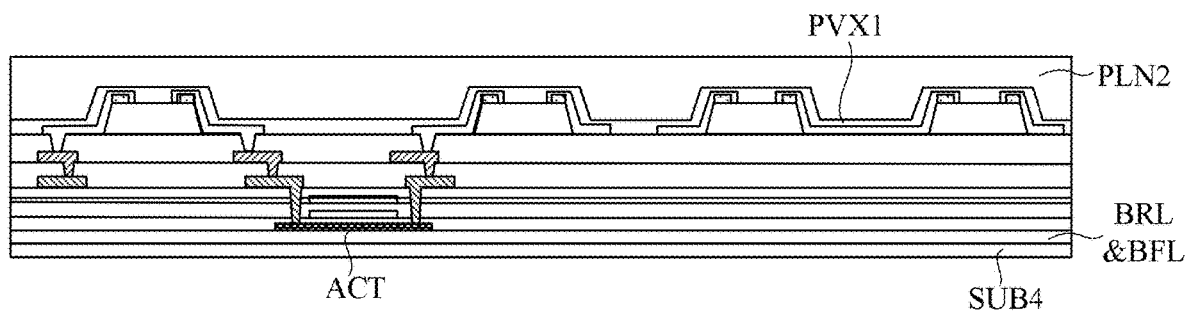

Referring to FIG. 25F, a passivation layer PVX1 and a planarization layer PLN2 may be sequentially formed on a side of the terminal expansion layer RDL1 away from the base substrate.

It should be noted that, according to a circuit logic design requirement, the number of wiring layers may also be increased. For example, redistribution layers RDL2 and RDL3, etc. may be formed on a side of the terminal expansion layer RDL1 away from the base substrate, and an insulating layer may be used for isolation and insulation between two adjacent wiring layers.

Referring to FIG. 25F, the semiconductor apparatus according to some embodiments of the present disclosure may be a display apparatus, for example, the display apparatus may be a μLED display apparatus. The display apparatus may include: a base substrate SUB4; a barrier layer BRL arranged on the base substrate SUB4; a buffer layer BFL arranged on a side of the barrier layer BRL away from the base substrate SUB4; an active layer ACT arranged on a side of the buffer layer BFL away from the base substrate SUB4; a gate insulating layer GI1 arranged on a side of the active layer ACT away from the base substrate SUB4; a conductive layer CDL1 arranged on a side of the gate insulating layer GI1 away from the base substrate SUB4; a gate insulating layer GI2 arranged on a side of the conductive layer CDL1 away from the base substrate SUB4; a conductive layer CDL2 arranged on a side of the gate insulating layer GI2 away from the base substrate SUB4; an interlayer dielectric layer IDL arranged on a side of the conductive layer CDL2 away from the base substrate SUB4; a conductive layer CDL3 arranged on a side of the interlayer dielectric layer IDL away from the base substrate SUB4; a planarization layer PLN1 arranged on a side of the conductive layer CDL3 away from the base substrate SUB4; a conductive layer CDL4 arranged on a side of the planarization layer PLN1 away from the base substrate SUB4; an adhesive layer AD2 arranged on a side of the conductive layer CDL4 away from the base substrate SUB4; a plurality of chips arranged on a side of the adhesive layer AD2 away from the base substrate SUB4; a terminal expansion layer RDL1 arranged on a side of the plurality of chips away from the base substrate SUB4; a passivation layer PVX1 arranged on a side of the terminal expansion layer RDL1 away from the base substrate SUB4; and a planarization layer PLN2 arranged on a side of the passivation layer PVX1 away from the base substrate SUB4.

For example, the TFT driving circuit may include at least one thin film transistor and at least one storage capacitor, a gate of the thin film transistor (i.e., TFT) and one electrode of the storage capacitor may be located in the conductive layer CDL1, and the other electrode of the storage capacitor may be located in the conductive layer CDL2, a source and a drain of the thin film transistor may be located in the conductive layer CDL3.

For example, a plurality of expansion wires RL1 may be located in the terminal expansion layer RDL1. Each of the chips CP1, CP2, CP3 and CP4 may include at least one terminal p1. The terminal p1 of each of the chips CP1, CP2, CP3 and CP4 is led out through the expansion wire RL1.

A plurality of second wires RL3 may be located in the conductive layer CDL3. A source and a drain of the thin film transistor may be electrically connected to a source region and a drain region of the active layer through via holes passing through the gate insulating layer GI1, the gate insulating layer GI2, and the interlayer dielectric layer IDL, respectively. A plurality of third wires RL4 may be located in the conductive layer CDL4. The plurality of third wires RL4 may be electrically connected to the plurality of second wires RL3 and the source and drain of the thin film transistor through via holes passing through the planarization layer PLN1, respectively.

For example, at least one expansion wire RL1 may be electrically connected to the TFT driving circuit through the third wire RL4 located in the conductive layer CDL4, for example, electrically connected to a source or a drain of the thin film transistor. The at least one expansion wire RL1 may also electrically connect at least two of the chips CP1, CP2, CP3, and CP4. In this way, the electrical connection between the TFT driving circuit and the chip may be realized, and the electrical connections among the plurality of chips may be realized.

In the above-mentioned embodiments, the thin film transistor is a top-gate type thin film transistor, and it should be understood that the embodiments of the present disclosure are not limited thereto. For example, the thin film transistor may also be a bottom-gate type thin film transistor, for example, a back-channel etched structure (i.e., a BCE type TFT) is applied.

Figure 27:
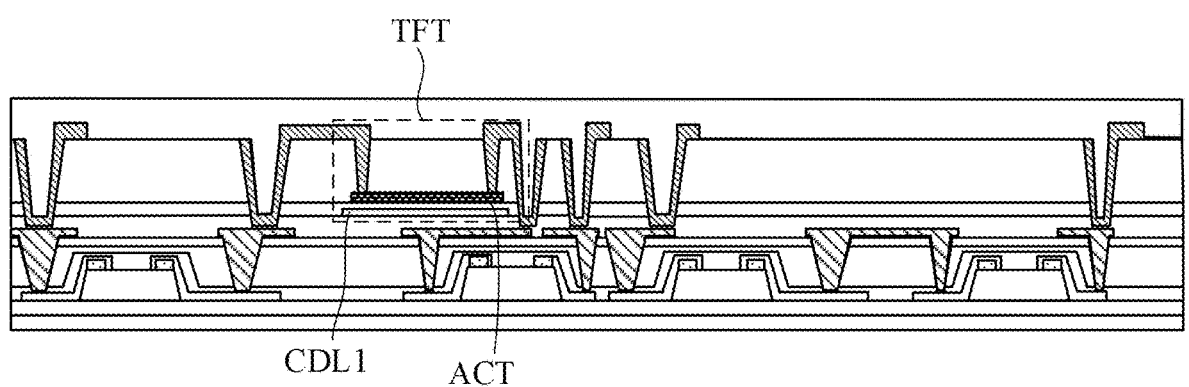
FIG. 27 schematically illustrates a cross-sectional view of a display apparatus according to some embodiments of the present disclosure, in which a thin film transistor is a bottom-gate type thin film transistor.

FIG. 27 schematically illustrates a cross-sectional view of a display apparatus according to some embodiments of the present disclosure, in which a thin film transistor is a bottom-gate type thin film transistor. Referring to FIG. 27, in a process for forming a TFT film structure on a side of a buffer layer BFL away from a base substrate, a conductive layer CDL1 may be first prepared, next, a gate insulating layer GI1 may be formed, and then an active layer ACT may be formed. For example, the conductive layer CDL1 may include a material such as Mo/Al/Mo or Mo/Cu, and a thickness of ranges from 3000 angstroms to 6000 angstroms. The gate insulating layer GI1 may include silicon nitride or silicon oxide, and a thickness of the gate insulating layer GI1 ranges from 2000 angstroms to 5000 angstroms. The active layer ACT may include an oxide semiconductor material such as IGZO, IGTO, and IZO, and a thickness of the active layer ACT ranges from 300 angstroms to 1000 angstroms.

The semiconductor apparatus according to the embodiments of the present disclosure is applied in a sensor will be described in detail, with reference to the accompanying drawings. It should be noted that in the following description, a structure of the semiconductor apparatus applied in the sensor will be mainly described, and a process for manufacturing the semiconductor apparatus may be referred to the above description, which will not be repeated here.

In the embodiments of the present disclosure, a chip with integrated functions is split into a plurality of microchips. In sensor application scenarios, some more chips may be provided in a front-end part to improve the ability to acquire information, and the front-end part may share a control chip with a back-end part (e.g., a control part). Through chip splitting and partial function enhancements, it is conducive to a function optimization of the sensor.

For example, with the increasing demand for giant screen, 3D display, virtual reality, etc. of a display, the demand for a space detection technology of an object is also increasing. For example, it is necessary to detect the object at multiple depths and multiple locations, so as to realize an intelligent display screen that integrates multi-area space detection. For example, in the existing space detection technology, an external module solution is usually used. That is, a sensor used for space detection is usually placed in the middle of an upper bezel of the display or on a desktop in front of the display, so that the application space is limited, and there is a blind spot of identification. For the existing 2D display, a user standing in the best recognition range may realize gesture manipulation. However, for 3D display, the display image is multi-layered and distributed in multiple positions. The user's desired experience is to touch a virtual object at different positions. Therefore, the solution of a device with an integration of a sensor for space detection and a display element has gradually become one of important topics for developers.

In the following embodiments, an acoustic sensor is taken as an example, to describe a solution of a device with an integration of a sensor for space detection and a display element according to the embodiments of the present disclosure.

Figure 28A:
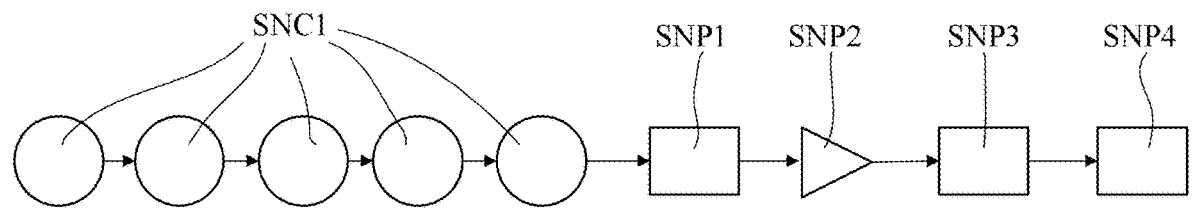
FIGS. 28A and 28B each schematically illustrates a block diagram of an acoustic sensor according to some embodiments of the present disclosure.
Figure 28B:
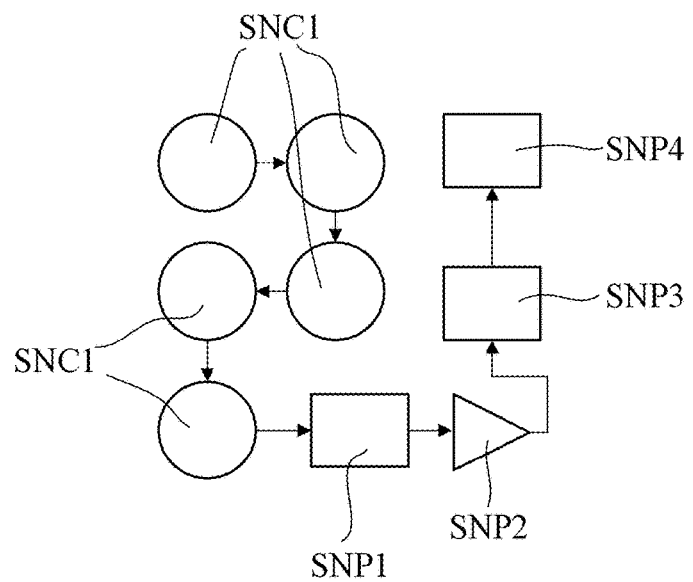
Figure 28C:
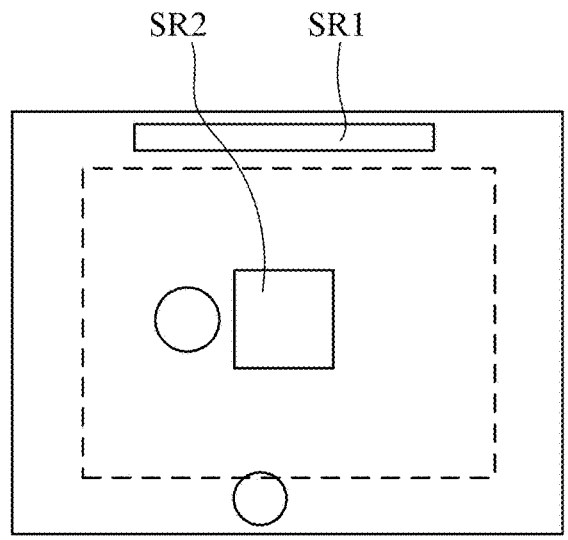
FIG. 28C schematically illustrates an arrangement of acoustic sensors in a display apparatus according to some embodiments of the present disclosure.

In the embodiments of the present disclosure, an acoustic sensor may be split into a plurality of microchips according to functions. For example, the acoustic sensor may at least include a signal acquisition chip and a signal processing chip. FIGS. 28A and 28B each schematically illustrates a block diagram of an acoustic sensor according to some embodiments of the present disclosure. FIG. 28C schematically illustrates an arrangement of acoustic sensors in a display apparatus according to some embodiments of the present disclosure. Referring to FIGS. 28A and 28B, an acoustic sensor may be split into a plurality of microchips according to functions. For example, an acoustic sensor may be provided with a plurality of signal acquisition chips SNC1, and the plurality of signal acquisition chips SNC1 may be electrically connected to at least one signal processing chip. The plurality of signal acquisition chips SNC1 may be connected in series to increase a signal-to-noise ratio of an acquired signal, thereby increasing signal detection sensitivity and realizing long-distance detection.

For example, a signal processing chip may include an LC filter circuit, an amplifying circuit, a digital-to-analog conversion circuit, and a control circuit. The LC filter circuit may filter a signal acquired by the signal acquisition chip. The amplifier circuit may amplify and rectify the filtered signal. The digital-to-analog conversion circuit may perform a digital-to-analog conversion on the amplified signal. The control circuit may receive the digital-to-analog converted signal and perform a corresponding control function based on the digital-to-analog converted signal.

For example, the signal processing chip may also be split into a plurality of microchips according to functions. For example, each of an LC filter circuit, an amplifier circuit, a digital-to-analog conversion circuit and a control circuit may form an independent microchip, so that each microchip may be arranged flexibly. That is, the acoustic sensor may include an LC filter chip SNP1, an amplifier chip SNP2, a digital-to-analog conversion chip SNP3, and a control chip SNP4.

For example, the plurality of signal acquisition chips SNC1 may be connected in series with each other, and then electrically connected to the LC filter chip SNP1, amplifier chip SNP2, the digital-to-analog conversion chip SNP3, and the control chip SNP4. The plurality of signal acquisition chips SNC1, the LC filter chip SNP1, the amplifier chip SNP2, the digital-to-analog conversion chip SNP3, and the control chip SNP4 may be arranged in a straight line, as shown in FIG. 28A. In this way, an acoustic sensor SR1 with such an arrangement may be arranged at the middle of an upper bezel of a display. The plurality of signal acquisition chips SNC1, the LC filter chip SNP1, the amplifier chip SNP2, the digital-to-analog conversion chip SNP3, and the control chip SNP4 may be arranged in a rectangle, as shown in FIG. 28B. In this way, an acoustic sensor SR2 with such an arrangement may be arranged in a display area of a display. In the embodiments of the present disclosure, the sensor may be placed in the display area of the display, or may be placed on the bezel of the display. As the sensor is split into a plurality of microchips, the sensor may be arranged flexibly. For example, the sensor may be arranged in a row, a circle, a serpentine, a rectangular area, a circular area, an elliptical area, etc.; the microchips may be densely arranged in a blank area, or the plurality of microchips may be inserted in gaps among the pixels. In other words, the sensor according to the embodiments of the present disclosure may be flexibly arranged in the display, which improves the performance of the device and the installation flexibility, thereby removing the limitations of existing device detection and solving the problem that a sensor can only be placed in an external module.

Figure 29:
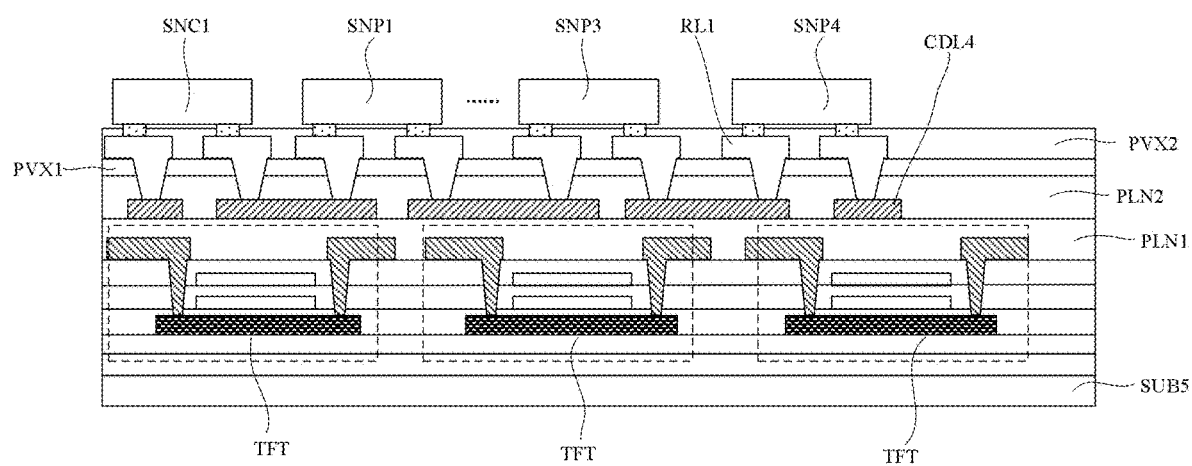
FIG. 29 schematically illustrates a cross-sectional view of a display apparatus integrated with a sensor according to some embodiments of the present disclosure, in which the sensor is a Si-based sensor.

In the embodiments of the present disclosure, the sensor may be a Si-based sensor. For example, the signal acquisition chip may include a transducer for acquiring an acoustic signal and converting the acoustic signal into an electrical signal. FIG. 29 schematically illustrates a cross-sectional view of a display apparatus integrated with a sensor according to some embodiments of the present disclosure, in which the sensor is a Si-based sensor. Referring to FIG. 29, the display apparatus may include a base substrate SUB5; a driving element arranged on the base substrate SUB5; a planarization layer PLN1 arranged on a side of the driving element away from the base substrate SUB5; a conductive layer CDL4 arranged on a side of the planarization layer PLN1 away from the base substrate SUB5; a planarization layer PLN2 arranged on a side of the conductive layer CDL4 away from the base substrate SUB5; a passivation layer PVX1 arranged on a side of the planarization layer PLN2 away from the base substrate SUB5; a terminal expansion layer RDL1 arranged on a side of the passivation layer PVX1 away from the base substrate SUB5; a passivation layer PVX2 arranged on a side of the terminal expansion layer RDL1 away from the base substrate SUB5; and a plurality of chips arranged on a side of the passivation layer PVX2 away from the base substrate SUB5. For example, the plurality of chips may be the signal acquisition chip SNC1, the LC filter chip SNP1, the amplifier chip SNP2, the digital-to-analog conversion chip SNP3 and the control chip SNP4, of the sensor.

A plurality of expansion wires RL1 may be located in the terminal expansion layer RDL1. The plurality of signal acquisition chips SNC1 may be connected in series through the plurality of expansion wires RL1, and the plurality of expansion wires RL1 may also electrically connect the plurality of signal acquisition chips SNC1 connected in series, the LC filter chip SNP1, the amplifier chip SNP2, the digital-to-analog conversion chip SNP3 and the control chip SNP4 sequentially.

In this embodiment, the driving element may include the above-mentioned TFT driving circuit, and the specific film structure may refer to the above description, which is not repeated here.

Figure 30:
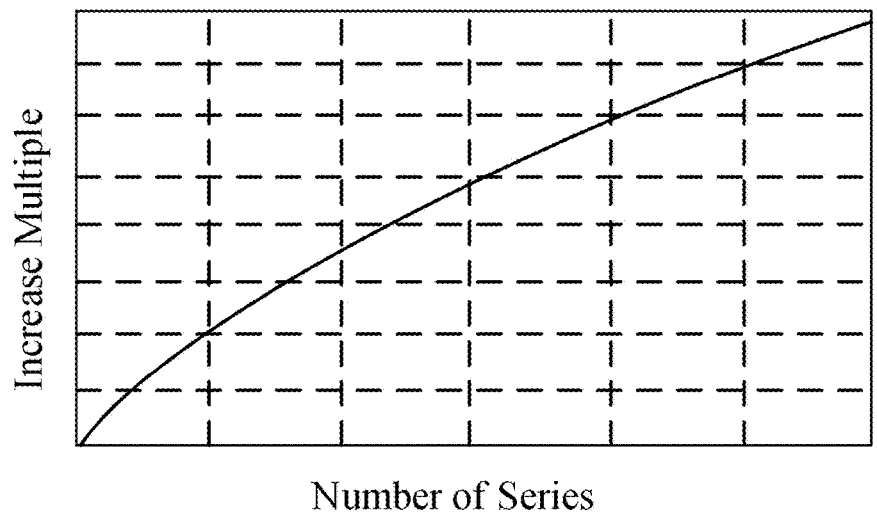
FIG. 30 schematically illustrates a relationship between the increase multiple of an output voltage and the number of transducers connected in series in the sensor according to the embodiments of the present disclosure.

FIG. 30 schematically illustrates a relationship between the increase multiple of an output voltage and the number of transducers connected in series in the sensor according to the embodiments of the present disclosure. Referring to FIG. 30, in the embodiments of the present disclosure, the transducer and other signal processing circuits such as a filtering and amplifying circuit are split, and a plurality of transducers are connected in series to increase an amount of a received signal, the received signal is then transmitted to a circuit such as a filtering and amplifying circuit, as shown in FIG. 30. In this way, the sensitivity of the device may be increased, and longer-distance detection may be realized. In addition, in the embodiments of the present disclosure, the signal processing chip may be placed closely with the transducer, so as to reduce the RC load and noise, and increase signal detection sensitivity, thereby facilitating the longer-distance detection.

It should be noted that, in the embodiment shown in FIG. 29, the TFT backplane and the terminal expansion layer are first prepared, and then the chips are bonded. However, the embodiments of the present disclosure are not limited thereto, and the respective chips may be bonded side by side or in a stacked manner, may face down or face up, may be die first or RDL first. The types of the base substrate SUB5 include, but are not limited to, a glass base substrate, a PCB, a FPC, and so on.

Figure 31:
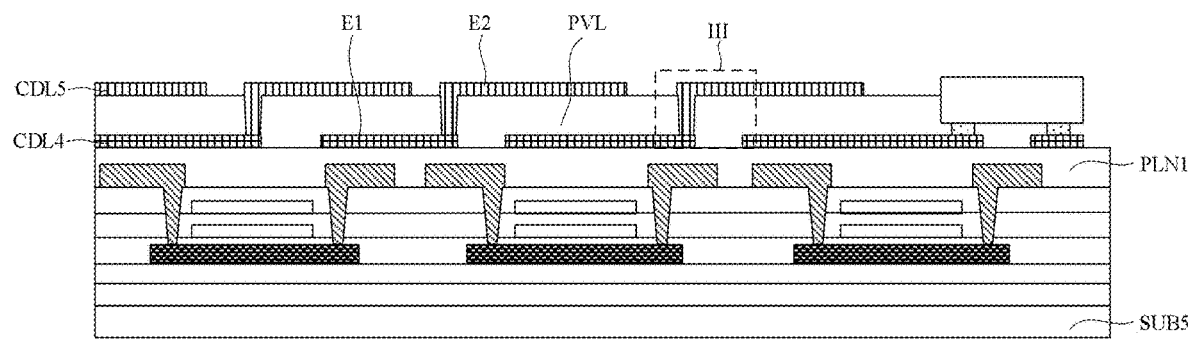
FIG. 31 schematically illustrates a cross-sectional view of a display apparatus integrated with a sensor according to some embodiments of the present disclosure, in which the sensor is a piezoelectric sensor including a piezoelectric film.

FIG. 31 schematically illustrates a cross-sectional view of a display apparatus integrated with a sensor according to some embodiments of the present disclosure, in which the sensor is a piezoelectric sensor including a piezoelectric film. Referring to FIG. 31, in this embodiment, a plurality of piezoelectric sensing units are prepared on a backplane including a TFT driving circuit, in which the plurality of piezoelectric sensing units are connected in series and bonded with a signal processing chip.

It should be noted that, in this embodiment, a "piezoelectric film" is taken as an example for description. However, the embodiments of the present disclosure are not limited thereto. For example, the semiconductor apparatus according to the embodiments of the present disclosure includes a sensor chip including other types of sensors, and the sensors may include other types of functional films. The expression "functional film" herein includes, but is not limited to, the piezoelectric film.

For example, the display apparatus may include a base substrate SUB5; a driving element arranged on the base substrate SUB5; a planarization layer PLN1 arranged on a side of the driving element away from the base substrate SUB5; a conductive layer CDL4 arranged on a side of the planarization layer PLN1 away from the base substrate SUB5; a piezoelectric film PVL arranged on a side of the conductive layer CDL4 away from the base substrate SUB5; and a conductive layer CDL5 arranged on a side of the piezoelectric film PVL away from the base substrate SUB5.

The piezoelectric sensing unit includes a first electrode E1, a second electrode E2, and the piezoelectric film PVL sandwiched between the first electrode E1 and the second electrode E2. For example, the piezoelectric film PVL may be a PVDF piezoelectric film. A plurality of first electrodes E1 are located in the conductive layer CDL4, and a plurality of second electrodes E2 are located in the conductive layer CDL5. The first electrode E1 and the second electrode E2 of each piezoelectric sensing unit are opposite and spaced apart.

Figure 32:
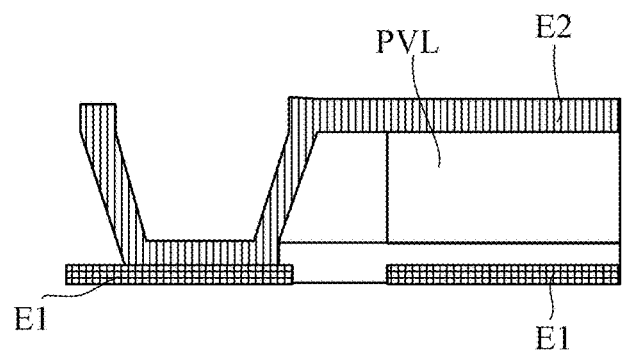
FIG. 32 is a partial enlarged view of a part III in FIG. 31.

FIG. 32 is a partial enlarged view of a part III in FIG. 31. With reference to FIGS. 31 and 32, in two adjacent piezoelectric sensing units, a first electrode E1 of one piezoelectric sensing unit is electrically connected to a second electrode E2 of the other piezoelectric sensing unit through a via hole or a groove. As such, the plurality of piezoelectric sensing units may be connected in series.

In a process of forming the plurality of piezoelectric sensing units, a conductive layer may be deposited first, and a plurality of first electrodes E1 may be formed through a patterning process; then a PVDF piezoelectric film layer may be spin-coated, and the PVDF piezoelectric film layer is cured and dry-etched, to form a patterned PVDF piezoelectric film; and then a conductive layer may be deposited, and a plurality of second electrodes E2 may be formed through a patterning process. For example, the PVDF piezoelectric film layer has a larger thickness, for example, a thickness thereof is on the order of several microns. Accordingly, a planarization layer may be formed on the piezoelectric film layer, after that, the second electrode E2 may be formed.

The signal processing chip may include at least two terminals p1. For example, the terminals p1 may face downward. One terminal p1 may be electrically connected to a first electrode E1 of an adjacent piezoelectric sensing unit, and another terminal p1 may be electrically connected to an expansion wire located in the conductive layer CDL4.

Figure 33A:
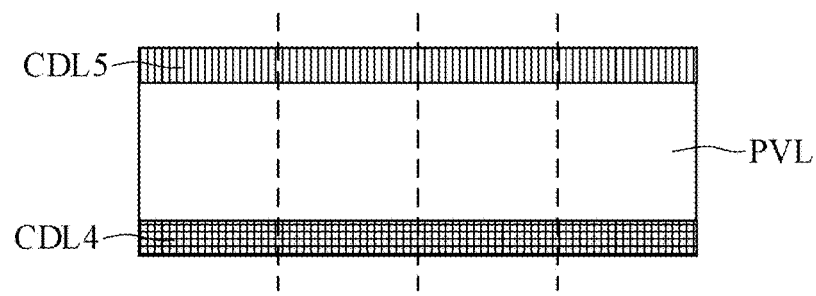
FIGS. 33A to 33C each schematically illustrates a cross-sectional view of a structure formed after performing some steps in a method for manufacturing a display apparatus integrated with a sensor according to some embodiments of the present disclosure, in which the sensor is a piezoelectric sensor including a piezoelectric film.
Figure 33B:
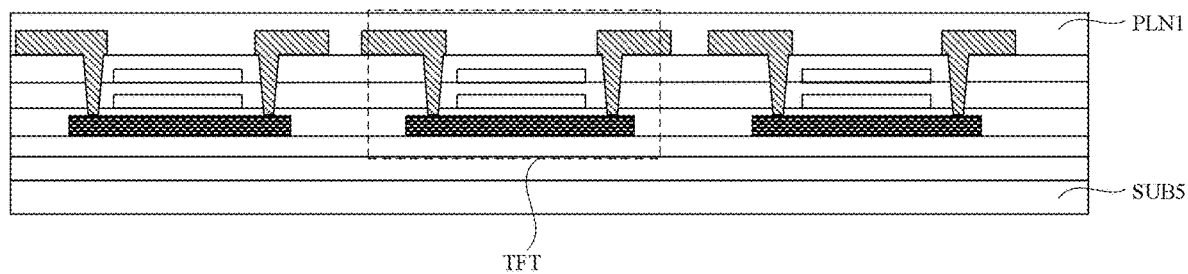
Figure 33C:
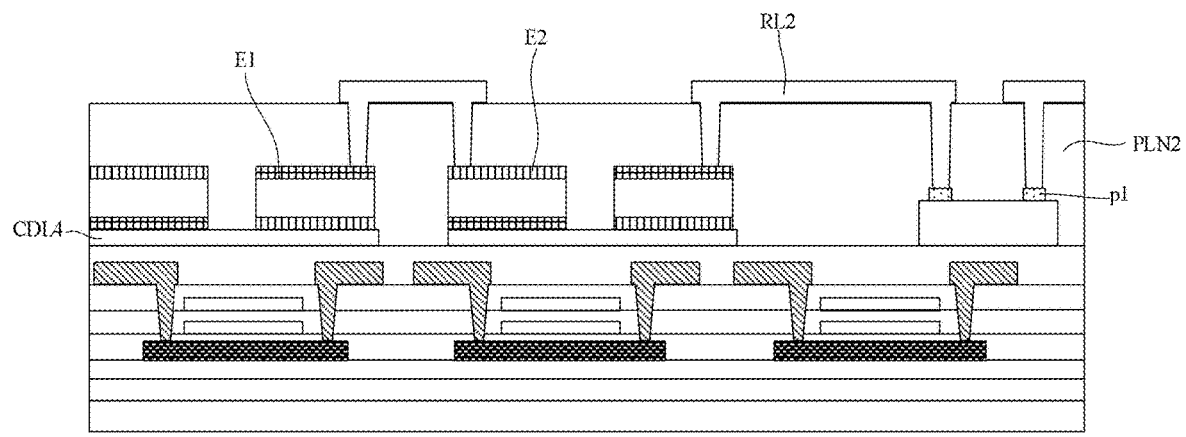

FIGS. 33A to 33C each schematically illustrates a cross-sectional view of a structure formed after performing some steps in a method for manufacturing a display apparatus integrated with a sensor according to some embodiments of the present disclosure, in which the sensor is a piezoelectric sensor including a piezoelectric film.

Referring to FIG. 33A, a piezoelectric sensor may be formed separately, and then a plurality of piezoelectric sensing units may be formed by splitting the piezoelectric sensor.

Referring to FIG. 33B, a backplane including a TFT driving circuit may be formed separately. For example, the backplane includes a base substrate SUB5; a driving element arranged on the base substrate SUB5; and a planarization layer PLN1 arranged on a side of the driving element away from the base substrate. For example, a conductive layer CDL4 may be formed on a side of the planarization layer PLN1 away from the base substrate.

Referring to FIG. 33C, a plurality of piezoelectric sensing units and a chip are arranged on the backplane. For example, at least two conductive portions are formed in the conductive layer CDL4, and the at least two conductive portions are arranged at intervals. Two adjacent piezoelectric sensing units with opposite polarities are placed on a same conductive portion. In the two piezoelectric sensing units placed on the same conductive portion, a first electrode E1 of one piezoelectric sensing unit and a second electrode E2 of the other piezoelectric sensing unit are in electrical contact with the conductive layer CDL4.

With reference to FIG. 33C, a planarization layer PLN2 is arranged on a side of the plurality of piezoelectric sensing units and the chip away from the base substrate, and a redistribution layer RDL2 is arranged on a side of the planarization layer PLN2 away from the base substrate. A plurality of first wires RL2 are formed in the redistribution layer RDL2. In two piezoelectric sensing units placed on different conductive portions, a second electrode E2 of one piezoelectric sensing unit is electrically connected to a first electrode E1 of the other piezoelectric sensing unit through a first wire RL2. In this way, the plurality of piezoelectric sensing units may be connected in series.

The signal processing chip may include at least two terminals p1. For example, the terminals p1 may face upward, one terminal p1 is electrically connected to a second electrode E2 of an adjacent piezoelectric sensor unit through a first wire RL2, and another terminal p1 may be electrically connected to an expansion wire located in the redistribution layer RDL2.

Figure 34:
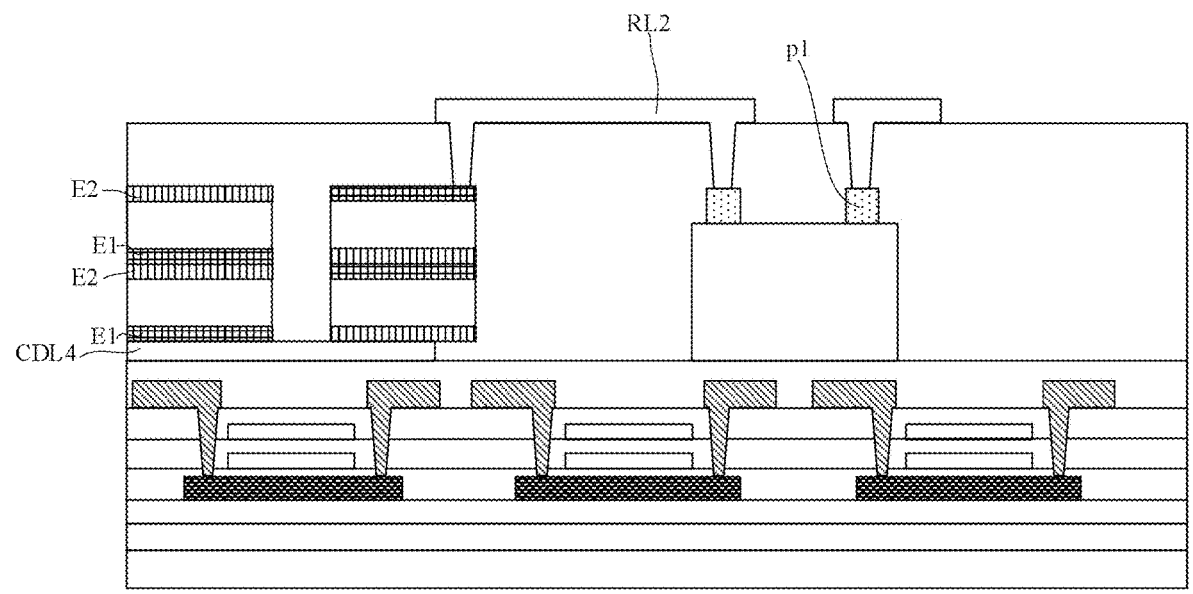
FIG. 34 schematically illustrates a cross-sectional view of a display apparatus integrated with a sensor according to some embodiments of the present disclosure.

FIG. 34 schematically illustrates a cross-sectional view of a display apparatus integrated with a sensor according to some embodiments of the present disclosure. Referring to FIG. 34, a plurality of piezoelectric sensing units may be stacked in an up-and-down bonding manner. For example, one piezoelectric sensor unit is placed on the above-mentioned conductive portion, a first electrode E1 thereof is in contact with the conductive portion, and a second electrode E2 thereof faces upward; another piezoelectric sensor unit is placed on the above-mentioned piezoelectric sensor unit, a first electrode E1 of the another piezoelectric sensing unit is in contact with the second electrode E2 of the above-mentioned piezoelectric sensing unit. In this way, the plurality of piezoelectric sensing units may also be connected in series.

In this embodiment, by separately preparing the piezoelectric sensor, the possible production line incompatibility problem may be solved, and the formation of via holes in a piezoelectric film layer with a large thickness is avoided, which may solve the odd-even polarization problem and reduce the process requirements of the piezoelectric film.

In the above-mentioned embodiments, for example, the driving circuit of the TFT driving element and each chip are arranged on a same base substrate, and the chip first process and chip later process are taken as examples for detailed description. However, the embodiments of the present disclosure are not limited thereto. For example, the driving circuit of the TFT driving element and each chip may be prepared on different base substrates, and then the semiconductor apparatus may be formed by cell-assembling.

FIGS. 35A to 35E each schematically illustrates a cross-sectional view of a structure formed after performing some steps in a method for manufacturing a semiconductor apparatus (e.g., a display apparatus) according to the exemplary embodiments of the present disclosure.

Figure 35A:
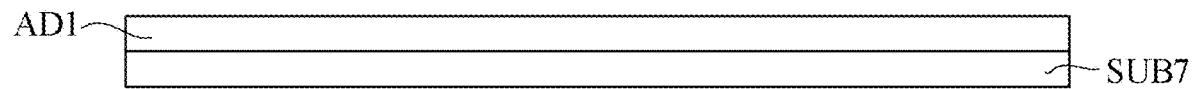
FIGS. 35A to 35E each schematically illustrates a cross-sectional view of a structure formed after performing some steps in a method for manufacturing a semiconductor apparatus (e.g., a display apparatus) according to the exemplary embodiments of the present disclosure.

Referring to FIG. 35A, an adhesive layer AD1 is coated on or attached to a base substrate SUB7.

Figure 35B:
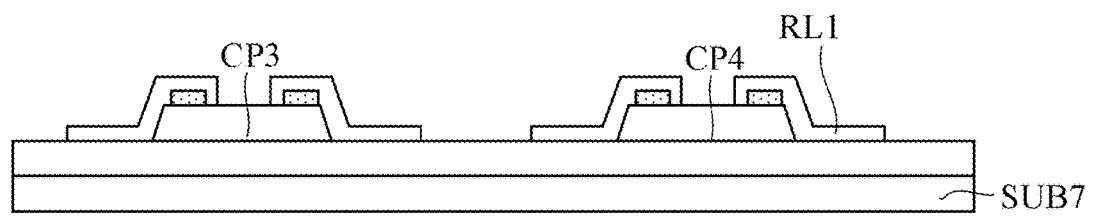

Referring to FIG. 35B, respective chips (for example, a LED chip CP3 and a functional element CP4) are transferred to the base substrate SUB7 through SMT or the mass transfer process, and is fixed on the base substrate SUB7 through the adhesive layer AD1.

For example, each chip may be located on the adhesive layer AD1, and a terminal p1 of each chip may face upward, that is, located on a side of the chip away from the base substrate.

The base substrate (which may be referred to as a backplane) on which the LED chip CP3 and the functional element CP4 are arranged is photographed, and a coordinate and an area of the terminal p1 of each of the LED chip CP3 and the functional element CP4 arranged on the backplane are determined through the image recognition technology, so as to generate a graphic file of a terminal area (that is, a pad area). Next, a metal layer is deposited on the backplane, a photoresist is coated on the metal layer, and the photoresist is patterned by digital direct writing or a digital exposure machine according to the above-mentioned graphic file. Then, according to the patterned photoresist, the metal layer is etched to form a terminal expansion layer RDL1. A plurality of expansion wires RL1 are formed in the terminal expansion layer RDL1, and the plurality of expansion wires RL1 may be electrically connected to the terminals p1 of the LED chip CP3 and the functional element CP4, respectively, so as to lead out respective terminals p1. That is, through the post-alignment process, the expansion wires RL1 for electrically connecting respective chips are formed in the terminal expansion layer RDL1.

Figure 35C:
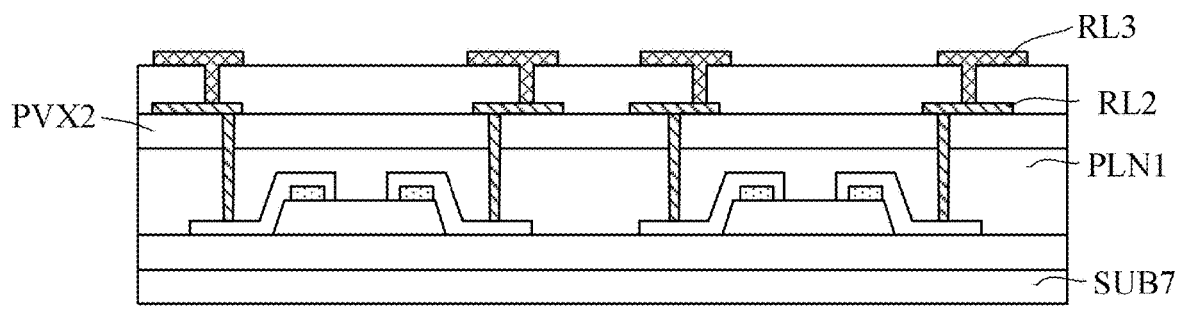

Referring to FIG. 35C, a planarization layer PLN1 is coated on a side of the terminal expansion layer RDL1 away from the base substrate.

For example, the planarization layer PLN1 may include a resin material for filling a segment gap between the LED chip CP3 and the functional element CP4, so as to achieve planarization.

In some embodiments, a passivation layer PVX2 may be prepared on a side of the planarization layer PLN1 away from the base substrate. For example, the passivation layer PVX2 may include a material such as silicon nitride, for isolating water vapor in the planarization layer PLN1, so as to prevent the water vapor in the planarization layer PLN1 from corroding the upper terminal extension layer.

With reference to FIG. 35C, a via hole passing through the planarization layer PLN1 and the passivation layer PVX2 may be formed, to expose at least part of each expansion wire RL1. Then, a metal layer is deposited on a side of the passivation layer PVX2 away from the base substrate, and a redistribution layer RDL2 is formed through a patterning process including photoresist coating, exposure, development, etching, etc. For example, a plurality of first wires RL2 are formed in the redistribution layer RDL2. The plurality of first wires RL2 may be electrically connected to the plurality of expansion wires RL1 through via holes, respectively, so as to lead out respective terminals p1.

In some embodiments, referring to FIG. 35C, after the above-mentioned post-alignment process is completed, a redistribution layer RDL3 may be prepared according to requirements of wire interconnection.

For example, a cover layer PLN2 may be formed on a side of the redistribution layer RDL2 away from the base substrate. Then, the redistribution layer RDL3 is formed on a side of the cover layer PLN2 away from the base substrate.

For example, the redistribution layer RDL3 may be prepared by a conventional lithography process, to form a second wire RL3, in the redistribution layer RDL3, for electrically connecting each chip. The embodiments of the present disclosure are not limited thereto, and the redistribution layer RDL3 may also be prepared through the post-alignment process.

For example, according to an expansion wire requirement, a fourth wiring layer, a fifth wiring layer, and the like may also be prepared, and the embodiments of the present disclosure are not particularly limited herein.

Figure 35D:
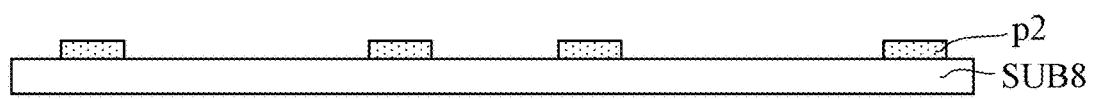

Referring to FIG. 35D, a backplane including a TFT driving element is prepared. For example, the backplane may include a base substrate SUB8; a driving element arranged on the base substrate SUB8; and a plurality of terminals p2 arranged on a side of the driving element away from the base substrate SUB8.

Figure 35E:
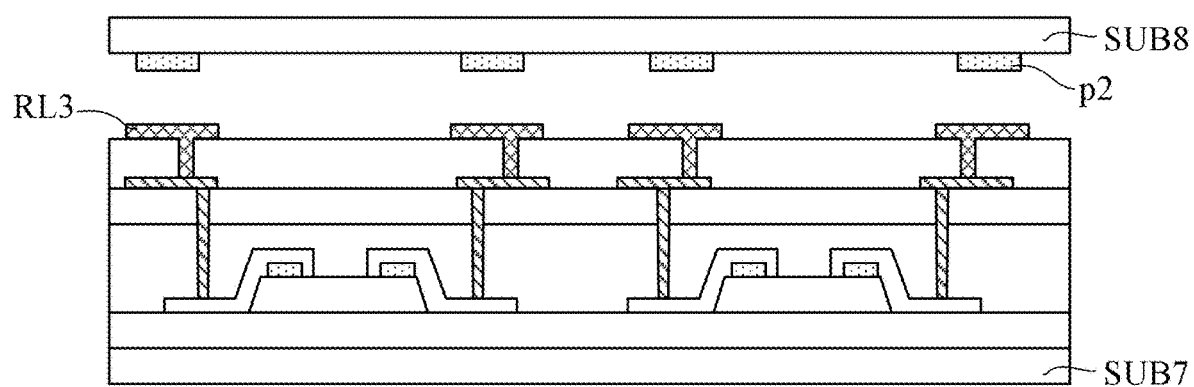

Referring to FIG. 35E, the backplane and the base substrate SUB7 provided with the chip are formed into a cell. For example, the plurality of terminals p2 on the backplane are electrically connected to the plurality of second wires RL3 located in the redistribution layer RDL3, respectively, so as to realize the electrical connection between the driving element and the chip.

As described above, in the embodiments of the present disclosure, the chips may be first arranged with a certain precision, and then positions, areas, and morphologies of the chips and terminals (i.e., pads) may be identified and analyzed through the post-alignment process, and a photolithography process is combined to realize high-precision automatic wiring and chip bonding. Through the post-alignment process, the bonding accuracy of a microchip may be improved, which is conducive to the integration of the chips and other circuits. In addition, since the post-alignment process is applied, requirements on the accuracy of the chip transfer process may be reduced, that is, it is beneficial to reduce the difficulty of the chip transfer process. Moreover, the automatic wiring process may simultaneously perform high-precision bonding of a large number of chips transferred in a large area, which improves the bonding efficiency and is more suitable for large-volume, large-area chip bonding.

Figure 36A:
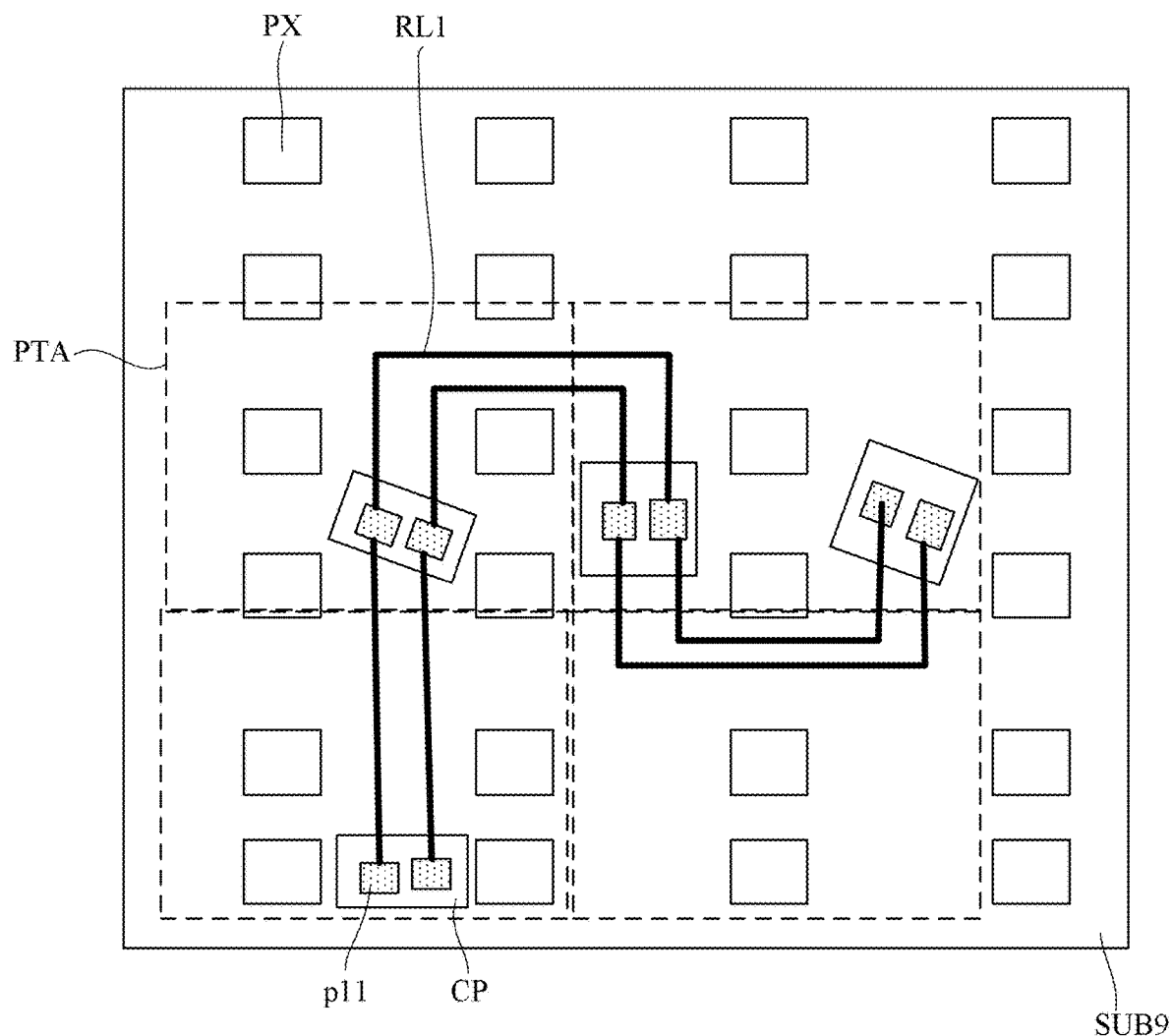
FIG. 36A schematically illustrates a top view of a plurality of expansion wires forming during a post-alignment process according to some embodiments of the present disclosure.

FIG. 36A schematically illustrates a top view of a plurality of expansion wires forming during a post-alignment process according to some embodiments of the present disclosure. In the embodiment shown in FIG. 36A, taking a display apparatus as an example, a partial top view of a display substrate is shown. Referring to FIG. 36A, a plurality of pixels PX are arranged on a base substrate SUB9. For example, the plurality of pixels PX may include, but are not limited to, display pixels for implementing a display function, sensor pixels for implementing a detection function, and the like. The display pixels include, but are not limited to, display elements such as OLEDs, micro LEDs, mini LEDs, and LCDs.

A plurality of chips CP are further arranged on the base substrate SUB9. For example, the plurality of chips CP may be transferred to the base substrate SUB9 through SMT or the mass transfer process. Then, a plurality of expansion wires RL1 are formed through the post-alignment process, so as to electrically connect the plurality of chips CP. For example, the base substrate (which may be referred to as a backplane) provided with the chips CP is photographed, and parameters such as a coordinate, an area and morphology of a terminal p11 of each chip CP arranged on the backplane are determined through the image recognition technology, so as to generate a graphic file of a terminal area (that is, a pad area). For example, FIG. 36A schematically illustrates a photographing area PTA corresponding to each chip CP. According to a coordinate of the terminal p11 of each chip CP relative to an origin of the base substrate SUB9, the coordinate of the terminal p11 of each chip CP may be determined; and the area and morphology of the terminal p11 of each chip CP may be determined through the image recognition technology.

In addition, in a process of recognizing and analyzing a photograph, the defect judgment and detection is performed for a visual graphic on the backplane, so as to identify an open connection on the backplane. A defective point on the backplane may be repaired using a metal expansion wire through the post-alignment process, and a chip that cannot be connected due to an excessive offset after the transfer is selected. For example, the image recognition technology may be used to determine coordinate information of each defective point.

Next, a metal layer is deposited on the backplane, a photoresist is coated on the metal layer, and the photoresist is patterned by digital direct writing or a digital exposure machine according to the above-mentioned graphic file. Then, according to the patterned photoresist, the metal layer is etched to form a terminal expansion layer RDL1. A plurality of expansion wires RL1 are formed in the terminal expansion layer RDL1, and the plurality of expansion wires RL1 may be electrically connected to terminals p11 of respective chips CP through via holes, so as to lead out respective terminals p11. That is, through the post-alignment process, the expansion wires RL1 for electrically connecting respective chips are formed in the terminal expansion layer RDL1.

For example, referring to FIG. 36A, a software may determine an automatic wiring path according to coordinates of terminals p11 of respective chips CP and the actual transfer of the chips on each base substrate. For example, in a process of determining the automatic wiring path, it may be considered to avoid a functional area such as an area of display pixels, so that the wiring path is distributed in gap areas among the pixels, thereby electrically connecting the chips.

For example, the photoresist may be patterned by digital direct writing or a digital exposure machine, according to the coordinate information of each defective point. Then, according to the patterned photoresist, the metal layer is etched to form a terminal expansion layer RDL1. A plurality of expansion wires RL1 are formed in the terminal expansion layer RDL1, and the plurality of expansion wires RL1 may be electrically connected to respective defective points through via holes, so as to repair these defective points.

Figure 39A:
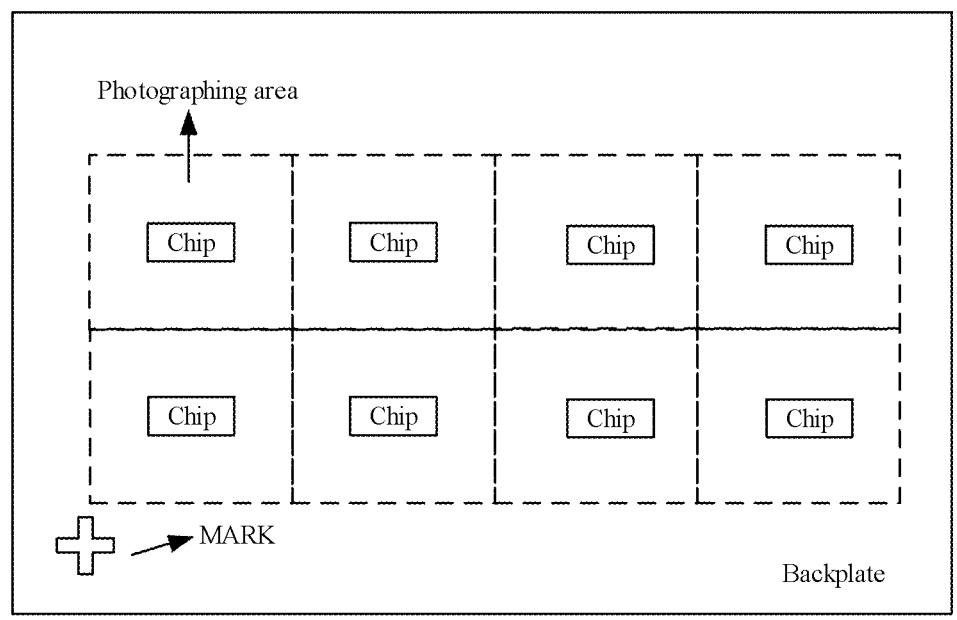
FIGS. 39A, 39B and 39C each schematically illustrates a photographing area formed in a post-alignment process.
Figure 39B:
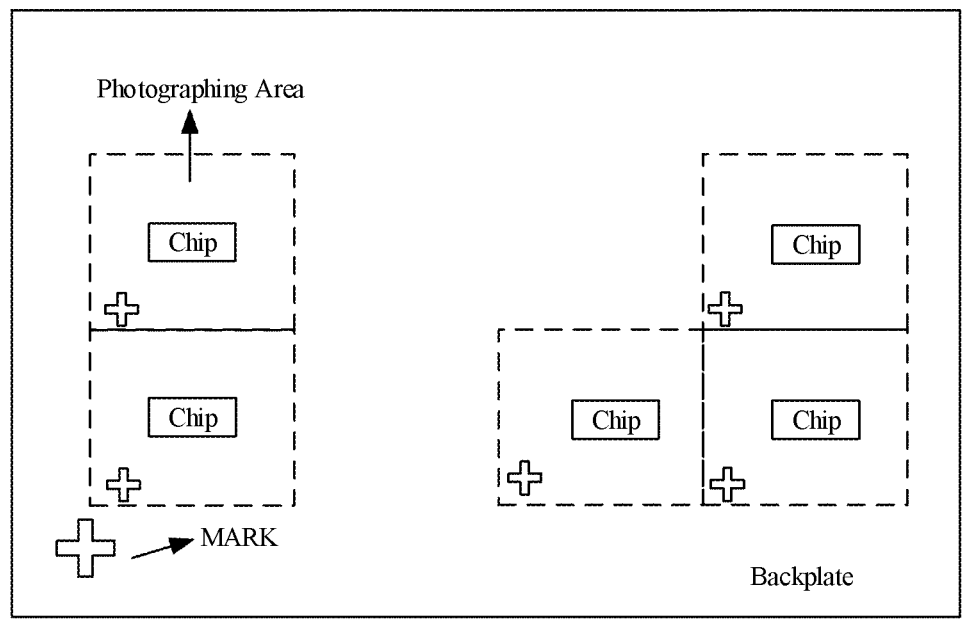
Figure 39C:
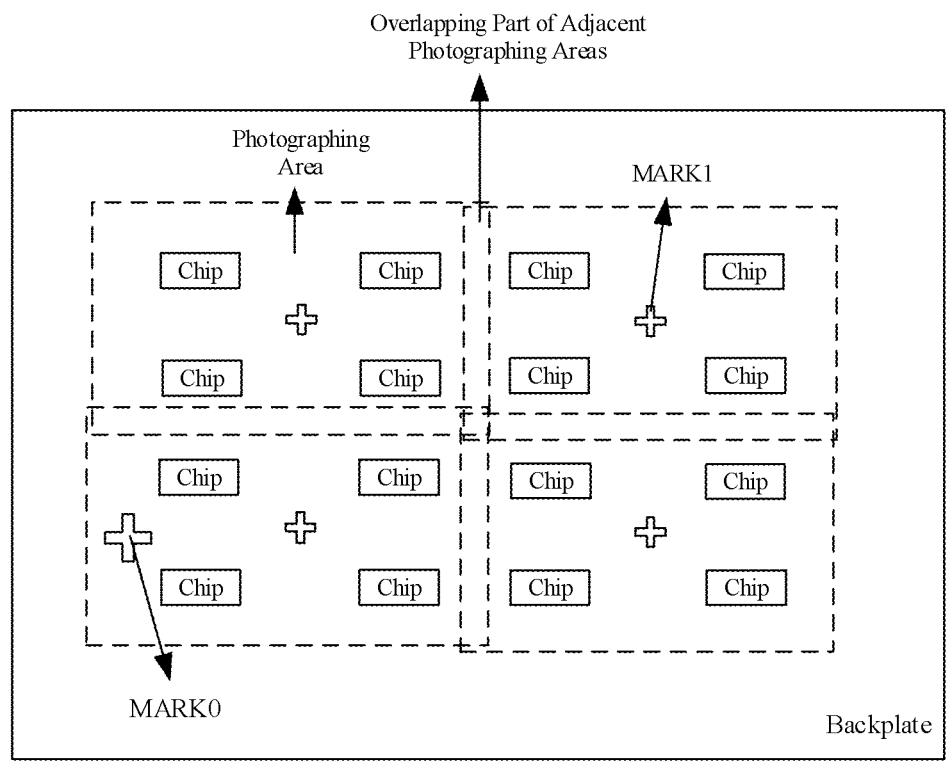

FIGS. 39A, 39B and 39C each schematically illustrates a photographing area formed in a post-alignment process. Referring to FIG. 39A, chips on a backplane may be close arranged chips across the screen, for example, micro LED chips in a display apparatus. In this case, taking a position calibration mark (MARK) of the entire backplane as an origin, the microscope takes photographs and then translates to a next photographing area at a fixed step distance. The actual number of photographs taken is related to the size of the backplane and the density of the chips. One or more chip may be arranged in a photographing area. Referring to FIG. 39B, the chips are not closely arranged on the backplane, that is, the number of the chips is small. In this case, a photographing area may be an area surrounding an ideal position of a chip, and coverage of the photographing area may be larger than a possible offset range of the chip, to ensure that the chip are within the photographing area. A position calibration mark (MARK) may be formed on the backplane as an origin, to determine the actual coordinates after the chips are transferred. Refer to FIG. 39C, position calibration marks (MARK1) regularly arranged on the backplane may be formed, so that a position between a position calibration mark (MARK1) in each single photograph and an overall absolute coordinate calibration mark (MARK0) of the backplane is relatively fixed, and this may be used to convert a chip position in each single photograph into an absolute position coordinate relative to the entire backplane. When there are a plurality of chips in a photographing area and an arrangement density of the chips is great, in order to prevent the machine movement error from causing adjacent photographs to be incompletely connected, and in order to avoid an edge image distortion problem of a single photograph caused by a lens imaging manner, an overlapping photographing area may be formed between adjacent photographing areas, to ensure that images of all chips are completely photographed. Since each single photograph has a position calibration mark (MARK1), there is no need for stitching images when performing image recognition on the chip coordinates. Only by calculating a coordinate of a position of a chip in a single photograph relative to a position calibration mark (MARK1) in the single photograph, and converting through the position relationship between the position calibration mark (MARK1) in the single photograph and the overall absolute coordinate calibration mark (MARK0) of the backplane, an absolute coordinate of the position of the chip in the single photograph relative to the overall absolute coordinate calibration mark (MARK0) of the backplane is obtained.

Figure 36B:
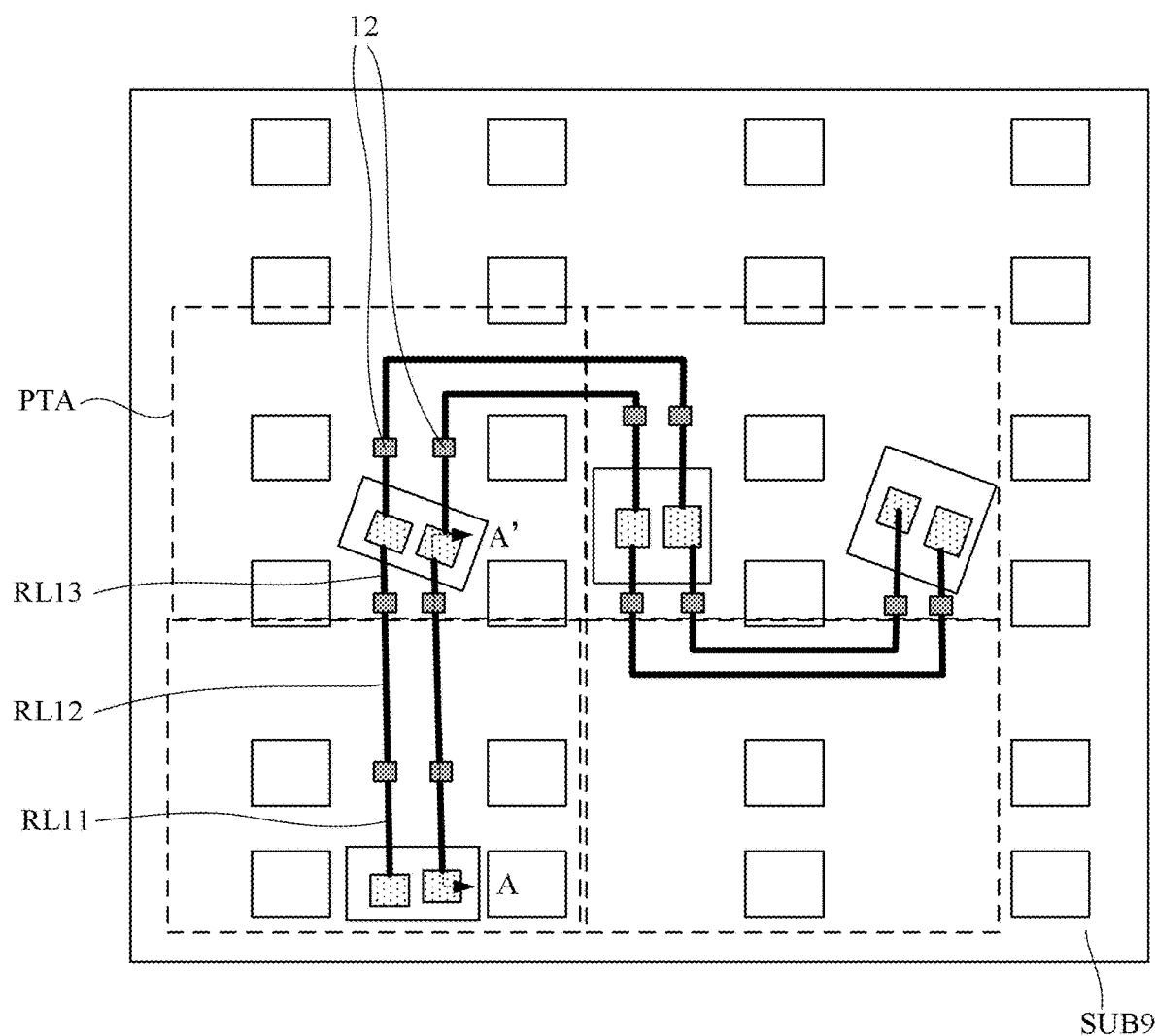
FIGS. 36B and 36C each schematically illustrates a top view of a plurality of expansion wires forming during a post-alignment process according to some embodiments of the present disclosure.
Figure 36C:
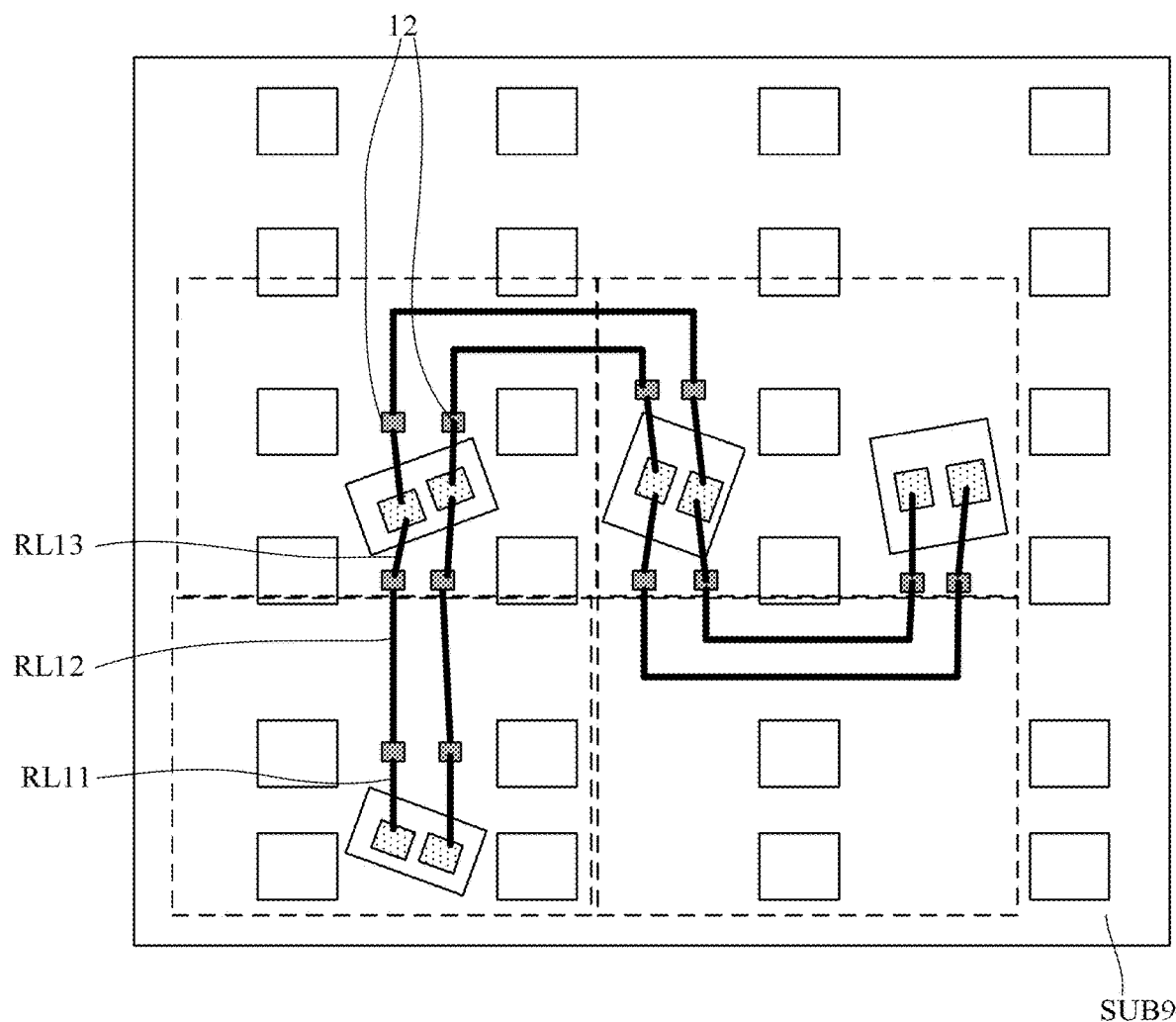
Figure 37A:
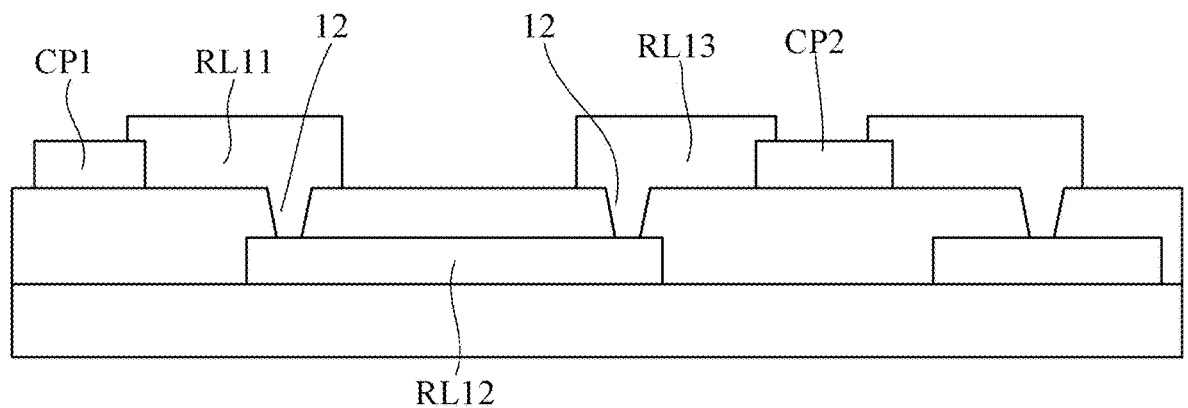
FIGS. 37A and 37B each schematically illustrates a cross-sectional view taken along a line AA' in FIG. 36B.
Figure 37B:
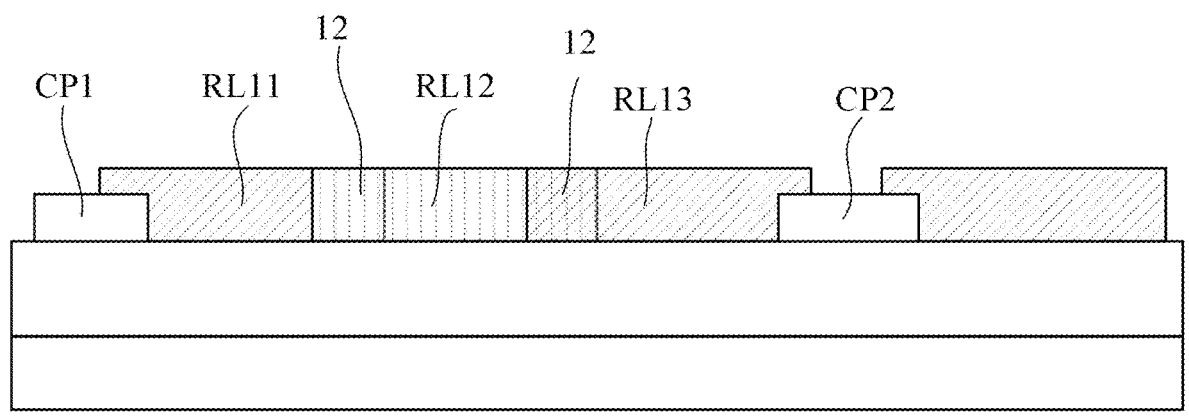
Figure 38:
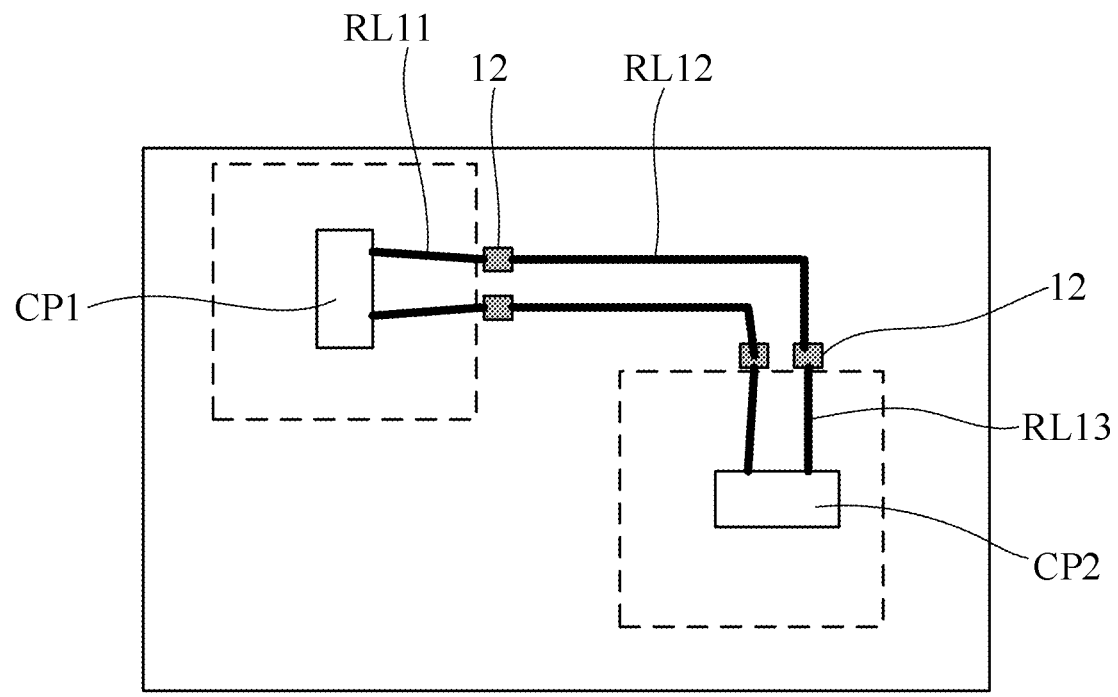
FIG. 38 schematically illustrates a partial enlarged view of wiring between two chips.

FIGS. 36B and 36C each schematically illustrates a top view of a plurality of expansion wires forming during a post-alignment process according to some embodiments of the present disclosure. FIGS. 37A and 37B each schematically illustrates a cross-sectional view taken along a line AA' in FIG. 36B. FIG. 38 schematically illustrates a partial enlarged view of wiring between two chips.

Referring to FIGS. 36B and 38, in the embodiments of the present disclosure, a plurality of fixed connection portions 12 may be arranged on a base substrate SUB9. For example, at least two fixed connection portions 12 may be arranged close to each chip CP. An expansion wire used to electrically connect two chips CP may include at least a first wire segment RL11 for connecting a terminal p1 of one chip of the two chips CP and a fixed connection portion 12 adjacent to the chip, and a second wire segment RL12 for connecting two fixed connection portions 12 between the two chips, and a third wire segment RL13 for connecting a terminal p1 of the other chip of the two chips CP and a fixed connection portion 12 adjacent to the other chip.

It should be noted that, in this embodiment, for ease of description, the expressions such as first wire segment, second wire segment, and third wire segment are used. It should be understood that, the first wire segment and the third wire segment are each used to electrically connect a terminal of a chip and a fixed connection portion, thus they may all be referred to as first wire segment; and the second wire segment is used to electrically connect two fixed connection portions. The expressions such as the first wire segment and the second wire segment may also be used to distinguish different parts of an expansion wire.

For example, each chip CP may have a sign that may distinguish different pads according to photographs, and actual coordinate of each chip is determined by calculation after the photographed image is recognized and analyzed. The sign on the chip may include, but is not limited to, a feature such as morphology, shape, dimension, and direction of the pad on the chip. In some embodiments, a special feature may be set to distinguish pads of different chips.

For example, the second wire segment RL12 described above may be formed on the backplane through a conventional lithography process, and the post-alignment process described above is only used to form the first wire segment RL11 and the third wire segment RL13. Referring to FIG. 37A, the first wire segment RL11 and the third wire segment RL13 may be located in the terminal expansion layer RDL1, and the second wire segment RL12 is located in a layer different from the terminal expansion layer RDL1.

For example, the above-mentioned first wire segment RL11, second wire segment RL12, and third wire segment RL13 may each be formed through the post-alignment process. Referring to FIG. 37B, the above-mentioned first wire segment RL11, second wire segment RL12, and third wire segment RL13 may be located in the terminal expansion layer RDL1. That is, the above-mentioned first wire segment RL11, second wire segment RL12, and third wire segment RL13 may be metal expansion wires arranged in a same layer.

For example, a space between the fixed connecting portion 12 and the center of an ideal transfer position of the chip may be greater than the maximum offset that may occur during the chip transfer process. For example, in a case that the maximum offset that may occur during the chip transfer process is about 10 micrometers, the space between the fixed connection portion 12 and the center of the ideal transfer position of the chip is greater than 10 micrometers.

It should be understood that, wiring paths between respective fixed connection portions 12 are relatively fixed. For example, for a same product, the wiring paths between the respective fixed connection portions 12 may be set to be the same, that is, the wiring paths of the second wire segments RL12 are the same. In this way, when calculating and determining wiring paths, there is no need to calculate a wiring path of each second wire segment RL12, so that the complexity of automatic wiring may be reduced. When determining the wiring paths, wiring paths between terminals of each chip and fixed connection portions may be accurately calculated according to an actual position of the each chip after the transfer, that is, the wiring paths are locally updated according to the actual position of each chip, which is conducive to an improvement of the accuracy and efficiency of automatic wiring.

With reference to FIGS. 36B and 36C, at least one second wire segment RL12 extends in a first direction or a second direction. In two chips electrically connected through an expansion wire that includes the second wire segment RL12 extending in the first direction or the second direction, a relative position of one chip in the first direction is different from a relative position of the other chip in the first direction.

For example, in two chips that are electrically connected through an expansion wire that includes at least one second wire segment, at least one chip is inclined with respect to an extension line of the second wire segment RL12. For example, four chips shown in FIG. 36C.

For example, in two chips that are electrically connected through an expansion wire that includes at least one second wire segment, an orientation of one chip with respect to an extension line of the second wire segment RL12 is different from an orientation of the other chip with respect to the extension line of the second wire segment RL12. For example, two chips on the left shown in FIG. 36B.

For example, in two chips that are electrically connected through an expansion wire that includes at least one second wire segment, each chip includes a plurality of terminals including at least a first terminal (e.g., a left terminal of the chip shown in FIGS. 36B and 36C) and a second terminal (e.g., a right terminal of the chip shown in FIGS. 36B and 36C). A second wire segment RL12 included in an expansion wire for electrically connecting first terminals of the two chips, and a second wire segment RL12 included in an expansion wire for electrically connecting second terminals of the two chips, are parallel to each other, and/or, a length of the second wire segment RL12 included in the expansion wire for electrically connecting the first terminals of the two chips and a length of the second wire segment RL12 included in the expansion wire for electrically connecting the second terminals of the two chips are substantially the same.

For example, at least one of the first wire segments RL11 and RL13, and the second wire segment RL12 adjacent thereto and electrically connected thereto have an angle, and the angle is greater than 0° and less than 180°.

For example, in the two first wire segments RL11 and RL13 that are adjacent to and electrically connected to the same second wire segment RL12, one first wire segment RL11 and the second wire segment RL12 adjacent thereto and electrically connected thereto have an angle different from an angle between the other first wire segment RL13 and the second wire segment RL12 adjacent thereto and electrically connected thereto.

For example, in two first wire segments electrically connected to a first terminal and a second terminal of a same chip, one first wire segment RL11 and a second wire segment RL12 adjacent thereto and electrically connected thereto have an angle different from an angle between the other first wire segment RL11 and a second wire segment RL12 adjacent thereto and electrically connected thereto.

For example, second wire segments RL12 between respective fixed connection portions 12 may be used as a bus that can be shared by different products, according to a common feature of the products, such as transfer accuracy deviation or chip connection manner. Alternatively, the second wire segments RL12 may be electrically connected to a gate circuit on a chip or a backplane, so as to be used as an intelligent bus with gate function.

Referring to FIGS. 36B and 36C, for a same product, due to an influence of the accuracy of the transfer process, an actual position of each chip may be different. As the fixed connection portions 12 are provided, wiring paths of second wire segments RL12 between the fixed connection portions 12 may be the same. When actual wiring paths are calculated, it is only necessary to layout and update wiring paths of the first wire segments RL11 and the third wire segments RL13 described above.

Figure 40A:
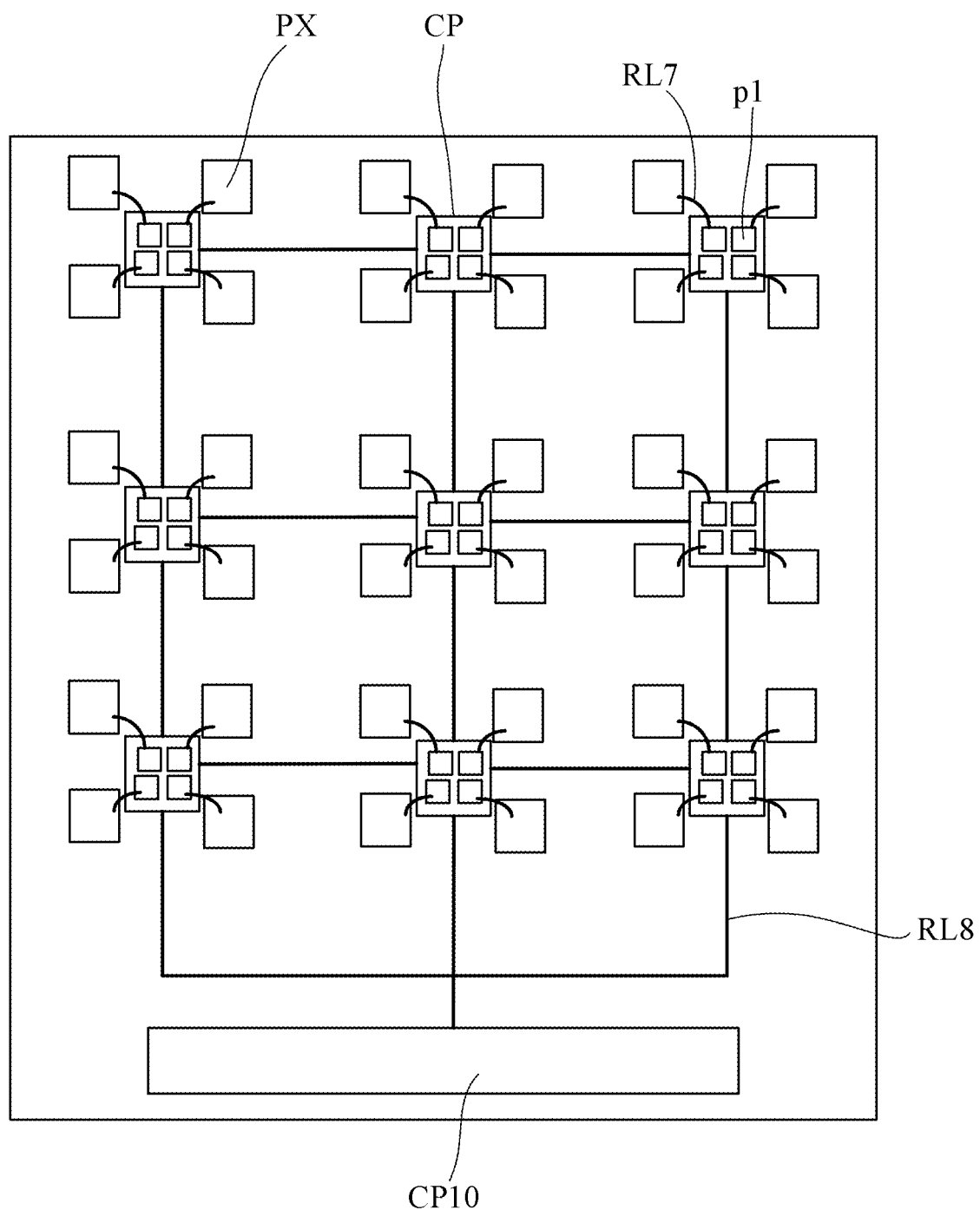
FIGS. 40A to 40C each schematically illustrates an arrangement of a driver chip and a pixel of a display apparatus according to the embodiments of the present disclosure.
Figure 40B:
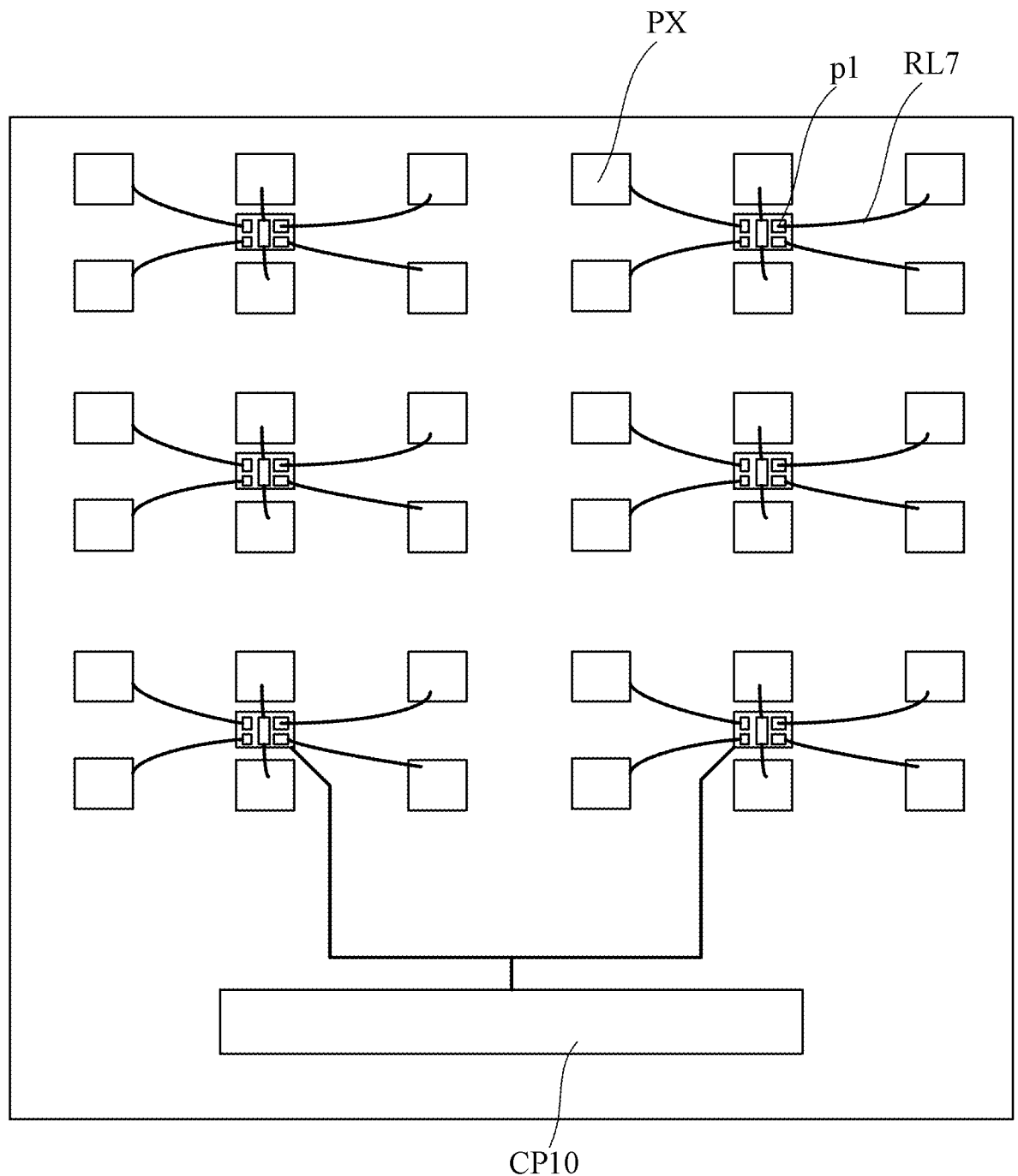
Figure 40C:
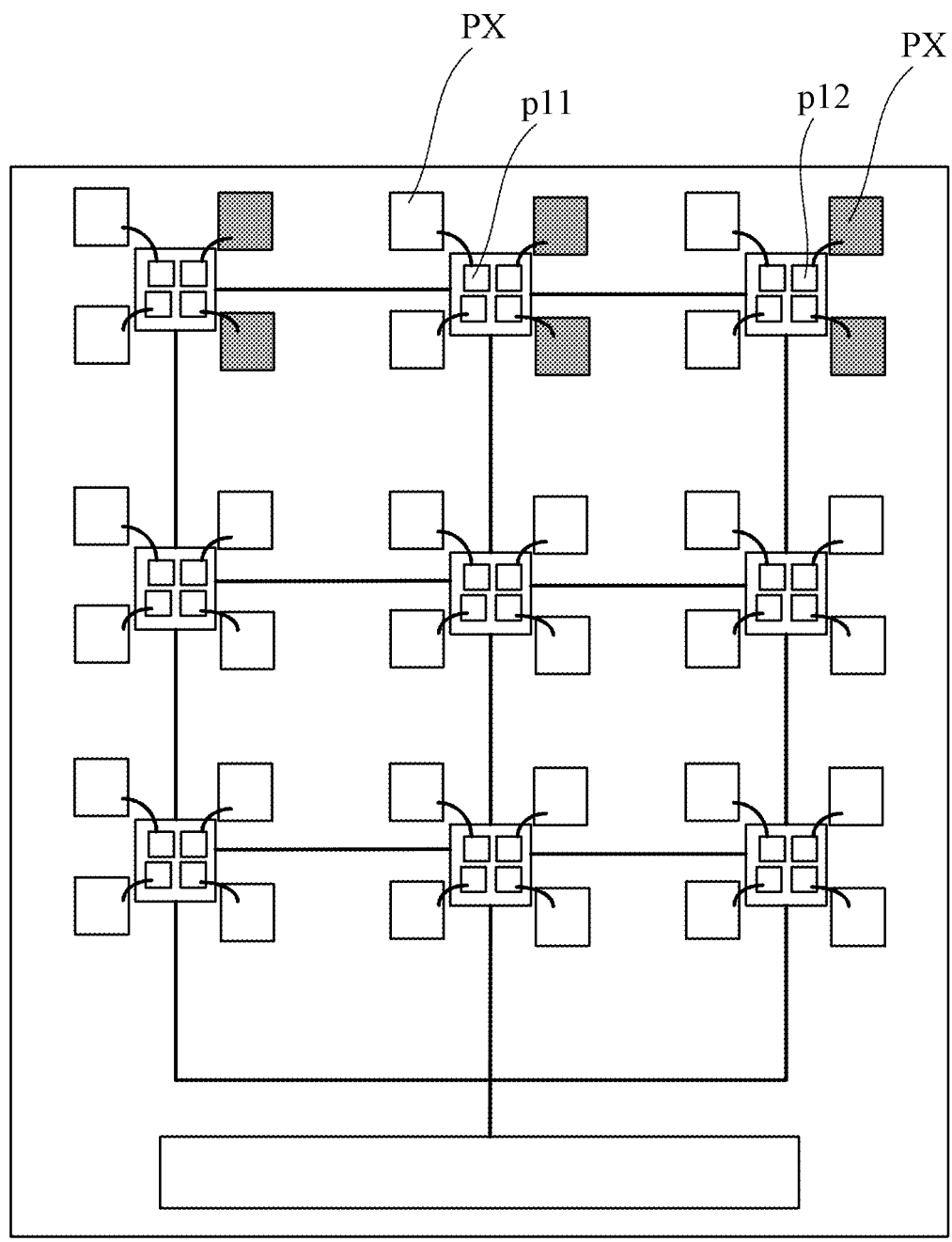

In the embodiments of the present disclosure, the semiconductor apparatus may be a display apparatus. A driving element of the display apparatus may be provided in a form of a driver chip. FIGS. 40A to 40C each schematically illustrates an arrangement of a driver chip and a pixel of a display apparatus according to the embodiments of the present disclosure.

For example, the driver chip CP1 used as a driving element may be electrically connected to a corresponding part of a pixel, so that the driver chip CP1 may drive a plurality of pixels PX. In other words, in the embodiments of the present disclosure, there is no need to provide a driving circuit on a backplane. For example, the plurality of pixels PX may include, but are not limited to, display pixels for realizing a display function, sensor pixels for realizing a detecting function, etc. The display pixels include, but are not limited to, display elements such as OLEDs, micro LEDs, mini LEDs, and LCDs.

Referring to FIG. 40A, one chip CP may include at least two terminals p1, for example, four terminals p1. At least two pixels PX, for example, four pixels PX, may be arranged around a chip CP. Four terminals p1 of a chip CP are electrically connected to four pixels PX surrounding the chip through expansion wires RL7, respectively. For example, if the pixel PX is a display pixel, a terminal p1 of a chip CP is electrically connected to an anode of the display pixel through an expansion wire RL7, and the chip CP may provide a driving signal to the display pixel. If the pixel PX is a sensor pixel, a terminal p1 of a chip CP is electrically connected to an electrode of the sensor pixel through an expansion wire RL7, and the chip CP may receive a sensing signal from the sensor pixel and process the received sensing signal (such as filtering and amplifying the received sensing signal).

For example, a plurality of chips CP may be electrically connected to a master control chip CP10 through an expansion wire RL8.

For example, for the display pixel, a chip CP may be a driver chip; for the sensor pixel, a chip CP may be a power amplifier chip, and the master control chip CP10 may be an ADC chip.

In the embodiments of the present disclosure, the expansion wire RL7 and the expansion wire RL8 may be located in a same terminal expansion layer. Alternatively, the expansion wire RL7 and the expansion wire RL8 may be located in different terminal expansion layers. For example, the expansion wire RL7 and the expansion wire RL8 may be formed through the above-mentioned post-alignment process.

The manner for wiring the expansion wire RL7 and the expansion wire RL8 may be determined according to spaces among the chips. If the chips are relatively close to each other, for example, the spaces are same as a size of a plurality of pixels, a direct expansion wiring manner may be adopted according to actual coordinates of the chips. If the spaces among the chips are relatively large and connection paths are relatively complicated, a manner combining fixed expansion wiring and flexible expansion wiring, which is proposed in the above-mentioned embodiments, may be adopted. For example, the expansion wires RL8 among the chips may adopt the fixed expansion wiring manner, and the expansion wires RL7 between the chip and the pixel may adopt the flexible expansion wiring manner.

For example, one master control chip CP10 and a plurality of chips CP may constitute a chip set, and one or more such chip sets may be provided on the backplane.

It should be noted that, a corresponding relationship between the number of chips CP with driving circuits and the number of pixels PX may be determined according to PPI of a display apparatus and a space provided by the display apparatus for expansion wires. For example, the chips CP and the pixels PX may be in one-to-one corresponding, alternatively, one chip CP may correspond to all pixels PX on the backplane.

Referring to FIG. 40B, the pixels PX on the backplane may be of different types. For example, the pixels PX may include red sub-pixels (i.e., R sub-pixels), green sub-images (i.e., G sub-pixels), and blue sub-pixel (i.e., B sub-pixel). In this case, a chip CP may have six terminals p1 (i.e., six interfaces). The six terminals p1 are electrically connected to R/G/B sub-pixels of two pixels through expansion wires RL7, respectively.

Referring to FIG. 40C, both the display pixels and the sensor pixels may be arranged on the backplane. In this case, a chip CP may have interfaces (that is, terminals) with different functions, such as a driving interface and a power amplifier interface. Through the above-mentioned post-alignment process, a position of a pad of a chip is determined after image recognition, and a chip CP is correctly connected to each pixel PX. For example, the display pixel PX may be electrically connected to a terminal p11 of a chip CP, and the sensor pixel PX may be electrically connected to a terminal p12 of the chip CP.

Figure 41:
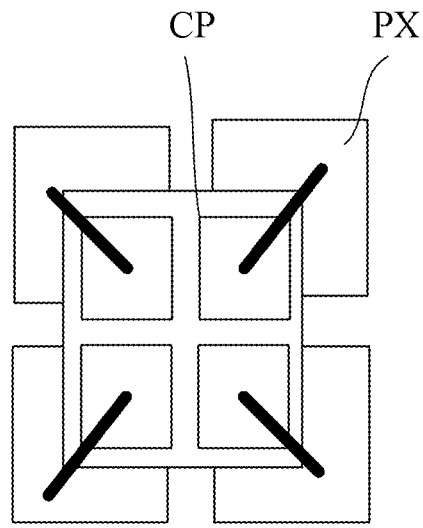
FIG. 41 schematically illustrates a projection relationship between a chip and a pixel.

In the embodiments of the present disclosure, the display apparatus may include a light-emitting element. For example, the light-emitting element may be a top-emission type, and the chip CP described above may be arranged below the light-emitting element. Alternatively, the light-emitting element may be a bottom-emission type, and the chip CP described above may be arranged above the light-emitting element. FIG. 41 schematically illustrates a projection relationship between a chip and a pixel. Referring to FIG. 41, an orthographic projection of a chip CP on the base substrate may partially overlap with an orthographic projection of a plurality of pixels PX on the base substrate. As such, a display apparatus with a higher PPI may be realized.

In the embodiments of the present disclosure, a method for driving a chip on a smaller scale may be realized. In addition, as a plurality of master control chips may be arranged, the master control chips may further be electrically connected to a higher-level control chip, so that each area may be separately controlled.

Figure 42:
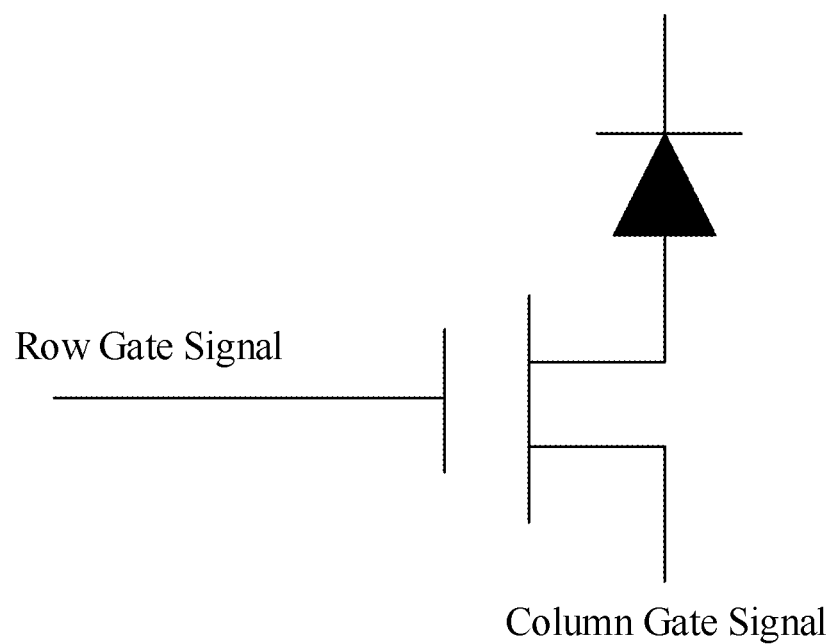
FIG. 42 is a schematic diagram of a gate TFT of a gate chip according to the embodiments of the present disclosure.
Figure 43:
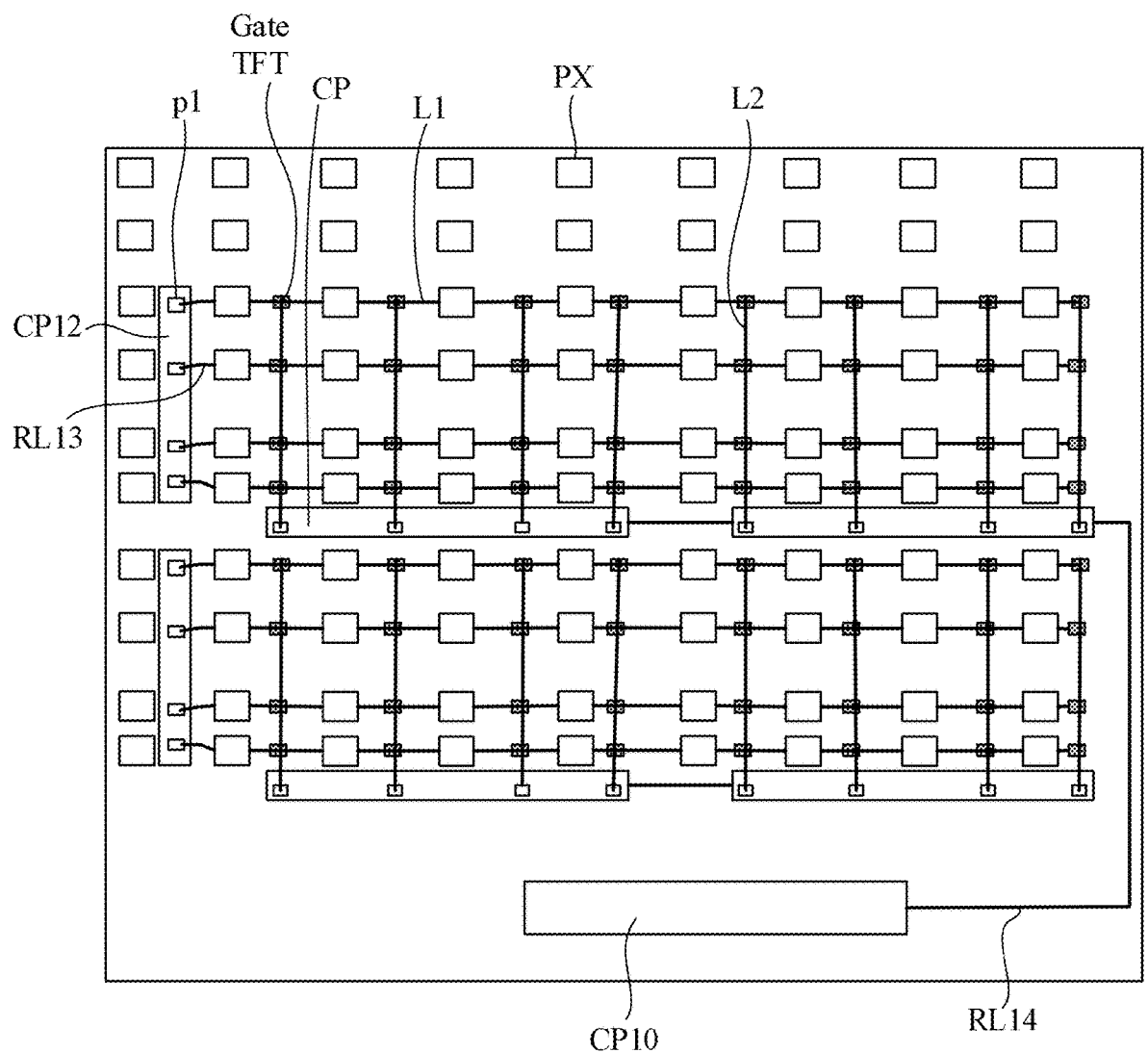
FIG. 43 is a partial plan view of a display apparatus including a gate chip according to the embodiments of the present disclosure.
Figure 44A:
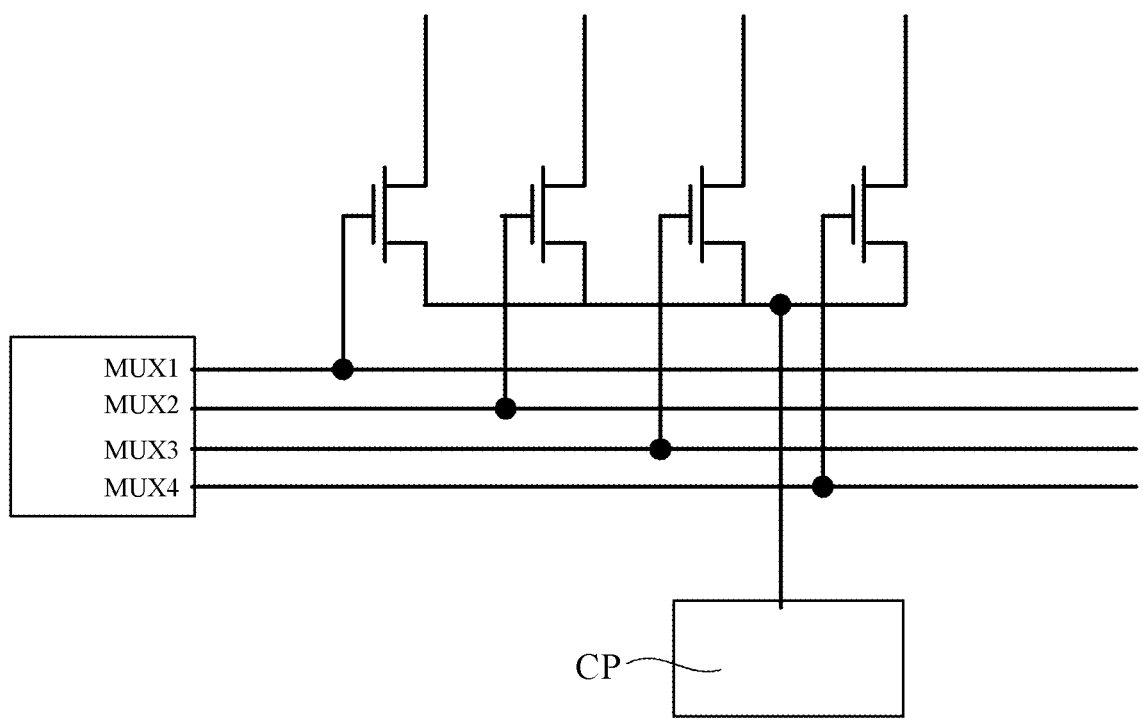
FIGS. 44A and 44B are each a circuit connection diagram of a display apparatus including a gate chip according to the embodiments of the present disclosure.
Figure 44B:
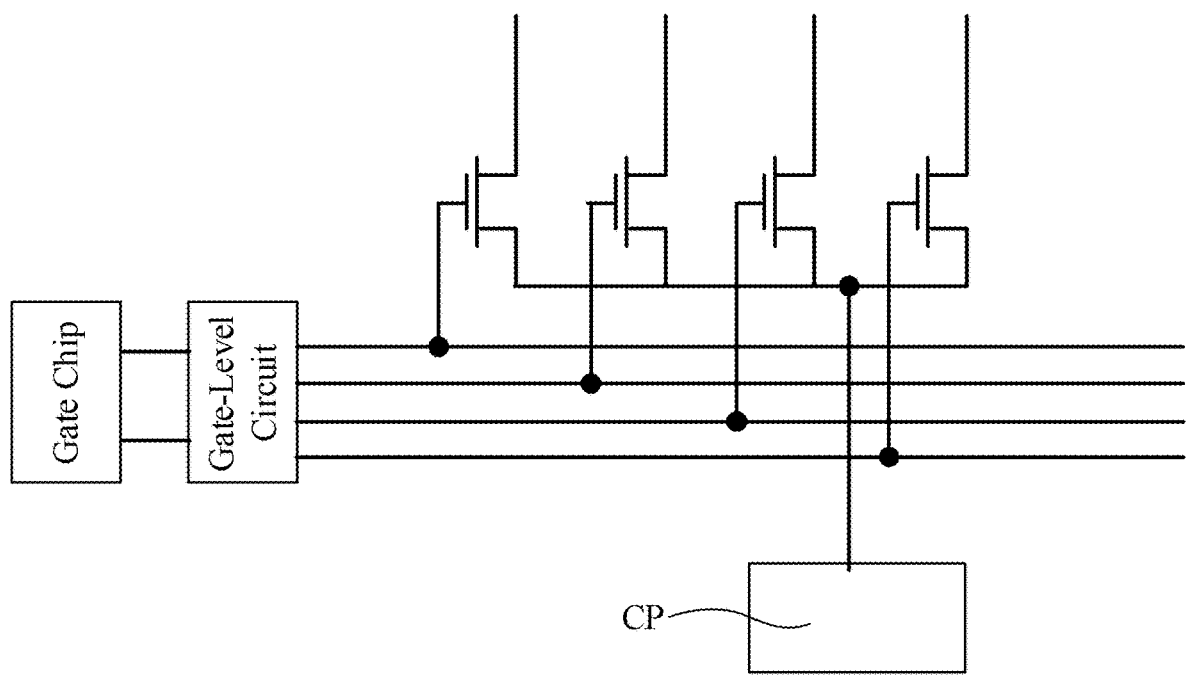

In the embodiments of the present disclosure, the display apparatus may include a gate chip CP12 arranged on the backplane. For example, the gate chip CP12 may include a gate TFT or a gate-level circuit. FIG. 42 is a schematic diagram of a gate TFT of a gate chip according to the embodiments of the present disclosure. FIG. 43 is a partial plan view of a display apparatus including a gate chip according to the embodiments of the present disclosure. FIGS. 44A and 44B are each a circuit connection diagram of a display apparatus including a gate chip according to the embodiments of the present disclosure.

With reference to FIGS. 42 to 44B, the display apparatus may include a gate chip CP12, a chip CP, and a master control chip CP10. The gate chip CP12 may include at least two ports (e.g., four ports MUX1/MUX2/MUX3/MUX4), and the chip CP may include at least two terminals p1 (for example, four terminals p1). A plurality of pixels PX in a same row may be electrically connected through a row signal connection line L1, and a plurality of pixels PX in a same column may be electrically connected through a column signal connection line L2. The ports MUX1 to MUX4 of one gate chip CP12 may be electrically connected to a plurality of row signal connection lines L1 through expansion wires RL13, respectively. A terminal p1 of a chip CP may be electrically connected to the plurality of pixels in the same column through a plurality of gate TFTs, respectively. The gate chip CP12 and the chip CP may also be electrically connected to the master control chip CP10 through an expansion wire RL14. For example, a plurality of gate chips, at least one master control chip, and a plurality of chips may constitute a chip set, and a plurality of such chip sets may be arranged on the backplane.

For example, under a control of a row gate signal transmitted from a certain port of the gate chip CP12, pixels in a certain row may be controlled to be turned on. Under a control of a column gate signal, a corresponding chip CP may be controlled to transmit a driving signal to pixels in a certain column. In this way, under the control of a gate signal, the partition display and individual control of the pixels on the backplane can be realized.

Similarly, for example, the pixels PX may include, but are not limited to, display pixels for realizing a display function, sensor pixels for realizing a detection function, etc. The display pixels include, but are not limited to, display elements such as OLEDs, micro LEDs, mini LEDs, and LCDs.

For example, for the display pixel, a chip CP may be a driver chip; and for the sensor pixel, a chip CP may be a power amplifier chip, and the master control chip CP10 may be an ADC chip.

It should be noted that, some steps in the above-mentioned method may be performed separately or in combination, and may be performed in parallel or sequentially, and are not limited to the specific operation sequence shown in the figures.

As used herein, the terms "substantially", "about", "approximately" and other similar terms are used as approximate terms rather than as terms of degree, and they are intended to explain the inherent deviations of measured or calculated values that will be recognized by those of ordinary skilled in the art. Given factors such as process fluctuations, measurement problems, and errors related to measurement of a specific quantity (i.e., the limitations of the measurement system), as used herein, "about" or "approximately" includes the stated value, and means that the specific value determined is within an acceptable range of deviation for those of ordinary skilled in the art. For example, "about" can mean within one or more standard deviations, or within ±10% or ±5% of the stated value.

Although some embodiments according to the general inventive concept of the present disclosure have been illustrated and described, those of ordinary skilled in the art will understand that without departing from the principles and spirit of the general inventive concept of the present disclosure, changes can be made to these embodiments, and the scope of the present disclosure is defined by claims and their equivalents.

What is claimed is:
1. A semiconductor apparatus, comprising:
    a base substrate;
    a plurality of chips arranged on the base substrate, wherein each of the plurality of chips comprises a chip main body and a plurality of terminals arranged on the chip main body;
    a plurality of fixed connection portions arranged on the base substrate, wherein the plurality of fixed connection portions are arranged adjacent to the plurality of chips, respectively;
    a terminal expansion layer arranged on the base substrate, wherein the terminal expansion layer comprises a conductive material; and
    a plurality of expansion wires in the terminal expansion layer, wherein the plurality of expansion wires are configured to electrically connect the plurality of chips, wherein each of the plurality of expansion wires comprises at least one first wire segment and a second wire segment, and each of the at least one first wire segment is configured to electrically connect a terminal of one of two chips among the plurality of chips and one fixed connection portion of the plurality of fixed connection portions adjacent to the one of the two chips among the plurality of chips, and the second wire segment is configured to connect two fixed connection portions among the plurality of fixed connection portions between the two chips among the plurality of chips,
    wherein the plurality of terminals comprise at least a first terminal and a second terminal, and two of the plurality of expansion wires are configured to electrically connect the two chips among the plurality of chips;

wherein one of the two of the plurality of expansion wires is configured to electrically connect respective first terminals of the two chips, and the other of the two of the plurality of expansion wires is configured to electrically connect respective second terminals of the two chips; and wherein the one of the two of the plurality of expansion wires configured to electrically connect the respective first terminals of the two chips comprises the second wire segment parallel to the second wire segment comprised in the other of the two of the plurality of expansion wires configured to electrically connect the respective second terminals of the two chips, and/or the one of the two of the plurality of expansion wires configured to electrically connect the respective first terminals of the two chips comprises the second wire segment having a length equal to a length of the second wire segment comprised in the other of the two of the plurality of expansion wires configured to electrically connect the respective second terminals of the two chips.

2. The semiconductor apparatus according to claim 1, wherein the second wire segment extends in a first direction; and in two chips among the plurality of chips electrically connected through one of the plurality of expansion wires comprising the second wire segment that extends in the first direction, a relative position of one of the two chips among the plurality of chips in the first direction is different from a relative position of the other one of the two chips among the plurality of chips in the first direction.

3. The semiconductor apparatus according to claim 2, wherein in two chips among the plurality of chips electrically connected through one of the plurality of expansion wires comprising the second wire segment, at least one of the two chips among the plurality of chips is inclined relative to an extension line of the second wire segment.

4. The semiconductor apparatus according to claim 2, wherein the at least one first wire segment and the second wire segment adjacent to and electrically connected to the at least one first wire segment have an angle greater than 0° and less than 180°.

5. The semiconductor apparatus according to claim 2, wherein the plurality of expansion wires comprise a plurality of first wire segments located in a same layer, and the second wire segment and the at least one first wire segment are located in a same layer or in different layers.

6. The semiconductor apparatus according to claim 1, wherein in two chips among the plurality of chips electrically connected through one of the plurality of expansion wires comprising the second wire segment, at least one of the two chips among the plurality of chips is inclined relative to an extension line of the second wire segment.

7. The semiconductor apparatus according to claim 6, wherein in the two chips electrically connected through the one of the plurality of expansion wires comprising the second wire segment, an orientation of one of the two chips relative to the extension line of the second wire segment is different from an orientation of the other one of the two chips relative to the extension line of the second wire segment.

8. The semiconductor apparatus according to claim 1, wherein the at least one first wire segment and the second wire segment adjacent to and electrically connected to the at least one first wire segment have an angle greater than 0° and less than 180°.

9. The semiconductor apparatus according to claim 8, wherein one of the plurality of expansion wires comprises two first wire segments and the second wire segment; and wherein each of the two first wire segments is adjacent to and electrically connected to the second wire segment, an angle between one of the two first wire segments and the second wire segment adjacent thereto and electrically connected thereto is different from an angle between the other one of the two first wire segments and the second wire segment adjacent thereto and electrically connected thereto.

10. The semiconductor apparatus according to claim 1, wherein one of the two of the plurality of expansion wires configured to electrically connect the two chips comprises a first wire segment in the at least one first wire segment electrically connected to the first terminal of one of the two chips, and the other one of the two of the plurality of expansion wires configured to electrically connect the two chips comprises a first wire segment in the at least one first wire segment electrically connected to the second terminal of the same one of the two chips; and wherein an angle between the first wire segment electrically connected to the first terminal and the second wire segment adjacent and electrically connected to the first wire segment electrically connected to the first terminal is different from an angle between the first wire segment electrically connected to the second terminal and the second wire segment adjacent and electrically connected to the first wire segment electrically connected to the second terminal.

11. The semiconductor apparatus according to claim 1, wherein the plurality of expansion wires comprise a plurality of first wire segments located in a same layer, and the second wire segment and the at least one first wire segment are located in a same layer or in different layers.

12. The semiconductor apparatus according to claim 1, wherein the plurality of chips are arranged in an array in a first direction and a second direction, and the at least one first wire segment is inclined relative to the first direction and the second direction.

13. The semiconductor apparatus according to claim 12, wherein the second wire segment extends in the first direction or in the second direction.

* * * * *